US012776624B2

(12) United States Patent
Yokozeki et al.

(10) Patent No.: US 12,776,624 B2
(45) Date of Patent: Oct. 27, 2026

(54) SURFACE EMITTING LASER AND METHOD FOR MANUFACTURING SURFACE EMITTING LASER

(71) Applicant: SONY GROUP CORPORATION, Tokyo (JP)

(72) Inventors: Mikihiro Yokozeki, Tokyo (JP); Hiroshi Nakajima, Tokyo (JP); Tomomasa Watanabe, Tokyo (JP); Michinori Shiomi, Tokyo (JP)

(73) Assignee: Sony Group Corporation, Tokyo (JP)

( * ) Notice: Subject to any disclaimer, the term of this patent is extended or adjusted under 35 U.S.C. 154(b) by 613 days.

(21) Appl. No.: 18/278,269

(22) PCT Filed: Jan. 21, 2022

(86) PCT No.: PCT/JP2022/002096
§ 371 (c)(1),
(2) Date: Aug. 22, 2023

(87) PCT Pub. No.: WO2022/185766
PCT Pub. Date: Sep. 9, 2022

(65) Prior Publication Data
US 2024/0146026 A1 May 2, 2024

(30) Foreign Application Priority Data
Mar. 3, 2021 (JP) ................................ 2021-033522

(51) Int. Cl.
*H01S 5/183* (2006.01)

(52) U.S. Cl.
CPC ...... *H01S 5/18347* (2013.01); *H01S 5/18341* (2013.01); *H01S 5/18361* (2013.01)

(58) Field of Classification Search
CPC ............. H01S 5/18347; H01S 5/18341; H01S 5/18361; H01S 5/18344; H01S 5/1838;
(Continued)

(56) References Cited

U.S. PATENT DOCUMENTS 10,601,201 B1 3/2020 Sirbu
2009/0041075 A1* 2/2009 Hashimoto ......... H01S 5/18308 372/45.01
(Continued)

FOREIGN PATENT DOCUMENTS

CN 101685942 A 3/2010
JP 2008034478 A 2/2008
(Continued)

OTHER PUBLICATIONS

Jayaraman, V., : "High-Power 1320-nm Wafer-Bonded VCSELs With Tunnel Junctions", IEEE Phot. Tech. Lett., Nov. 2003, pp. 1495-1497, vol. 15, No. 11.
(Continued)

*Primary Examiner* — Xinning(Tom) Niu
(74) *Attorney, Agent, or Firm* — K&L Gates LLP

(57) ABSTRACT

The present technology provides a surface emitting laser capable of improving flatness of a surface of a buried layer while reducing diffraction loss of light in the buried layer. The surface emitting laser according to present technology includes a first structure including a first multilayer film reflector, a second structure including a second multilayer film reflector, and a resonator disposed between the first and second structures, in which the resonator includes an active layer, a tunnel junction layer disposed between the first structure and the active layer and having a mesa and an adjacent region adjacent to the mesa, and a buried layer that buries a periphery of the mesa and a periphery of the adjacent region, and an interval between the mesa and the adjacent region is less than or equal to 30 μm.

19 Claims, 100 Drawing Sheets

(58) Field of Classification Search
CPC .. H01S 5/2059; H01S 5/18308; H01S 5/2054; H01S 5/3095
See application file for complete search history.

(56) References Cited

U.S. PATENT DOCUMENTS

| | | | | |
|---|---|---|---|---|
| 2009/0080488 | A1* | 3/2009 | Hatakeyama .......... | B82Y 20/00 372/50.124 |
| 2009/0097518 | A1* | 4/2009 | Onishi ................ | H01S 5/18308 257/E21.532 |
| 2009/0196317 | A1* | 8/2009 | Suzuki ................ | H01S 5/18308 372/44.01 |

FOREIGN PATENT DOCUMENTS

| | | | |
|---|---|---|---|
| JP | 2008098234 | A | 4/2008 |
| JP | 2008177414 | A | 7/2008 |
| JP | 2009283703 | A | 12/2009 |
| JP | 2014203894 | A | 10/2014 |
| JP | 2020188206 | A | 11/2020 |

OTHER PUBLICATIONS

International Search Report issued in International Patent Application No. PCT/JP2022/002096 on Mar. 1, 2022 and English translation of same. 5 pages.
Written opinion issued in International Patent Application No. PCT/JP2022/002096 on Mar. 1, 2022. 4 pages.

* cited by examiner

FIG. 6

| | INTERVAL (μm) | | |
|---|---|---|---|
| FILM THICKNESS (nm) | 10 | 20 | 30 |
| 122 | FAIL | FAIL | FAIL |
| 367 | PASS | FAIL | FAIL |
| 612 | PASS | PASS | FAIL |
| 856 | PASS | PASS | FAIL |
| 1101 | PASS | PASS | FAIL |

A

B

SURFACE EMITTING LASER AND METHOD FOR MANUFACTURING SURFACE EMITTING LASER

TECHNICAL FIELD

The technology according to the present disclosure (hereinafter also referred to as "the present technology") relates to a surface emitting laser and a method for manufacturing a surface emitting laser.

BACKGROUND ART

A surface emitting laser including a buried tunnel junction (BTJ) structure for current confinement and light confinement is known (see, for example, Patent Document 1). Such a buried tunnel junction structure includes a tunnel junction layer having a mesa and a buried layer burying a periphery of the mesa.

CITATION LIST

Patent Document

Patent Document 1: Japanese Patent Application Laid-Open No. 2008-98234

SUMMARY OF THE INVENTION

Problems to be Solved by the Invention

Such a known surface emitting laser, however, has room for improvement in increasing flatness of a surface of the buried layer while reducing diffraction loss of light in the buried layer.

It is therefore a main object of the present technology to provide a surface emitting laser capable of increasing flatness of a surface of a buried layer while reducing diffraction loss of light in the buried layer.

Solutions to Problems

The present technology provides a surface emitting laser including:

a first structure including a first multilayer film reflector;

a second structure including a second multilayer film reflector; and a resonator disposed between the first and second structures, in which the resonator includes:

an active layer;

a tunnel junction layer disposed between the first structure and the active layer and having a mesa and an adjacent region adjacent to the mesa; and a buried layer that buries a periphery of the mesa and a periphery of the adjacent region, and an interval between the mesa and the adjacent region is less than or equal to 30 μm.

A thickness of the buried layer may be less than or equal to 2 μm.

The interval between the mesa and the adjacent region may be less than or equal to 25 μm, and the thickness of the buried layer may be less than or equal to 1.5 μm.

The interval between the mesa and the adjacent region may be less than or equal to 20 μm, and the thickness of the buried layer may be less than or equal to 1.2 μm.

The first structure and the buried layer may be bonded together.

The adjacent region may be another mesa.

The another mesa may be made higher in resistance.

The adjacent region may be made higher in resistance.

A loop groove having a width of 30 μm or less may be provided between the mesa and the adjacent region.

The buried layer may include an InP-based compound semiconductor.

The surface emitting laser may further include an electrode disposed on an end surface side of the active layer and in contact with a surface of the buried layer adjacent to the active layer.

The first structure may include a semi-insulating substrate disposed on a side of the first multilayer film reflector remote from the resonator, the surface emitting laser may further include an electrode provided on a surface of the semi-insulating substrate remote from the first multilayer film reflector, and the electrode and the buried layer may be connected via a conductive via provided in the semi-insulating substrate.

The first structure may include a conductive substrate disposed on a side of the first multilayer film reflector remote from the resonator, and the surface emitting laser may further include an electrode layer provided in a region of the conductive substrate other than a region corresponding to the mesa.

The second structure may include no substrate, and the second multilayer film reflector may be a dielectric multilayer film reflector or a semiconductor multilayer film reflector.

The second structure may include a substrate, and the second multilayer film reflector may be a semiconductor multilayer film reflector.

The present technology provides a method for manufacturing a surface emitting laser, the method including:

a process of generating a multilayer body by layering an active layer and a tunnel junction layer in this order on a first substrate;

a process of forming a mesa and an adjacent region adjacent to the mesa such that an interval between the mesa and the adjacent region is less than or equal to 30 μm by etching the tunnel junction layer of the multilayer body; and a process of generating another multilayer body replacing the multilayer body by layering, on the tunnel junction layer, a buried layer that buries a periphery of the mesa and a periphery of the adjacent region.

The method for manufacturing a surface emitting laser may further include a process of bonding the buried layer of the another multilayer body and a multilayer body including a first multilayer film reflector together.

The multilayer body including the first multilayer film reflector may further include a second substrate, and a process of removing the first substrate from the another multilayer body, and a process of forming a second multilayer film reflector on a surface of the another multilayer body from which the first substrate has been removed may be further included.

The multilayer body including the first multilayer film reflector may further include a second substrate, and a process of removing the first substrate from the another multilayer body, and a process of bonding a multilayer body including a second multilayer film reflector to a surface of the another multilayer body from which the first substrate has been removed may be further included.

A process of making the adjacent region higher in resistance by implanting ions into the another multilayer body from the buried layer may be further included.

BRIEF DESCRIPTION OF DRAWINGS

FIG. 6 is a diagram for describing a relation between an interval between a mesa and an adjacent region and a film thickness of a buried layer in the surface emitting laser in FIG. 1.

MODE FOR CARRYING OUT THE INVENTION

Figure 1:
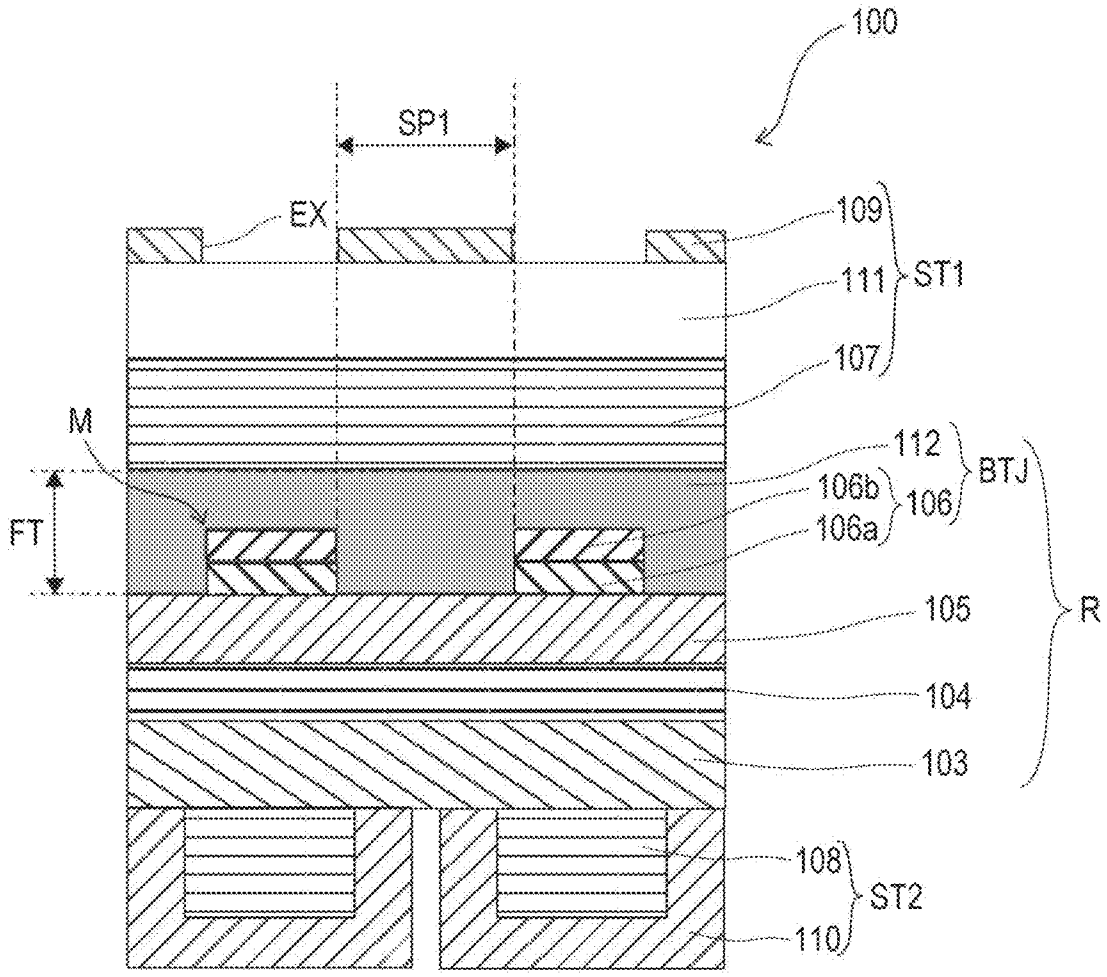
FIG. 1 is a cross-sectional view illustrating at least a part of a surface emitting laser according to a first embodiment of the present technology.

Hereinafter, preferred embodiments of the present technology will be described in detail with reference to the accompanying drawings. Note that, in this specification and the drawings, the components having substantially the same functional configuration are assigned with the same reference sign, and the description thereof is not repeated. The embodiments to be described below show representative embodiments of the present technology, and the scope of the present technology is not narrowly interpreted by these embodiments. In this specification, even in a case where it is described that a surface emitting laser and a method for manufacturing a surface emitting laser according to the present technology exhibit a plurality of effects, it is only required that the surface emitting laser and the method for manufacturing a surface emitting laser according to the present technology exhibit at least one effect. The effects described herein are merely examples and are not limited, and other effects may be provided.

Furthermore, the description will be given in the following order.

1. Introduction
2. Surface emitting laser according to first embodiment of present technology
   (1) Configuration of surface emitting laser
   (2) Operation of surface emitting laser
   (3) Method for manufacturing surface emitting laser
   (4) Effects of surface emitting laser and method for manufacturing the same
3. Surface emitting laser according to modification of first embodiment of present technology 4. Surface emitting laser according to second embodiment of present technology
(1) Configuration of surface emitting laser
(2) Operation of surface emitting laser
(3) Method for manufacturing surface emitting laser
(4) Effects of surface emitting laser and method for manufacturing the same
5. Surface emitting laser according to third embodiment of present technology
6. Surface emitting laser according to fourth embodiment of present technology
7. Surface emitting laser according to fifth embodiment of present technology
8. Surface emitting laser according to sixth embodiment of present technology
9. Surface emitting laser according to seventh embodiment of present technology
10. Surface emitting laser according to eighth embodiment of present technology
11. Planar configuration examples 1 to 15 of tunnel junction layer and cross-sectional configuration examples 1 to 6 of surface emitting laser
12. Modification of present technology
13. Application example to electronic device
14. Example in which surface emitting laser is applied to distance measuring device
15. Example in which distance measuring device is mounted on mobile body

1. Introduction

An InP-based material is a light-emitting material in 1.31 μm and 1.55 μm bands, which are low loss ranges for optical fibers, and therefore has been used as a material for an optical communication laser element for a long time.

An InP-based light-emitting device has excellent light-emitting characteristics, but has a problem that a change in laser characteristics relative to temperature is large. This is because carrier overflow is likely to occur as inherent characteristics of the material, and in addition, a mixed crystal material such as AlGaInAs or InGaAsP necessary for device structure design is 10 times or more higher in thermal resistance than an InP layer, which makes heat dissipation poor.

Regarding an active layer material, there is a report that a characteristic temperature is improved by an approach such as introduction of an AlGaInAs active layer or a quantum dots (QD) active layer of an As-based material that can take relatively large $\Delta Ec$ in order to suppress carrier overflow. As for the AlGaInAs active layer, an active layer having a relatively favorable characteristic temperature of 70 to 80 K has been commercialized.

On the other hand, in order to adjust the light confinement rate of the InP-based material, it is difficult to manufacture a device without using a mixed crystal-based material such as InGaAsP or AlGaInAs in terms of device structure design. In general, a temperature rise $\Delta Tj$ of an active layer is represented by $\Delta Tj = IV\ Rth$ (thermal resistance). That is, it is shown that the temperature rise of an active layer is largely caused by an increase in thermal resistance of the active layer.

An optical communication device is used for wavelength division multiplexing (WDM) or the like, so that the wavelength needs to be strictly controlled. It is therefore typical to perform temperature control using a temperature controller, and an improvement of temperature characteristics has been desired, but is not essential.

On the other hand, recently, an 850 nm-band vertical cavity surface emitting laser (VCSEL) on a GaAs substrate has been used in short-range communications, particularly, communications for a data center. A GaAs-based material is suitable for making the VCSEL. The major reason is that an AlAs/GaAs distributed bragg reflector (DBR) having a relatively large refractive index difference in a lattice-matching system can be produced, heat dissipation is also excellent, and a technique of an AlAs oxidation constriction layer for oxidizing an AlAs layer from a side surface of a mesa can be used as a method of current and light confinement.

An advantage of the VCSEL over an edge-emitting laser (EEL) is that the VCSEL is small in size, high in reliability, and allows a two-dimensional array having a good affinity for a Si circuit.

Furthermore, recently, demand for VCSELs has been growing significantly for 3D sensing rather than optical communications. In particular, the demand is increasing for facial authentication for smartphones. Furthermore, the future use of VCSELs for LiDAR systems of self-driving vehicles is under consideration, and it is expected that a VCSEL sensing market will expand.

Commercialization and research and development of VCSEL devices are also underway for InP-based light-emitting devices. For example, Vertilas GmbH has improved characteristics with a structure in which two reflectors are formed by an epitaxial DBR, and a combination of a dielectric DBR and a metal, and the number of dielectric pairs is reduced to improve heat dissipation. This structure is designed to reduce the number of dielectric pairs, increase reflectance using metal, and improve heat dissipation. This structure is an excellent structure that takes heat dissipation into account, but it is desired that heat dissipation characteristics be further improved in order for the structure to be mounted on a mobile device such as a smartphone.

Furthermore, Beam Express has provided a device with excellent heat dissipation using two reflectors including AlAs/GaAs-based DBR substrates bonded to an InP-based active layer from above and below. This structure is excellent in heat dissipation and can obtain excellent characteristics. However, due to a bonded buried tunnel junction (BTJ) structure responsible for current and light confinement, surface irregularities develop. The surface irregularities cause a problem that cavities and stress are generated at the time of bonding the substrates.

In recent years, for example, in an InP-based VCSEL (surface emitting laser), the buried tunnel junction (BTJ) structure responsible for current and light confinement described above has been widely used instead of an oxidation constriction structure that is frequently used in an AlGaAs-based VCSEL. This buried tunnel junction structure is generated by regrowth after etching a tunnel junction layer. With the InP-based material, regrowth is relatively easy, so that the buried tunnel junction structure can be formed with ease.

A surface emitting laser (for example, Japanese Patent Application Laid-Open No. 2004-296972) in which a multilayer film reflector is bonded to a BTJ is known.

In a case where the multilayer film reflector is bonded to the BTJ, it is desirable that flatness of a BTJ surface (specifically, a surface of a buried layer that buries a periphery of a mesa of the tunnel junction layer in the BTJ, and the same applies hereinafter) be high. This is because when the flatness is high, an excellent junction interface can be formed, and for example, heat dissipation from a current and light confinement portion (high-resistance heat generation portion) around the mesa of the BTJ toward the multilayer film reflector can be improved. Due to the improvement in heat dissipation, excellent device characteristics can be obtained.

Here, if a film thickness of the buried layer is simply increased, the flatness of the BTJ surface can be improved, but in this case, diffraction loss of light in the buried layer increases.

Therefore, as a result of intensive studies, the inventors have developed a surface emitting laser according to the present technology as a surface emitting laser capable of improving the flatness of the BTJ surface while reducing the diffraction loss of light in the buried layer.

2. Surface Emitting Laser According to First Embodiment of Present Technology Hereinafter, a surface emitting laser 100 according to a first embodiment will be described.

(1) Configuration of Surface Emitting Laser

FIG. 1 is a cross-sectional view of the surface emitting laser 100 according to the first embodiment of the present technology. Hereinafter, for the sake of convenience, the upper part in the cross-sectional view of FIG. 1 and the like will be described as an upper side, and the lower part in the cross-sectional view of FIG. 1 and the like will be described as a lower side.

As an example, as illustrated in FIG. 1, the surface emitting laser 100 includes a first structure ST1 including a first multilayer film reflector 107, a second structure ST2 including a second multilayer film reflector 108, and a resonator R disposed between the first and second structures ST1 and ST2. The surface emitting laser 100 is driven by, for example, a laser driver.

[First Structure]

The first structure ST1 includes a substrate 111 and an anode electrode 109 in addition to the first multilayer film reflector 107.

(Substrate)

The substrate 111 is, for example, an n-GaAs substrate.

(First Multilayer Film Reflector)

The first multilayer film reflector 107 is disposed between the substrate 111 and the resonator R. That is, the first multilayer film reflector 107 is disposed on a front surface (upper surface) of the resonator R.

The first multilayer film reflector 107 is, as an example, a semiconductor multilayer film reflector (semiconductor DBR), and has a structure in which a plurality of types (for example, two types) of refractive index layers (semiconductor layers) having different refractive indexes is alternately layered with an optical thickness of ¼ wavelength of the oscillation wavelength. For example, the semiconductor multilayer film reflector as the first multilayer film reflector 107 has a structure in which a high refractive index layer (for example, an AlGaAs layer having a small Al composition) and a low refractive index layer (for example, an AlGaAs layer having a large Al composition) are alternately layered.

(Anode Electrode)

The anode electrode 109 is provided on the substrate 111. Note that the anode electrode 109 may be provided on a buried layer 112 to be described later with the substrate 111 and the first multilayer film reflector 107 removed. Furthermore, the anode electrode 109 may be a shared electrode without forming a mesa M in a tunnel junction layer 106 to be described later, or may be independently driven for each mesa M formed in the tunnel junction layer 106.

The anode electrode 109 includes, for example, Au/Ni/AuGe, Au/Pt/Ti, or the like. The anode electrode 109 is electrically connected to, for example, an anode (positive electrode) of the laser driver.

[Second Structure]

The second structure ST2 includes a cathode electrode 110 in addition to the second multilayer film reflector 108.

(Second Multilayer Film Reflector)

The second multilayer film reflector 108 is provided at a position corresponding to each mesa M of the tunnel junction layer 106 to be described later on the back surface (lower surface) of the resonator R (specifically, the back surface (lower surface) of a second cladding layer 103 to be described later).

The second multilayer film reflector 108 is, as an example, a dielectric multilayer film reflector (dielectric DBR), and has a structure in which a plurality of types (for example, two types) of refractive index layers (dielectric layers) having different refractive indexes is alternately layered with an optical thickness of ¼ wavelength of the oscillation wavelength. For example, the dielectric multilayer film reflector as the second multilayer film reflector 108 has a structure in which a high refractive index layer (for example, a $Ta_2O_5$ layer) and a low refractive index layer (for example, a $SiO_2$ layer) are alternately layered. The second multilayer film reflector 108 is set slightly higher in reflectance than the first multilayer film reflector 107.

Note that the second multilayer film reflector 108 may be, for example, a semiconductor multilayer film reflector.

(Cathode Electrode)

As an example, the cathode electrode 110 is provided on the back surface (lower surface) of the resonator R, specifically, the back surface (lower surface) of the second cladding layer 103 to be described later so as to cover the second multilayer film reflector 108. That is, the cathode electrode 110 further serves as a reflector together with the second multilayer film reflector 108. It is therefore possible to reduce the number of pairs of the high refractive index layers and the low refractive index layers in the second multilayer film reflector 108 to improve the heat dissipation and increase the reflectance.

The cathode electrode 110 includes, for example, Au/Ni/AuGe, Au/Pt/Ti, or the like. The cathode electrode 110 is electrically connected to, for example, a cathode (negative electrode) of the laser driver.

[Resonator]

The resonator R integrally includes a buried tunnel junction (BTJ), a first cladding layer 105, an active layer 104, and the second cladding layer 103.

In the resonator R, the BTJ, the first cladding layer 105, the active layer 104, and the second cladding layer 103 are arranged (layered) in this order from the anode electrode 109 side (upper side).

(Active Layer)

As an example, the active layer 104 has a multiple quantum well structure (MQW structure) including a barrier layer and a quantum well layer, the barrier layer and the quantum well layer including an AlGaInAs-based compound semiconductor. Note that the active layer 104 may have a single quantum well structure (QW structure) including a barrier layer and a quantum well layer, the barrier layer and the quantum well layer including, for example, an AlGaInAs-based compound semiconductor.

(First and Second Cladding Layers)

The first cladding layer 105 includes p-InP, for example. The second cladding layer 103 includes n-InP, for example.

(BTJ)

As described above, the BTJ is disposed on a side of the active layer 104 adjacent to the anode electrode 109. That is, the BTJ is located upstream of a current path from the anode electrode 109 to the cathode electrode 110 relative to the active layer 104.

The BTJ includes the tunnel junction layer 106 and the buried layer 112.

The tunnel junction layer 106 is layered on the first cladding layer 105. The tunnel junction layer 106 includes a p-type semiconductor region 106*a* and an n-type semiconductor region 106*b* arranged in contact with each other. Here, the p-type semiconductor region 106*a* is disposed on a side (lower side) of the n-type semiconductor region 106*b* adjacent to the active layer 104.

The p-type semiconductor region 106*a* includes, for example, a p-type AlInGaAs-based compound semiconductor highly doped with carbon (C). The n-type semiconductor region 106*b* includes, for example, an n-type AlInGaAs-based compound semiconductor highly doped with Si, Te, or the like.

The tunnel junction layer 106 has a film thickness of, for example, about 30 to 70 nm (for example, 50 nm).

The tunnel junction layer 106 has a plurality of the mesas M. That is, the tunnel junction layer 106 includes a mesa M and another mesa M that is an adjacent region adjacent to the mesa M.

Figure 2:
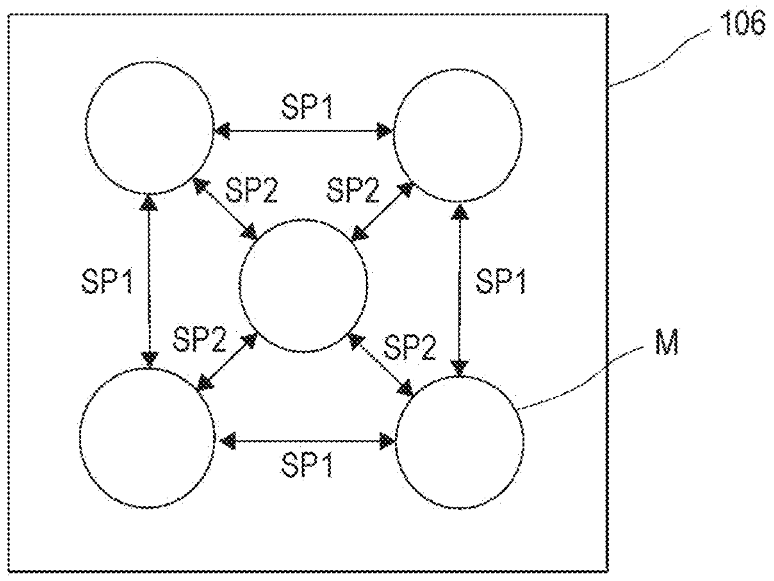
FIG. 2 is a planar configuration diagram of a tunnel junction layer of the surface emitting laser in FIG. 1.

More specifically, the tunnel junction layer 106 includes, as an example, the plurality of mesas M arranged two-dimensionally along an in-plane direction (see FIG. 2). FIG. 1 is a cross-sectional view including a cut surface of two mesas M adjacent to each other at an interval SP1 that is a larger interval between two mesas M adjacent to each other in FIG. 2. A cross-sectional view including a cut surface of two mesas M adjacent to each other at a smaller interval SP2 (<SP1) in FIG. 2 is also similar to the cross-sectional view in FIG. 1 except that the interval of the mesas M is different.

The mesa M has, for example, a substantially cylindrical shape, but may have another shape such as a substantially elliptical columnar shape, a polygonal columnar shape, a truncated cone shape, an elliptical frustum shape, or a polygonal frustum shape. A height direction of the mesa M substantially coincides with a layering direction (vertical direction) of each of the constituent layers of the surface emitting laser 100.

The buried layer 112 buries a periphery of the mesa M and a periphery of another mesa M (periphery of the adjacent region). Specifically, the buried layer 112 is a layer located between the first multilayer film reflector 107 and the first cladding layer 105. More specifically, the buried layer 112 is a layer located on sides of and above each mesa M.

As an example, the buried layer 112 includes a single material (for example, n-InP).

A region (peripheral region) of the buried layer 112 surrounding the mesa M of the tunnel junction layer 106 is higher in electrical resistance and lower in refractive index than the mesa M, and functions as a current and light confinement portion in which current and light are confined. The current and light confinement portion further serves as a heat generation portion.

Each mesa M is lower in electrical resistance than the buried layer 112 and functions as a current passing region. The current flowing from the anode electrode 109 and passing through each mesa M is injected into the active layer 104, and a region (region corresponding to each mesa M) of the active layer 104 into which the current is injected emits light. That is, each mesa M functions as a light-emitting position setting mesa where a light-emitting position of the active layer 104 is set.

The buried layer 112 is bonded to the first structure ST1. More specifically, the first multilayer film reflector 107 is bonded to a surface (adjacent to the first structure ST1 (upper side)) of the buried layer 112. It is therefore desirable that flatness of the surface of the buried layer 112 be as high as possible. The higher the flatness of the surface of the buried layer 112 (the surface of the buried layer 112 bonded to the first multilayer film reflector 107), the higher the flatness of the surface of the first multilayer film reflector 107 bonded to the buried layer 112, and in turn, the higher the flatness of the junction interface between the first multilayer film reflector 107 and the buried layer 112. With this configuration, the yield and reliability increase, and an effect of heat dissipation from the buried layer 112 toward the first multilayer film reflector 107 increases.

Here, when the buried layer 112 is grown on the tunnel junction layer 106 at the time of manufacturing the surface emitting laser 100, a gap between each mesa and the adjacent region (for example, two mesas adjacent to each other) is buried by migration of atoms (for example, In atoms) constituting the buried layer 112.

For example, the larger a film thickness FT of the buried layer 112 relative to an interval SP between the mesa M and the adjacent region (for example, two mesas M adjacent to each other), the higher the flatness of the surface of the buried layer 112 can be made. This is because under a condition where a length of the migration of atoms (for example, In atoms) constituting the buried layer 112 is constant (under a condition where a growth temperature of the buried layer 112 is lower than or equal to, for example, 580° C. and constant), the larger the film thickness FT relative to the interval SP (the longer the growth time of the buried layer 112), the more completely the gap between the mesa M and the adjacent region can be buried at the time of growth of the buried layer 112.

Note that it is possible to increase the length of the migration described above by setting the growth temperature of the buried layer 112 higher than, for example, 580° C., and it is therefore possible to accelerate the burying and to completely bury the gap between the mesa M and the adjacent region even if the film thickness FT is small. In this case, however, there is a possibility that the mesa M may lose its shape due to mass transport, or doping profile and interface steepness may deteriorate due to mutual diffusion.

Figure 3:
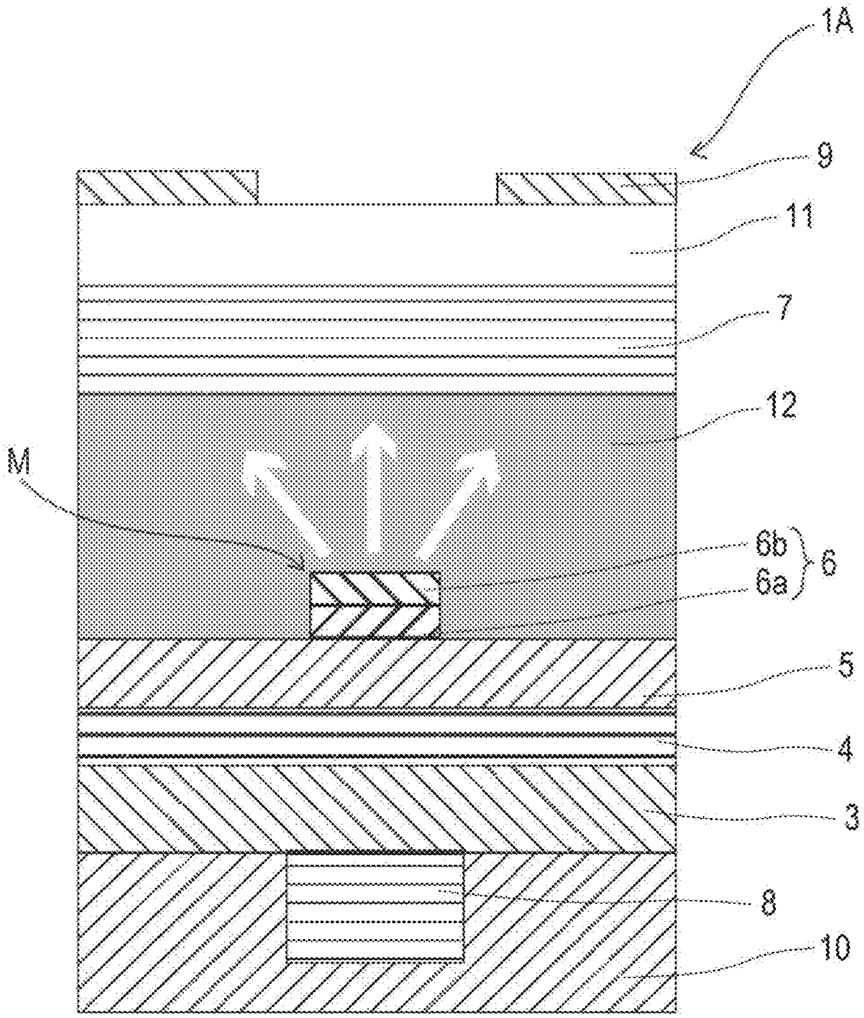
FIG. 3 is a cross-sectional view of a surface emitting laser of a comparative example 1.

FIG. 3 is a cross-sectional view of a surface emitting laser 1A of a comparative example 1. In FIG. 3, a reference sign 11 denotes a substrate, a reference sign 7 denotes a first multilayer film reflector, a reference sign 12 denotes a buried layer, a reference sign 6 denotes a tunnel junction layer, a reference sign 5 denotes a first cladding layer, a reference sign 4 denotes an active layer, a reference sign 3 denotes a second cladding layer, a reference sign 8 denotes a second multilayer film reflector, a reference sign 9 denotes an anode electrode, and a reference sign 10 denotes a cathode electrode.

In the surface emitting laser 1A of the comparative example 1, the film thickness of the buried layer 12 is greater than or equal to, for example, 3 μm, and the interval between the mesa M and the adjacent region is greater than or equal to, for example, 35 μm, but the surface of the buried layer 12 is high in flatness.

In the surface emitting laser 1A, however, the film thickness of the buried layer 12 is too large, so that diffraction loss of light passing through the mesa M in the buried layer 12 becomes very large.

As described above, the larger the film thickness of the buried layer, the larger the diffraction loss in the buried layer. In other words, the smaller the film thickness of the buried layer, the smaller the diffraction loss in the buried layer.

Therefore, the inventors have found, as a result of experiments, that the upper limit of the film thickness FT of the buried layer 112 up to which the above-described diffraction loss in the buried layer 112 is practically at a negligible level (in terms of the specifications of the surface emitting laser 100) is 2 μm.

FIG. 4A is a cross-sectional view of a surface emitting laser 1B of a comparative example 2. FIG. 4B is a plan view of a center portion of the surface emitting laser 1B of the comparative example 2. Each constituent layer of the surface emitting laser 1B is as described above with reference to FIG. 3.

In the surface emitting laser 1B, the film thickness of the buried layer 12 is less than or equal to 2 μm, and the interval between the mesa M and the adjacent region is greater than or equal to, for example, 35 μm.

Figure 4:
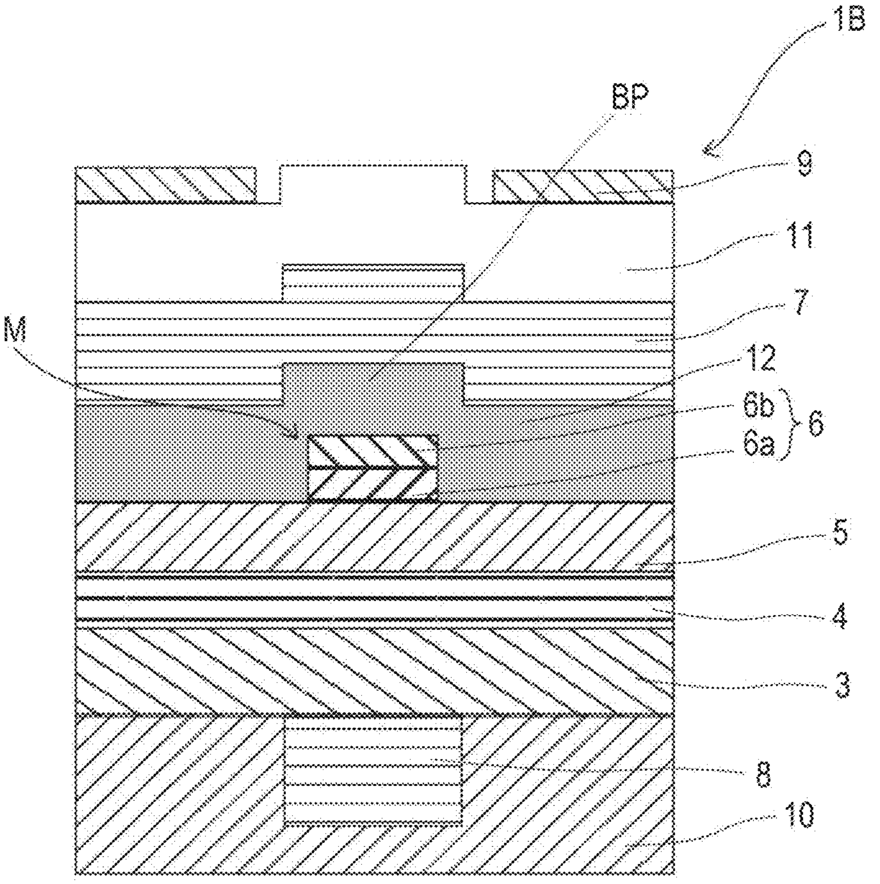
FIG. 4 is a cross-sectional view of a surface emitting laser of a comparative example 2.

In the surface emitting laser 1B, a bump portion BP develops at the position corresponding to the mesa M of the buried layer 12, and it can be seen that the flatness of the buried layer 12 is low (see FIG. 4). Moreover, a bump portion similar to the bump portion BP also develops in the first multilayer film reflector 7 bonded to the buried layer 12 and in the substrate 11 on which the first multilayer film reflector 7 is formed. In this case, stress generated inside the buried layer 12, the first multilayer film reflector 7, and the substrate 11 increases the risk of development of cracks, and there is a possibility that the yield may deteriorate.

Figure 5:
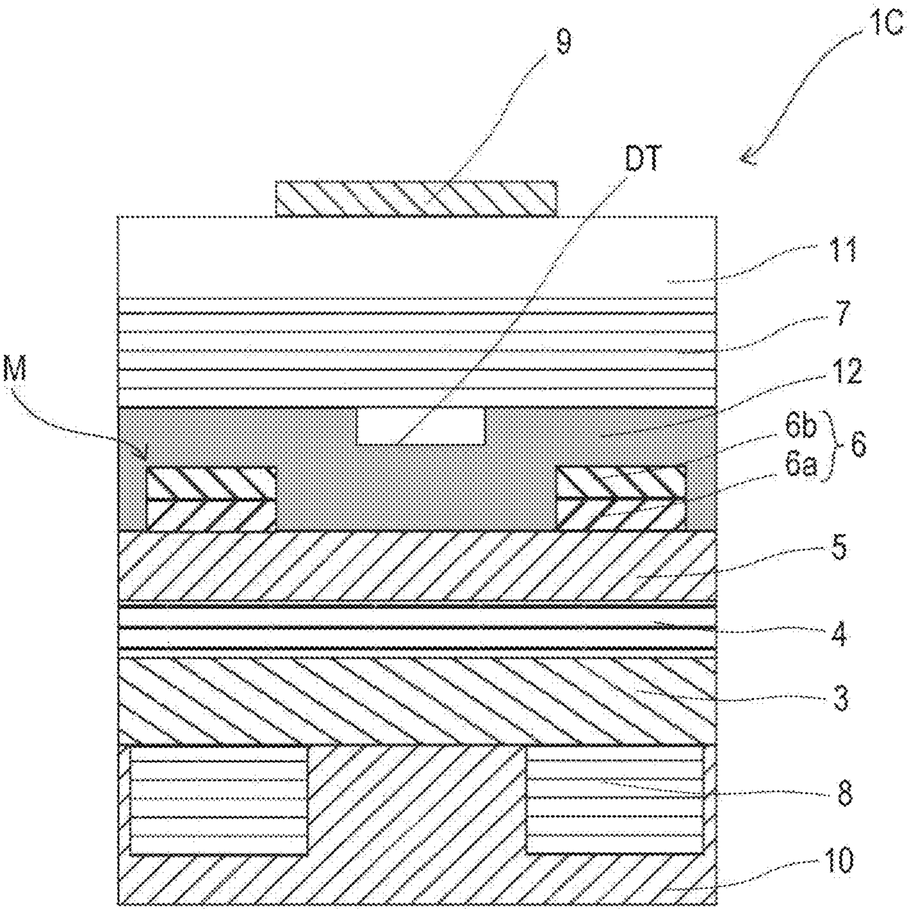
FIG. 5 is a cross-sectional view of a surface emitting laser of a comparative example 3.

FIG. 5 is a cross-sectional view of a surface emitting laser 1C of a comparative example 3. Each constituent layer of the surface emitting laser 1C is as described above with reference to FIG. 3.

In the surface emitting laser 1C, the film thickness of the buried layer 12 is less than or equal to 2 μm, and the interval between two mesas M adjacent to each other is greater than or equal to, for example, 35 μm.

In the surface emitting laser 1C, a dent portion DT (cavity) develops at the position corresponding to the mesa M of the buried layer 12, and it can be seen that the flatness of the buried layer 12 is low (see FIG. 5). Therefore, the inventors have focused on the point that the smaller the interval SP relative to the film thickness FT, the faster the planarization, and the gap between the mesa M and the adjacent region can be buried at the time of growth of the buried layer 112.

Specifically, the inventors have found that in a case where the film thickness FT is less than or equal to, for example, 2 μm, when the interval SP is set less than or equal to 30 μm, neither the above-described bump portion BP nor the above-described dent portion DT develops in the buried layer 112, and the flatness of the surface of the buried layer 112 can be made sufficiently higher.

Moreover, the inventors have found that in a case where the film thickness FT is less than or equal to, for example, 1.5 μm, when the interval SP is set less than or equal to 25 μm, the flatness of the surface of the buried layer 112 can be made sufficiently higher.

Moreover, the inventors have found that in a case where the film thickness FT is less than or equal to, for example, 1.2 μm, when the interval SP is set less than or equal to 20 μm, the flatness of the surface of the buried layer 112 can be made sufficiently higher. Results of the above-described experiments are shown in FIG. 6.

As can be seen from FIG. 6, for example, in a case where the film thickness FT is 612 nm to 1101 nm, when the interval SP is set less than or equal to 20 μm, the results show pass (high flatness).

As can be seen from FIG. 6, for example, in a case where the film thickness FT is 367 nm to 1101 nm, when the interval SP is set less than or equal to 10 μm, the results shows pass (high flatness).

From the above-described consideration, in the surface emitting laser 100, the interval SP (for example, SP1 and SP2) between the mesa M and the adjacent region (for example, another mesa M) is set less than or equal to 30 μm. In this case, the film thickness FT of the buried layer is preferably less than or equal to 2 μm.

The interval SP (for example, SP1 and SP2) between the mesa M and the adjacent region (for example, another mesa M) may be less than or equal to 25 μm. In this case, the film thickness FT of the buried layer 112 is preferably less than or equal to 1.5 μm.

The interval SP (for example, SP1 and SP2) between the mesa M and the adjacent region (for example, another mesa M) is preferably less than or equal to 20 μm, and the film thickness FT of the buried layer 112 is preferably less than or equal to 1.2 μm.

(2) Operation of Surface Emitting Laser

In the surface emitting laser 100, for example, when a current flows from the laser driver to the anode electrode 109, the current enters each mesa M of the tunnel junction layer 106 through the substrate 111, the first multilayer film reflector 107, and the upper layer of the buried layer 112 (constricted by the lower layer of the buried layer 112 (region around the mesa M)). The current that has passed through each mesa M (current constricted by the buried layer 112) is injected into a region of the active layer 104 corresponding to the mesa M through the first cladding layer 105, and the region emits light. The current that has passed through the region of the active layer 104 flows out from a corresponding cathode electrode 110 to, for example, the laser driver through the second cladding layer 103. The light generated in the region of the active layer 104 travels between the first and second multilayer film reflectors 107 and 108, is confined in the lower layer of the buried layer 112 and amplified in the region of the active layer 104 during the travel, and is emitted as laser light from the upper surface (emission surface) of the substrate 111 when oscillation conditions are satisfied.

(3) Method for Manufacturing Surface Emitting Laser

Hereinafter, a method for manufacturing the surface emitting laser 100 will be described with reference to the flowchart (steps S1 to S10) in FIG. 7. Here, as an example, a plurality of the surface emitting lasers 100 is generated at a time using one wafer as a base material of the substrate 111 by a semiconductor manufacturing method using a semiconductor manufacturing device. Next, the plurality of surface emitting lasers 100 integrated in series is separated from each other to obtain a plurality of chip-shaped surface emitting lasers 100 (surface emitting laser chips).

Figure 7:
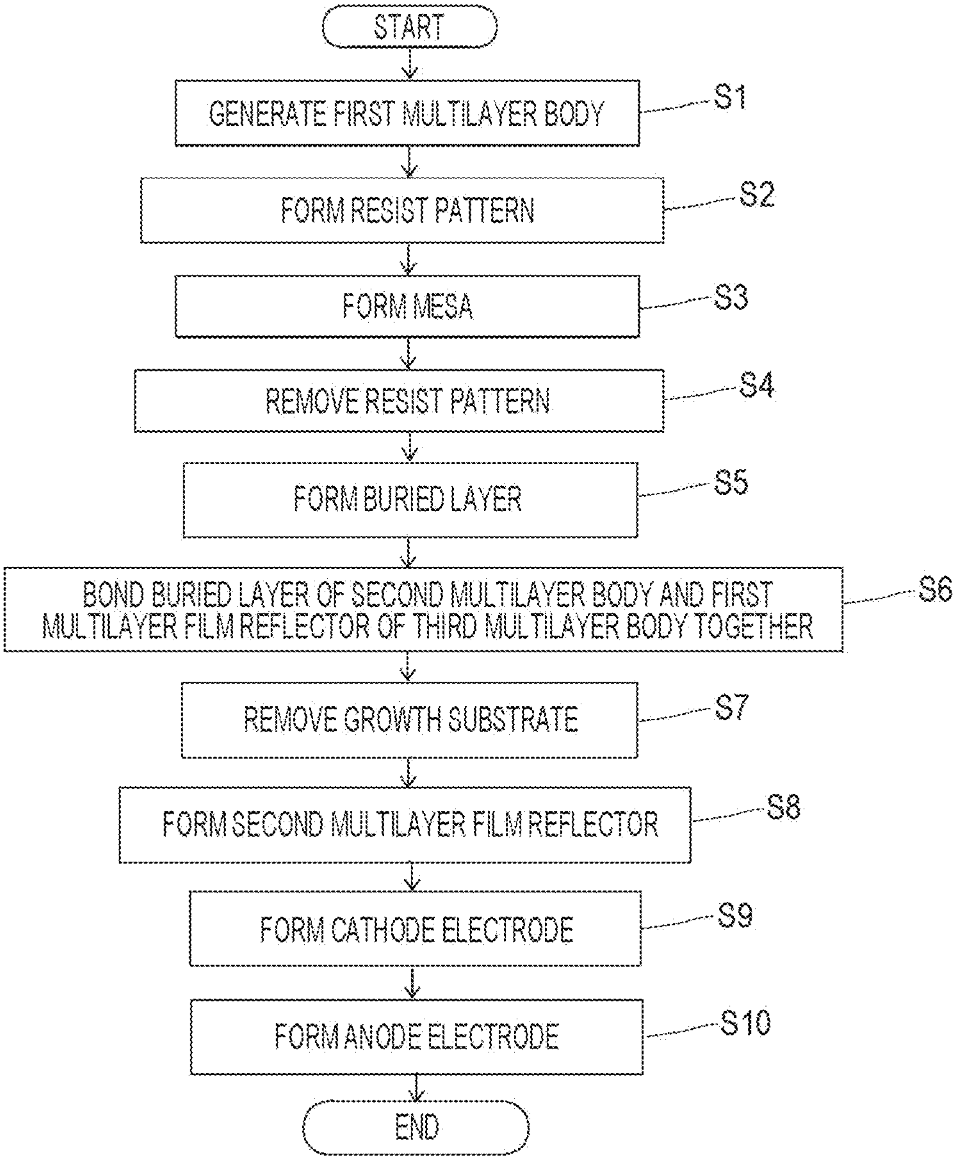
FIG. 7 is a flowchart for describing an example of a method for manufacturing the surface emitting laser in FIG. 1.

As an example, the surface emitting laser 100 is manufactured by the semiconductor manufacturing device by following the procedure of the flowchart in FIG. 7.

Figure 8:
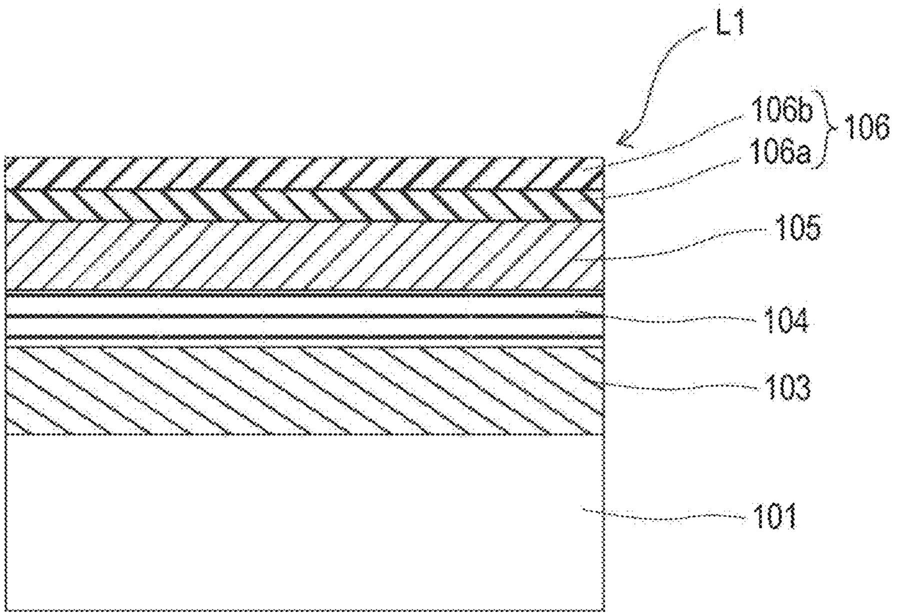
FIG. 8 is a cross-sectional view illustrating a first process in FIG. 7.

In the first step S1, a first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region **106*b* of the tunnel junction layer 106 are layered (epitaxially grown) in this order on a growth substrate 101** (for example, an InP substrate) in a growth chamber by metal organic chemical vapor deposition (MOCVD) or molecular beam epitaxy (MBE).

Figure 9:
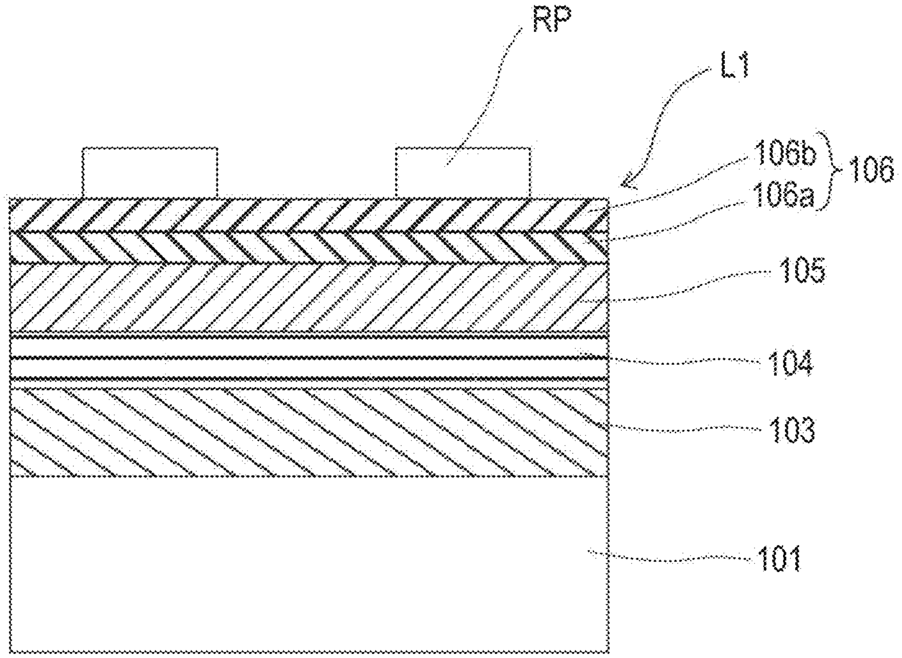
FIG. 9 is a cross-sectional view illustrating a second process in FIG. 7.

In the next step S2, a resist pattern RP is formed (see FIG. 9). Specifically, on the tunnel junction layer 106 of the first multilayer body L1, the resist pattern RP is formed, the resist pattern RP having an opening at a position corresponding to a position other than a position where a plurality of the mesas M having the interval SP between two mesas M adjacent to each other of less than or equal to 30 μm is to be formed.

Figure 10:
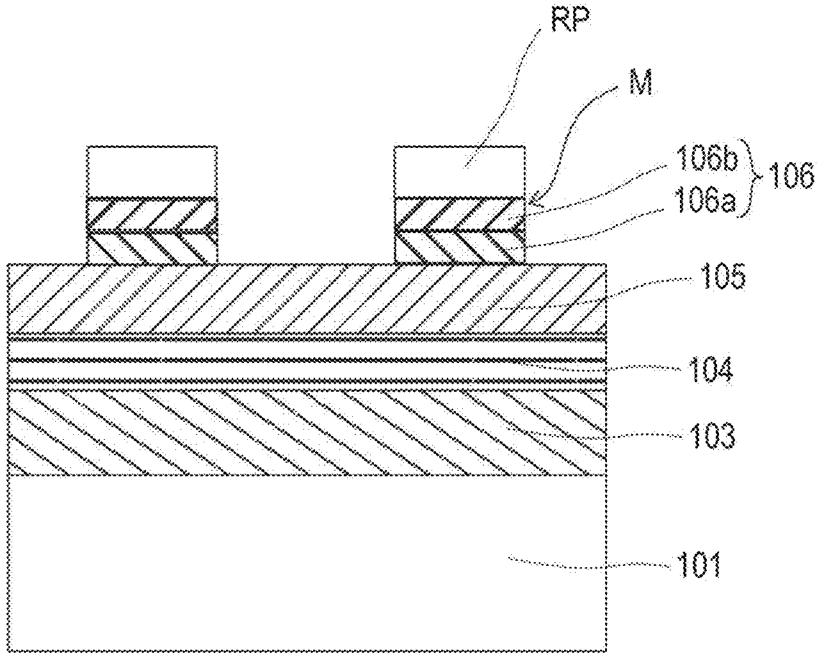
FIG. 10 is a cross-sectional view illustrating a third process in FIG. 7.

In the next step S3, the mesa M is formed (see FIG. 10). Specifically, the tunnel junction layer 106 is etched by wet etching or dry etching using the resist pattern RP as a mask to form the plurality of mesas M. An etching depth at this time is, for example, up to the surface of the first cladding layer 105. As a result, the plurality of mesas M having the interval between two mesas M adjacent to each other of less than or equal to 30 μm is formed.

Figure 11:
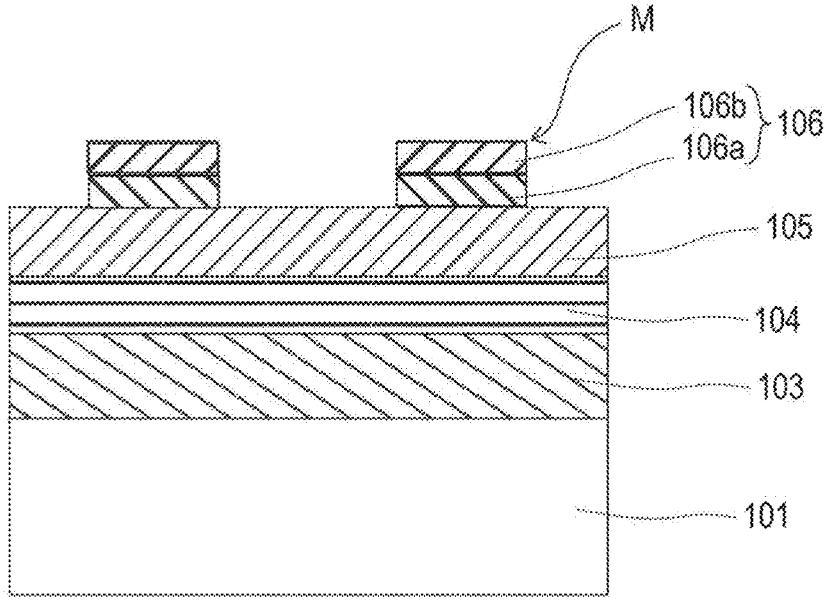
FIG. 11 is a cross-sectional view illustrating a fourth process in FIG. 7.

In the next step S4, the resist pattern RP is removed (see FIG. 11).

Figure 12:
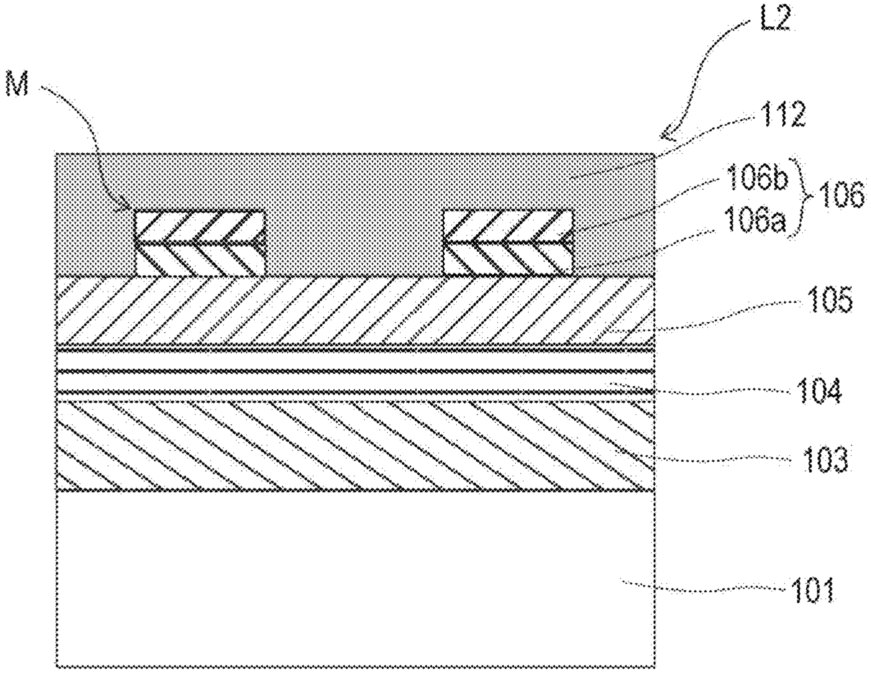
FIG. 12 is a cross-sectional view illustrating a fifth process in FIG. 7.

In the next step S5, the buried layer 112 is formed (see FIG. 12). Specifically, for example, an n-InP film is grown on the tunnel junction layer 106 (specifically, on each mesa M and on the peripheral region of the mesa M of the first cladding layer 105) at a growth temperature of 580° C., for example, with a film thickness of 2 μm. At this time, since the interval SP between two mesas M adjacent to each other is less than or equal to 30 μm, a gap between the two mesas M adjacent to each other is almost completely buried with In atoms to planarize the buried layer 112. A second multilayer body L2 replacing the first multilayer body L1 is generated by forming the buried layer 112.

Figure 13:
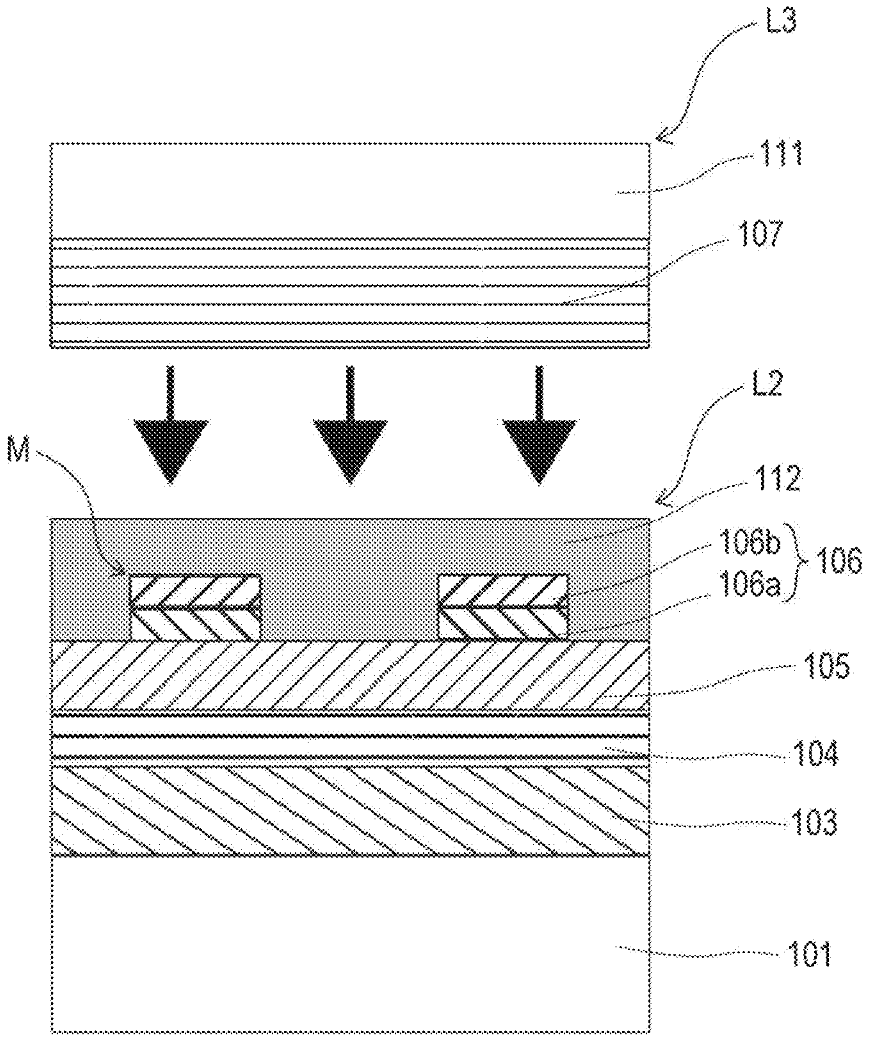
FIG. 13 is a cross-sectional view illustrating a sixth process (before bonding) in FIG. 7.
Figure 14:
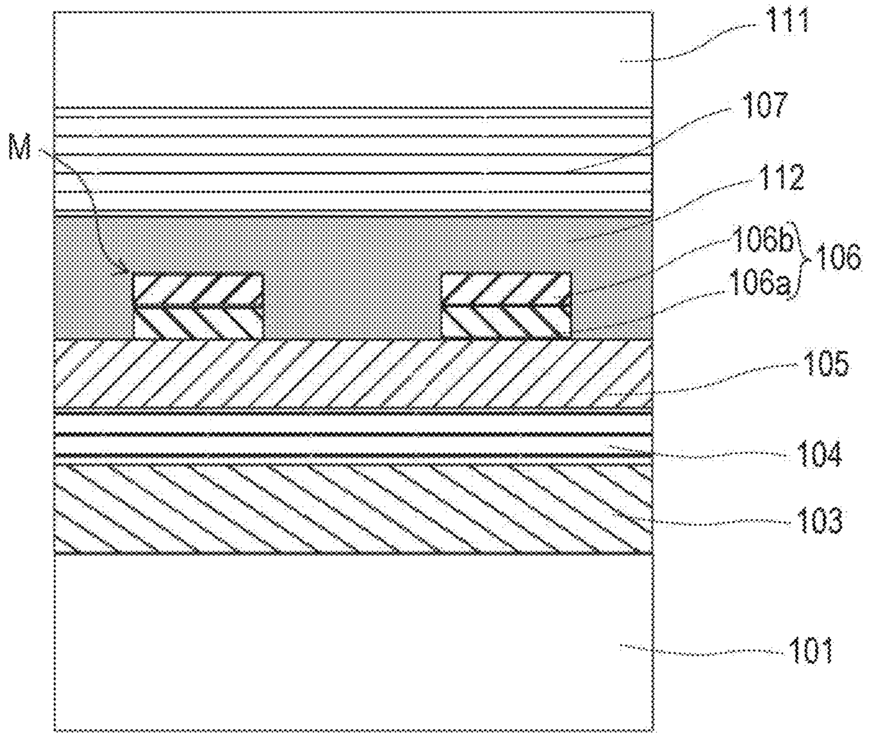
FIG. 14 is a cross-sectional view illustrating the sixth process (after bonding) in FIG. 7.

In the next step S6, the buried layer 112 of the second multilayer body L2 and the first multilayer film reflector 107 of a third multilayer body L3 are bonded together (see FIGS. 13 and 14). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector are alternately layered on the substrate 111 to generate the third multilayer body L3.

Figure 15:
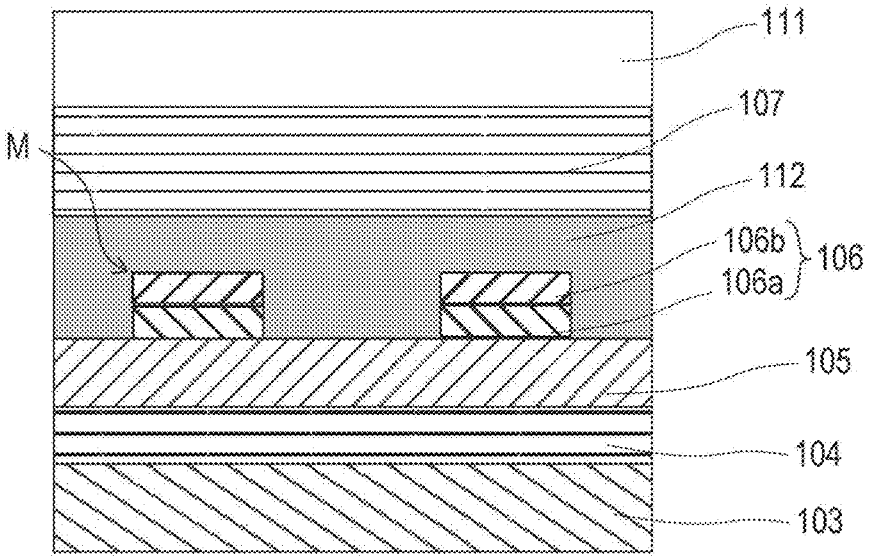
FIG. 15 is a cross-sectional view illustrating a seventh process in FIG. 7.

In the next step S7, the growth substrate 101 is removed (see FIG. 15). Specifically, after the back surface of the growth substrate 101 (see FIG. 14) is ground, a remaining portion is selectively removed by wet etching. As a result of removing the growth substrate 101, the second cladding layer 103 is exposed.

Figure 16:
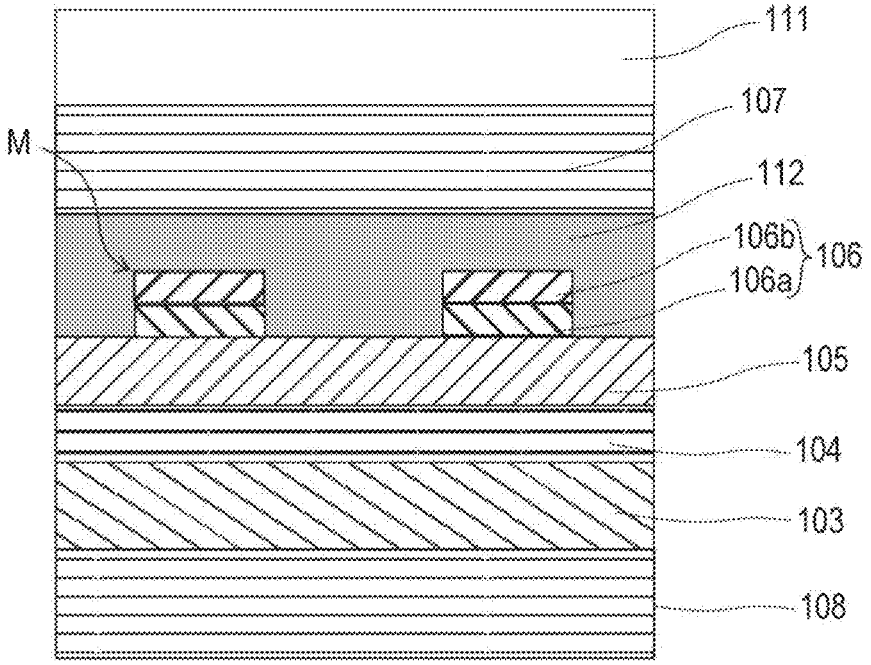
FIG. 16 is a cross-sectional view illustrating an eighth process (after deposition) in FIG. 7.
Figure 17:
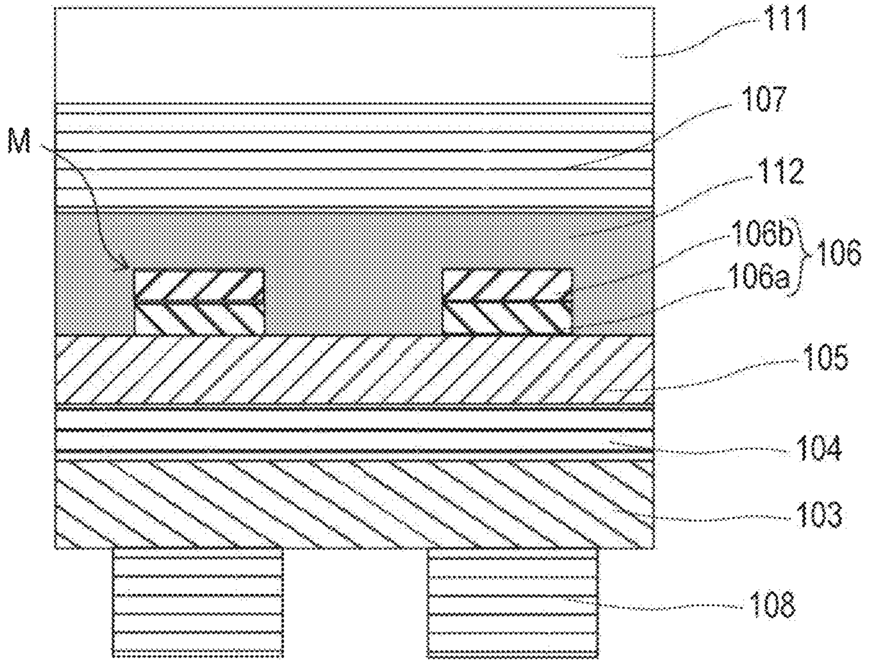
FIG. 17 is a cross-sectional view illustrating the eighth process (after etching) in FIG. 7.

In the next step S8, the second multilayer film reflector 108 is formed (see FIGS. 16 and 17). Specifically, first, a high refractive index layer and a low refractive index layer constituting the dielectric multilayer film reflector as the second multilayer film reflector 108 are alternately deposited on the back surface (lower surface) of the second cladding layer 103 (see FIG. 16). Next, the dielectric multilayer film reflector is etched to leave only a region corresponding to each mesa M (see FIG. 17).

Figure 18:
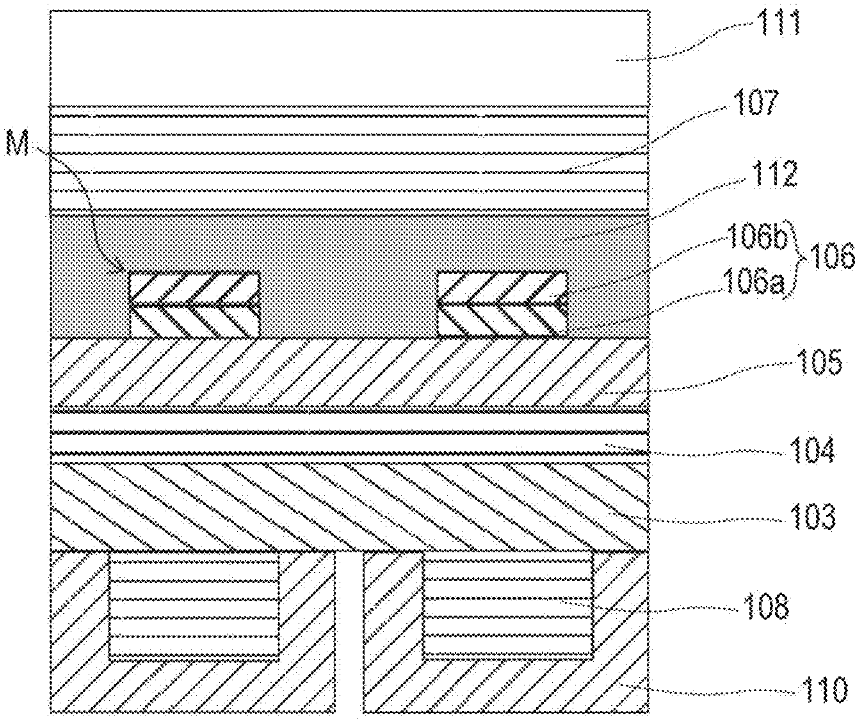
FIG. 18 is a cross-sectional view illustrating a ninth process in FIG. 7.

In the next step S9, the cathode electrode 110 is formed (see FIG. 18). Specifically, for example, an electrode material constituting the cathode electrode 110 is formed by a lift-off method so as to cover the second multilayer film reflector 108 corresponding to each mesa M.

Figure 19:
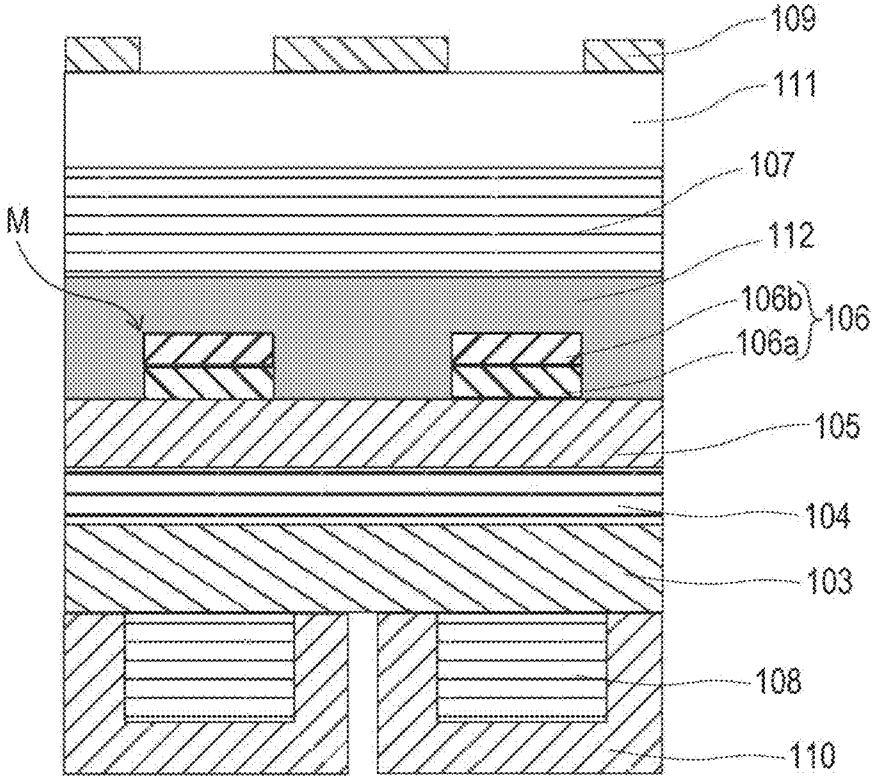
FIG. 19 is a cross-sectional view illustrating a tenth process in FIG. 7.

In the last step S10, the anode electrode 109 is formed (see FIG. 19). Specifically, for example, an electrode material constituting the anode electrode 109 is formed on the substrate 111 by a lift-off method so as to generate an opening serving as an emission port at a position corresponding to each mesa M.

(4) Effects of Surface Emitting Laser and Method for Manufacturing the Same

The surface emitting laser 100 according to the first embodiment of the present technology includes: the first structure ST1 including the first multilayer film reflector 107; the second structure ST2 including the second multilayer film reflector 108; and the resonator R disposed between the first and second structures ST1 and ST2, in which the resonator R includes: the active layer 104; the tunnel junction layer 106 disposed between the first structure ST1 and the active layer 104 and having the mesa M and the adjacent region (for example, another mesa) adjacent to the mesa M; and the buried layer 112 that buries the periphery of the mesa M and the periphery of the adjacent region, and the interval SP between the mesa M and the adjacent region is less than or equal to 30 μm.

Figure 20:
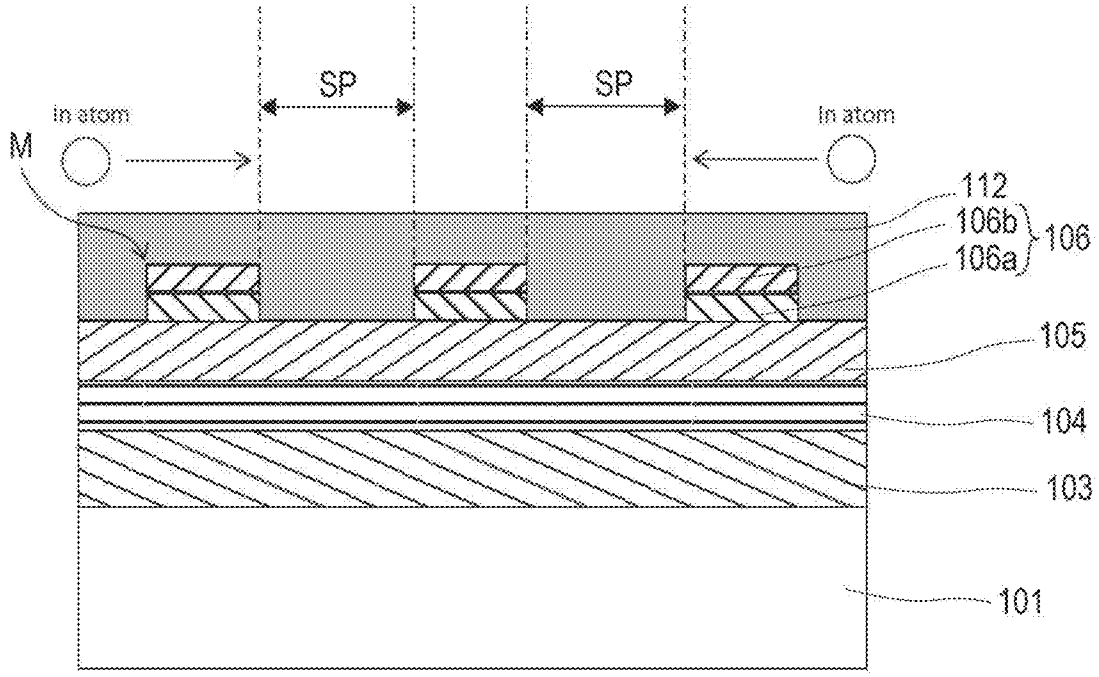
FIG. 20 is a diagram for describing actions at the time of growth of the buried layer of the surface emitting laser in FIG. 1.

In this case, it is possible to prevent the surface of the buried layer 112 from becoming uneven without increasing the thickness (film thickness FT) of the buried layer 112 (for example, without setting the thickness greater than or equal to 2 μm) (see FIG. 20).

As a result, with the surface emitting laser 100, it is possible to improve the flatness of the surface of the buried layer 112 while reducing diffraction loss of light in the buried layer 112.

Figure 21:
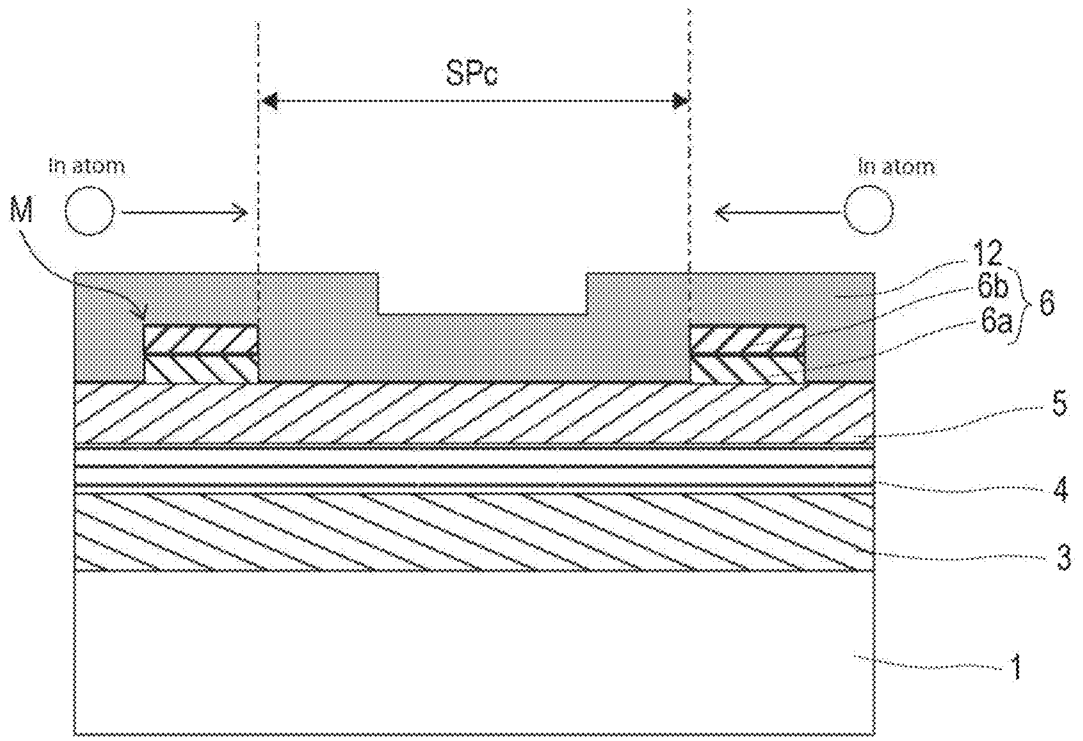
FIG. 21 is a diagram for describing actions at the time of growth of a buried layer of a surface emitting laser of a comparative example 4.

On the other hand, in a case where an interval SPc between the mesas M is relatively large (for example, greater than 30 μm) and the thickness of the buried layer 12 is relatively small (for example, less than or equal to 2 μm) as in a comparative example 4 illustrated in FIG. 21, a gap between two mesas M adjacent to each other cannot be buried completely at the time of growth of the buried layer 12, and unevenness develops on the surface of the buried layer 12. Note that each constituent layer of the comparative example 4 is as described above with reference to FIG. 3.

The surface emitting laser 100 can be improved in flatness of the surface of the buried layer 112, so that it is possible to prevent a cavity or a crack from developing when the buried layer 112 and the first structure ST1 are bonded together.

The first structure ST1 and the buried layer 112 are bonded together. In this case, it is possible to bond the first structure ST1 and the buried layer 112 together with the surface of the buried layer 112 bonded to the first structure ST1 and the surface of the first structure ST1 bonded to the buried layer 112 maintained flat, so that it is possible to form an excellent (highly flat) junction interface. With this configuration, it is possible to improve the yield and reliability and improve the heat dissipation from the buried layer 112 toward the first structure ST1.

Moreover, for example, the use of an AlGaAs-based DBR that is higher in heat dissipation than an InP-based epi DBR (which needs to use a mixed crystal material that is poor in heat dissipation) for the first multilayer film reflector 107 of the first structure ST1 allows a further improvement in the heat dissipation.

The first structure ST1 includes the substrate 111. With this configuration, it is possible to reduce the number of temporary attachment processes.

The adjacent region is another mesa M. In this case, the surface emitting laser 100 can substantially include a plurality of light-emitting portions. With this configuration, it is possible to provide the surface emitting laser 100 having a plurality of light-emitting portions with a narrow pitch (for example, a pitch less than or equal to 30 μm).

The buried layer 112 includes an InP-based compound semiconductor. In this case, In has a property of undergoing migration easily, and thus contributes to improvement in flatness at the time of growth of the buried layer 112.

On the other hand, in a case where a mixed crystal material is used for the buried layer 112, there is a possibility that flatness may not be improved due to composition deviation or difficulty in migration.

As described below, InP is higher in thermal conductivity than, for example, the mixed crystal material. Therefore, the use of InP as the material of the buried layer 112 allows an improvement in direct heat dissipation from the buried layer 112 having the heat generation portion around the mesa M to the outside as compared with a case where the mixed crystal material is used, for example.

Thermal conductivity of InP: 0.68 [W/cm·K]
Thermal conductivity of GaAs: 0.44 [W/cm·K]
Thermal conductivity of $Al_{0.67}Ga_{0.33}As$: 0.16 [W/cm·K]
AlInGaAs: 0.045[W/cm·K]
InGaAsP: 0.045[W/cm·K]

The film thickness FT (thickness) of the buried layer 112 is preferably less than or equal to 2 μm. With this configuration, it is possible to sufficiently reduce diffraction loss in the buried layer 112.

The interval between the mesa M and the adjacent region is preferably less than or equal to 25 μm, and the film thickness FT (thickness) of the buried layer 112 is preferably less than or equal to 1.5 μm. With this configuration, it is possible to improve the flatness of the surface of the buried layer 112 while reducing diffraction loss of light in the buried layer 112 more sufficiently.

The interval between the mesa M and the adjacent region is preferably less than or equal to 20 μm, and the film thickness FT (thickness) of the buried layer 112 is preferably less than or equal to 1.2 μm. With this configuration, it is possible to improve the flatness of the surface of the buried layer 112 while reducing diffraction loss of light in the buried layer 112 even more sufficiently.

The second structure ST2 includes no substrate (for example, no InP substrate), and the second multilayer film reflector 108 is a dielectric multilayer film reflector. In this case, it is possible to improve the heat dissipation by, for example, replacing the reflector including the second multilayer film reflector 108 of the second structure ST2 with a reflector that is higher in heat dissipation than an InP-based epi DBR (which needs to use a mixed crystal material that is poor in heat dissipation).

For example, it is possible to obtain a reflector having excellent heat dissipation by making the cathode electrode 110 serve as a part of the reflector and reducing the number of pairs of dielectric multilayer film reflectors as the second multilayer film reflector 108.

The method for manufacturing the surface emitting laser 100 according to the first embodiment of the present technology includes: a process of generating the first multilayer body L1 by layering the active layer 104 and the tunnel junction layer 106 in this order on the growth substrate 101 (first substrate); a process of forming the mesa M and the adjacent region (for example, another mesa M) adjacent to the mesa M such that the interval between the mesa M and the adjacent region is less than or equal to 30 μm by etching the tunnel junction layer 106 of the first multilayer body L1; and a process of generating the second multilayer body L2 replacing the first multilayer body L1 by layering the buried layer 112 that buries the periphery of the mesa M and the periphery of the adjacent region (for example, the periphery of another mesa M) on the tunnel junction layer 106.

In this case, it is possible to prevent the surface of the buried layer 112 from becoming uneven without increasing the thickness (film thickness FT) of the buried layer 112 (for example, without setting the thickness greater than or equal to 2 μm).

As a result, with the method for manufacturing the surface emitting laser 100, it is possible to manufacture the surface emitting laser 100 capable of improving the flatness of the surface of the buried layer 112 while reducing diffraction loss of light in the buried layer 112.

The method for manufacturing the surface emitting laser 100 further includes a process of bonding the buried layer 112 of the second multilayer body L2 and the third multilayer body L3 including the first multilayer film reflector 107 together.

The third multilayer body L3 includes the substrate 111 (second substrate), and the method for manufacturing the surface emitting laser 100 further includes a process of removing the growth substrate 101 from the second multilayer body L2 and a process of forming the second multilayer film reflector 108 on the surface of the second multilayer body L2 from which the growth substrate 101 has been removed.

3. Surface Emitting Laser According to Modification of First Embodiment of Present Technology Hereinafter, a surface emitting laser according to a modification of the first embodiment of the present technology will be described.

Figure 22:
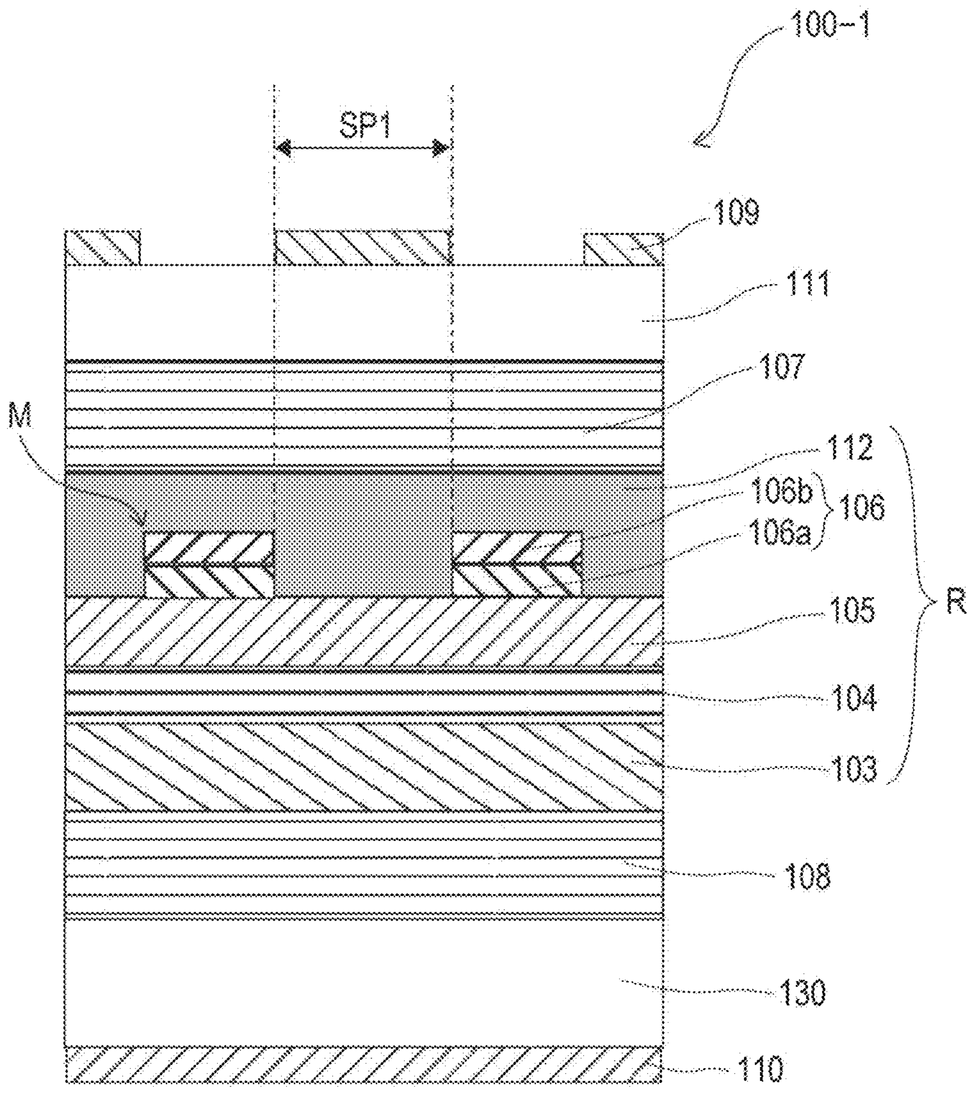
FIG. 22 is a cross-sectional view illustrating at least a part of a surface emitting laser according to a modification of the first embodiment of the present technology.

As illustrated in FIG. 22, a surface emitting laser 100-1 according to the modification of the first embodiment of the present technology has a configuration similar to the configuration of the surface emitting laser 100 of the first embodiment except that the second structure including the second multilayer film reflector 108 is different.

Specifically, in a second structure of the surface emitting laser 100-1, a semiconductor multilayer film reflector (for example, an AlGaAs-based DBR) as the second multilayer film reflector 108 is provided in common for the plurality of mesas M, a substrate 130 (for example, a GaAs substrate) is provided on the back surface (lower surface) of the second multilayer film reflector 108, and the cathode electrode 110 is provided in common for the plurality of mesas M on the back surface (lower surface) of the substrate 130.

Hereinafter, a method for manufacturing the surface emitting laser 100-1 will be described with reference to the flowchart (steps S21 to S30) in FIG. 23. Here, as an example, a plurality of the surface emitting lasers 100-1 is generated at a time using a wafer as a base material of the substrate 111 and a wafer as a base material of the substrate 130 by a semiconductor manufacturing method using a semiconductor manufacturing device. Next, the plurality of surface emitting lasers 100-1 integrated in series is separated from each other to obtain a plurality of chip-shaped surface emitting lasers 100-1 (surface emitting laser chips).

Figure 23:
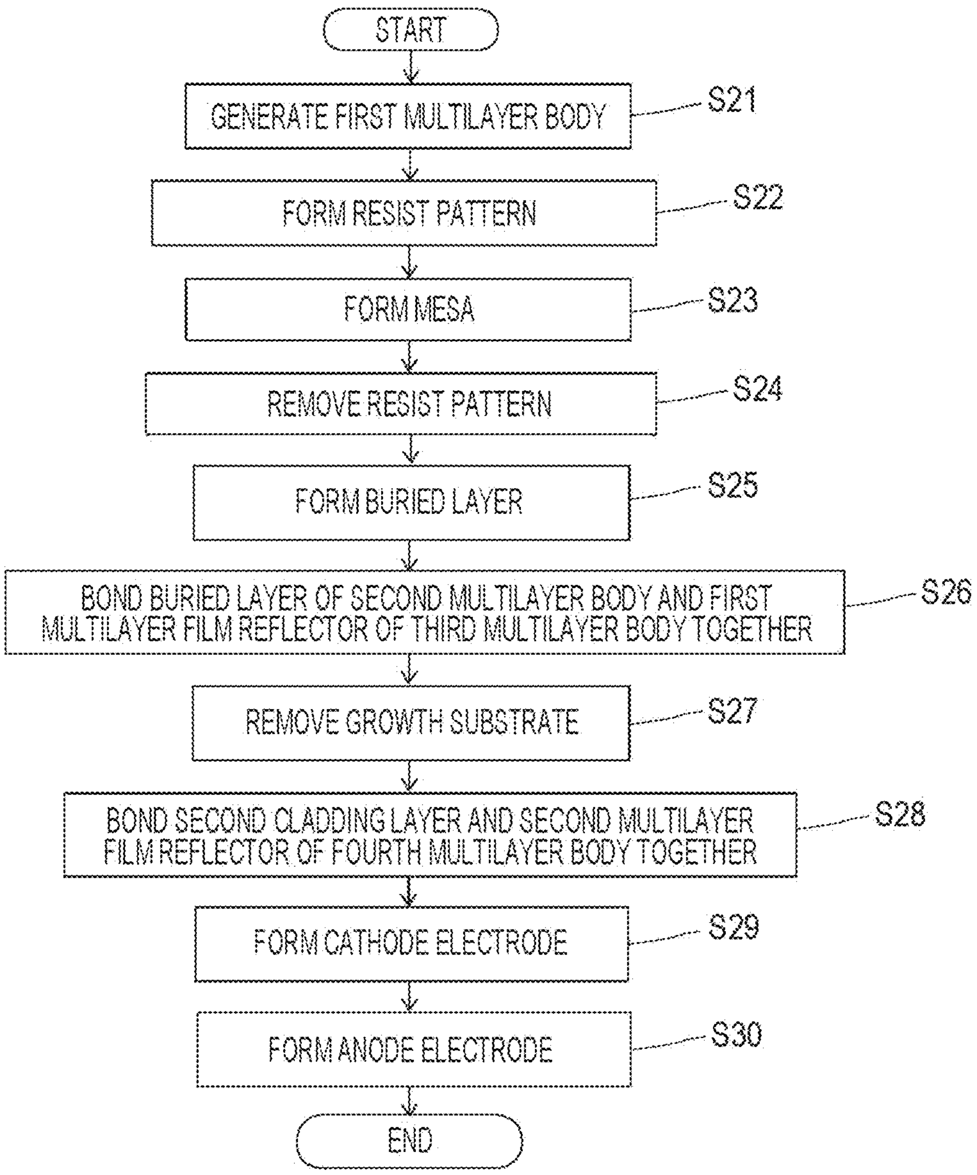
FIG. 23 is a flowchart for describing an example of a method for manufacturing the surface emitting laser in FIG. 22.

As an example, the surface emitting laser 100-1 is manufactured by the semiconductor manufacturing device by following the procedure of the flowchart in FIG. 23.

In the first step S21, the first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region 106*b* of the tunnel junction layer 106 are layered (epitaxially grown) in this order on the growth substrate 101 (for example, an InP substrate) in a growth chamber by metal organic chemical vapor deposition (MOCVD) or molecular beam epitaxy (MBE).

In the next step S22, the resist pattern RP is formed (see FIG. 9). Specifically, on the tunnel junction layer 106 of the first multilayer body L1, the resist pattern RP is formed, the resist pattern RP having an opening at a position corresponding to a position other than a position where a plurality of the mesas M having an interval between two mesas M adjacent to each other of less than or equal to 30 μm is to be formed.

In the next step S23, the mesa M is formed (see FIG. 10). Specifically, the tunnel junction layer 106 is etched by wet etching or dry etching using the resist pattern RP as a mask to form the plurality of mesas M. An etching depth at this time is, for example, up to the surface of the first cladding layer 105. As a result, the plurality of mesas M having the interval between two mesas M adjacent to each other of less than or equal to 30 μm is formed.

In the next step S24, the resist pattern RP is removed (see FIG. 11).

In the next step S25, the buried layer 112 is formed (see FIG. 12). Specifically, for example, an n-InP film is grown on the tunnel junction layer 106 (specifically, on each mesa M and on the peripheral region of the mesa M of the first cladding layer 105) at a growth temperature of 580° C., for example, with a film thickness of 2 μm. At this time, since the interval SP between two mesas M adjacent to each other is less than or equal to 30 μm, a gap between the two mesas M adjacent to each other is almost completely buried with In atoms to planarize the buried layer 112. The second multilayer body L2 replacing the first multilayer body L1 is generated by forming the buried layer 112.

In the next step S26, the buried layer 112 of the second multilayer body L2 and the first multilayer film reflector 107 of the third multilayer body L3 are bonded together (see FIGS. 13 and 14). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector are alternately layered on the substrate 111 to generate the third multilayer body L3.

In the next step S27, the growth substrate 101 is removed (see FIG. 15). Specifically, after the back surface of the growth substrate 101 (see FIG. 14) is ground, a remaining portion is selectively removed by wet etching. As a result of removing the growth substrate 101, the second cladding layer 103 is exposed.

Figure 24:
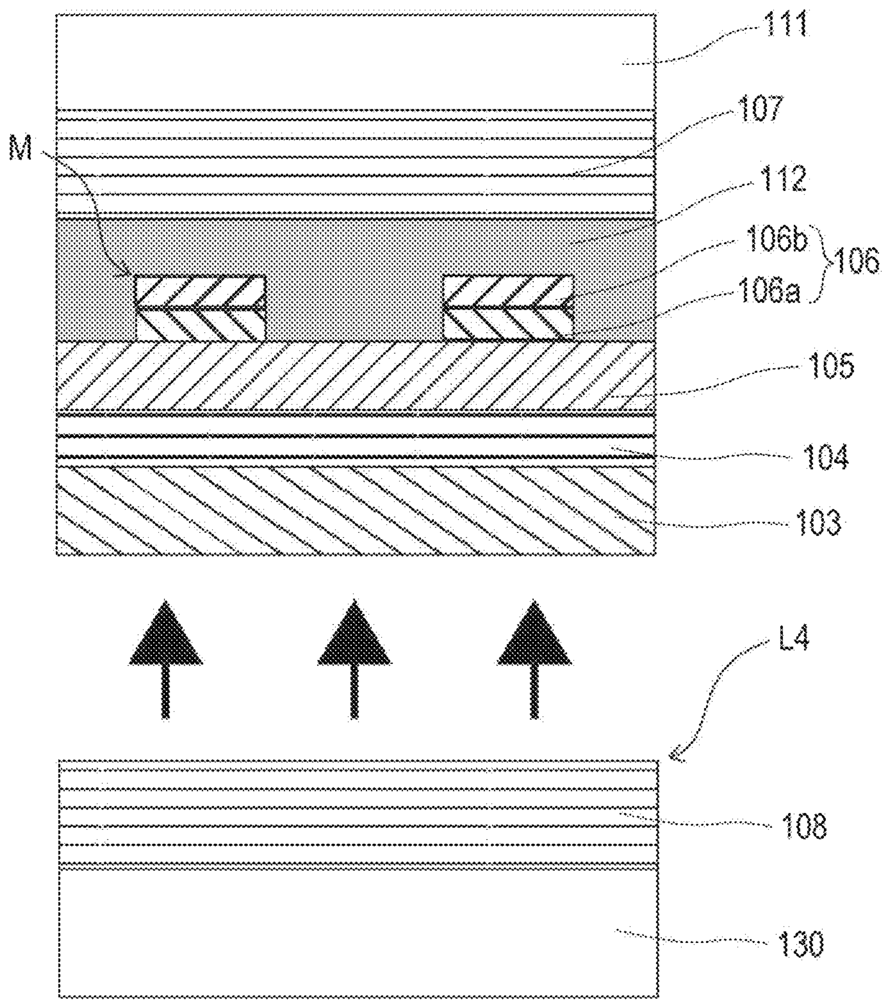
FIG. 24 is a cross-sectional view illustrating an eighth process (before bonding) in FIG. 23.
Figure 25:
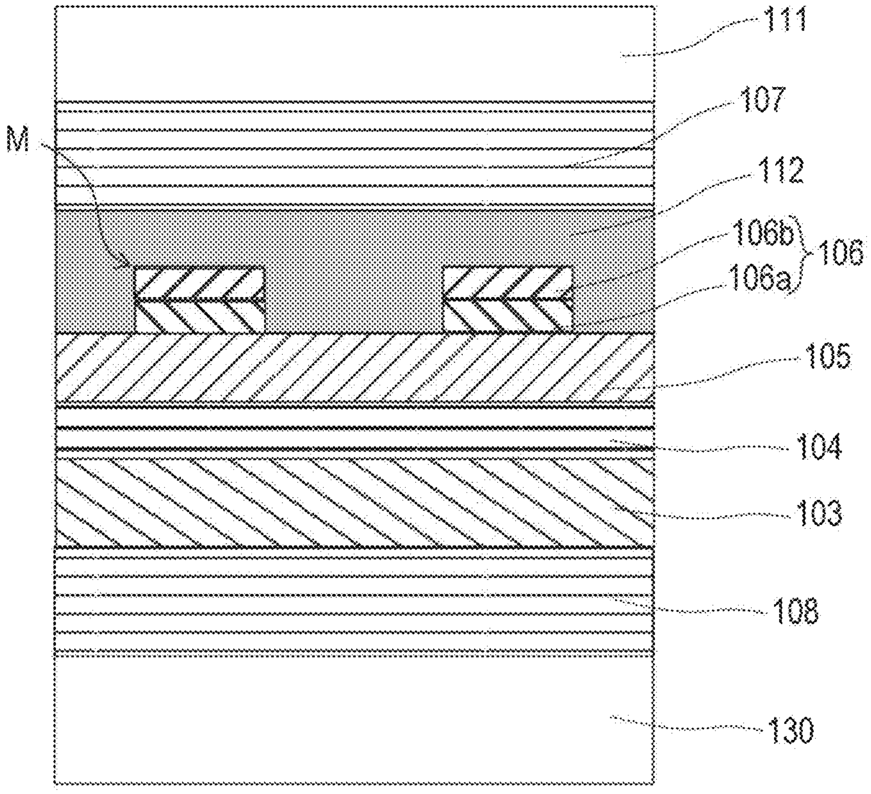
FIG. 25 is a cross-sectional view illustrating the eighth process (after bonding) in FIG. 23.

In the next step S28, the second cladding layer 103 (see FIG. 15) and the second multilayer film reflector 108 of a fourth multilayer body L4 are bonded together (see FIGS. 24 and 25). Note that a high refractive index layer and a low refractive index layer constituting the semiconductor multilayer film reflector as the second multilayer film reflector 108 are alternately layered on the substrate 130 (for example, a GaAs substrate) to generate the fourth multilayer body L4.

Figure 26:
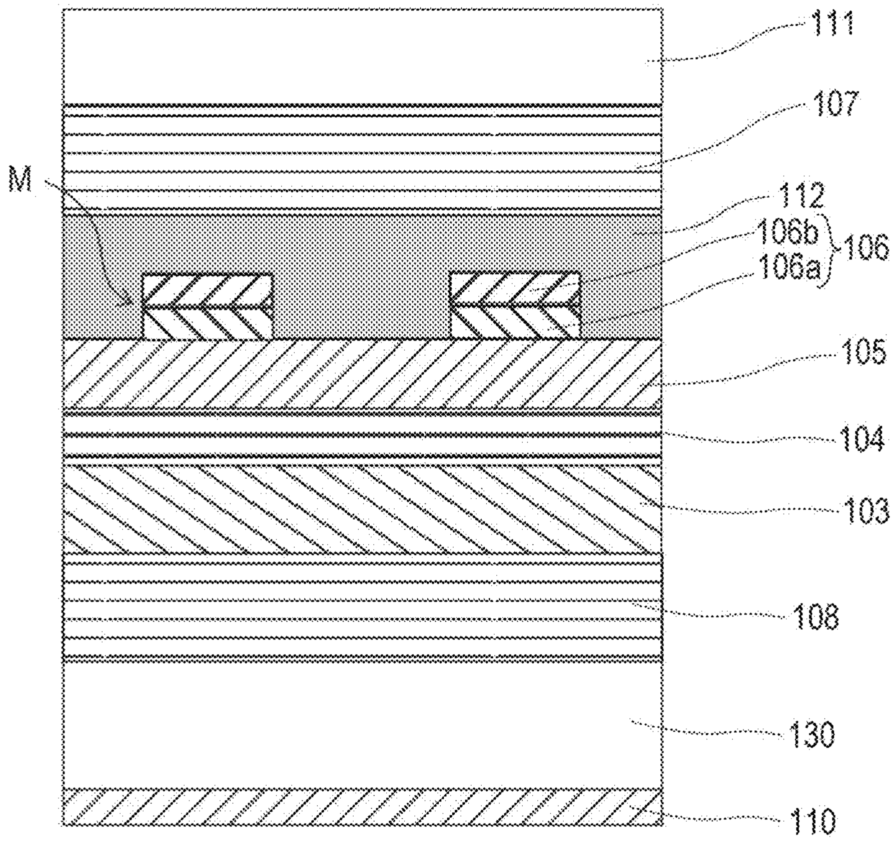
FIG. 26 is a cross-sectional view illustrating a ninth process in FIG. 23.

In the next step S29, the cathode electrode 110 is formed (see FIG. 26). Specifically, for example, an electrode material constituting the cathode electrode 110 is formed almost all over the back surface (lower surface) of the substrate 130 by a lift-off method, so as to correspond to each mesa M in common.

Figure 27:
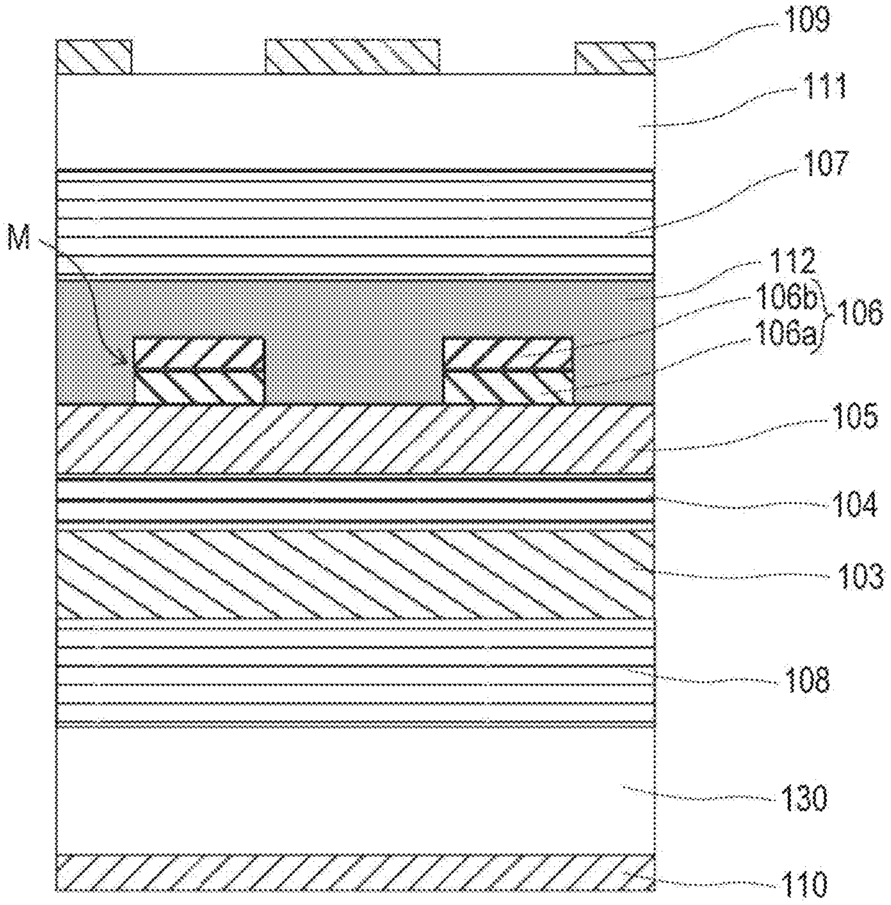
FIG. 27 is a cross-sectional view illustrating a tenth process in FIG. 23.

In the next step S30, the anode electrode 109 is formed (see FIG. 27). Specifically, for example, an electrode material constituting the anode electrode 109 is formed on the substrate 111 by a lift-off method so as to generate an opening serving as an emission port at a position corresponding to each mesa M.

With the surface emitting laser 100-1 described above, it is possible to produce actions and effects similar to the actions and effects of the surface emitting laser 100 of the first embodiment, and since the semiconductor multilayer film reflector (for example, an AlGaAs-based DBR) is used for the second multilayer film reflector 108, and the semiconductor substrate (for example, a GaAs substrate) is used for the substrate 130, an improvement in the heat dissipation can also be expected.

The third multilayer body L3 includes the substrate 111 (second substrate), and the method for manufacturing the surface emitting laser 100-1 further includes a process of removing the growth substrate 101 from the second multilayer body L2 and a process of bonding the fourth multilayer body L4 including the second multilayer film reflector 108 to the surface of the second multilayer body L2 from which the growth substrate 101 has been removed.

4. Surface Emitting Laser According to Second Embodiment of Present Technology Hereinafter, a surface emitting laser 200 according to a second embodiment of the present technology will be described.

(1) Configuration of Surface Emitting Laser

Figure 28:
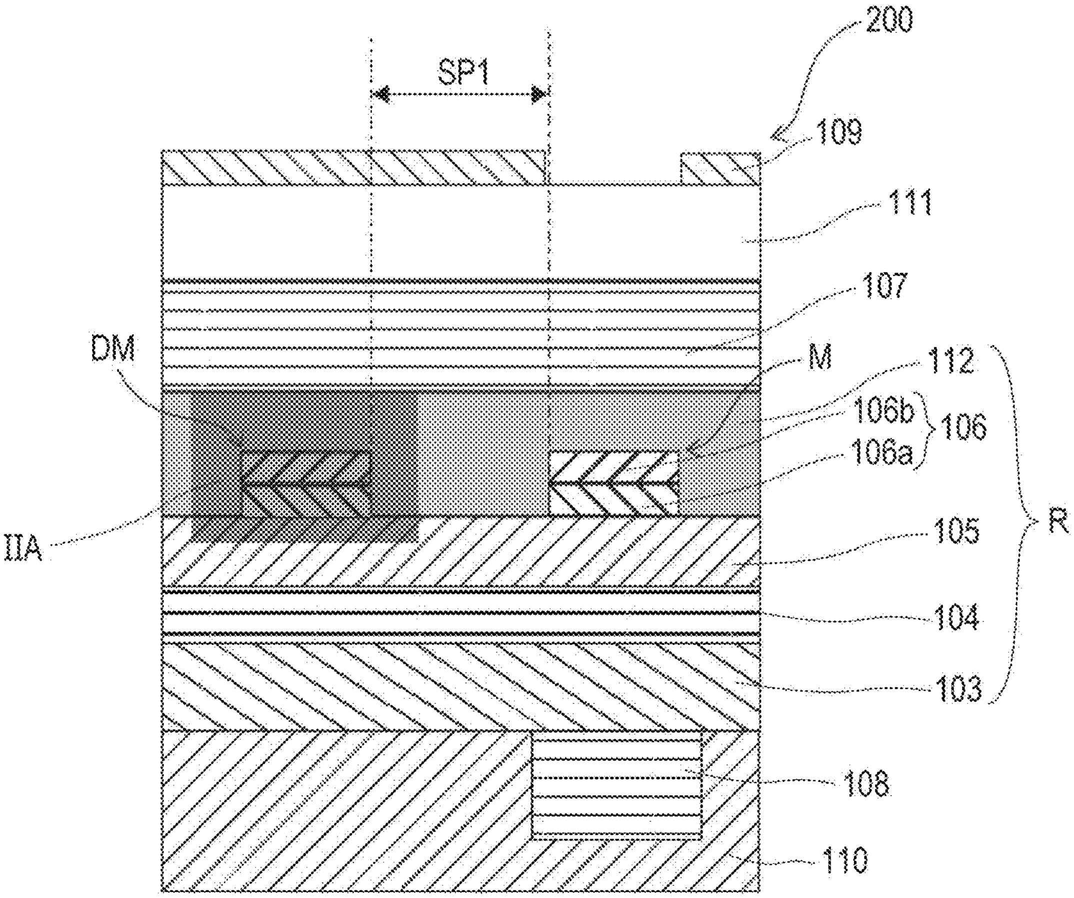
FIG. 28 is a cross-sectional view of at least a part of a surface emitting laser according to a second embodiment of the present technology.

FIG. 28 is a cross-sectional view of at least a part of the surface emitting laser 200 of the second embodiment.

As illustrated in FIG. 28, the surface emitting laser 200 of the second embodiment of the present technology has a configuration substantially similar to the configuration of the surface emitting laser 100 of the first embodiment except that another mesa as the adjacent region in the tunnel junction layer 106 is made higher in resistance.

More specifically, in the tunnel junction layer 106 of the surface emitting laser 200, another mesa adjacent to the mesa M is a dummy mesa DM that is made higher in resistance by ion implantation (for example, a proton, B, O, or the like is implanted) to prevent a current from flowing therethrough. That is, the dummy mesa DM is a mesa where the light-emitting position of the active layer 104 is not set. The surface emitting laser 200 is provided with neither the emission port nor the second multilayer film reflector 108 corresponding to the dummy mesa DM.

Hereinafter, the mesa M that is a mesa where the light-emitting position of the active layer 104 is set is also referred to as a "light-emitting position setting mesa M".

By the way, in the surface emitting laser 100 of the first embodiment, the flatness of the buried layer 112 is improved by making the interval between two mesas M (light-emitting position setting mesas M) adjacent to each other smaller (for example, less than or equal to 30 μm), but if the interval between the light-emitting position setting mesas M adjacent to each other can be made larger, the interval between the light-emitting positions of the active layer 104 (interval between the light-emitting portions) can be adjusted.

Therefore, in the surface emitting laser 200, for example, in a case where the surface emitting laser 200 has four or more mesas (for example, in a case where the surface emitting laser 200 has a cross section including a plurality of unit cross-sectional structures in FIG. 28), one of two mesas adjacent to each other in the unit cross-sectional structure serves as the dummy mesa DM, so that it is possible to make the interval between the light-emitting position setting mesas M larger while making the interval between two mesas adjacent to each other smaller (for example, less than or equal to 30 μm). With this configuration, it is possible to make the interval between the light-emitting positions of the active layer 104 substantially larger while improving the flatness of the buried layer 112.

Therefore, in the surface emitting laser 200, it is possible to set a desired number of light-emitting positions of the active layer 104 and set a desired interval between two light-emitting positions adjacent to each other by appropriately adjusting the number and layout of each of the mesas M and the dummy mesas DM. That is, the surface emitting laser 200 has a high degree of freedom in designing a light-emitting pattern that is determined by the number and layout of the light-emitting positions of the active layer 104.

Therefore, in the surface emitting laser 200, for example, in a case where the surface emitting laser 200 has a plurality of (for example, two) mesas (for example, in a case where the surface emitting laser 200 has a cross section of the unit cross-sectional structure in FIG. 28), one of two mesas adjacent to each other in the unit cross-sectional structure serves as the dummy mesa DM, so that it is possible to make the light-emitting position setting mesa serve as a single light-emitting position setting mesa while making the interval between two mesas adjacent to each other smaller (for example, less than or equal to 30 μm). With this configuration, it is possible to make the light-emitting position of the active layer 104 serve as a substantially single light-emitting position while improving the flatness of the buried layer 112.

(2) Operation of Surface Emitting Laser

In the surface emitting laser 200, for example, when a current flows from the laser driver to the anode electrode 109, the current enters the light-emitting position setting mesa M of the tunnel junction layer 106 through the substrate 111, the first multilayer film reflector 107, and the upper layer of the buried layer 112 (constricted by the lower layer of the buried layer 112 (region around the light-emitting position setting mesa M)). The current that has passed through the light-emitting position setting mesa M (current constricted by the buried layer 112) is injected into a region of the active layer 104 corresponding to the light-emitting position setting mesa M through the first cladding layer 105, and the region of the active layer 104 emits light. The current that has passed through the region of the active layer 104 flows out from the cathode electrode 110 to, for example, the laser driver through the second cladding layer 103. The light generated in the region of the active layer 104 travels between the first and second multilayer film reflectors 107 and 108, is confined in the lower layer of the buried layer 112 and amplified in the region of the active layer 104 during the travel, and is emitted as laser light from the upper surface (emission surface) of the substrate 111 when oscillation conditions are satisfied.

(3) Method for Manufacturing Surface Emitting Laser

Hereinafter, an example of a method for manufacturing the surface emitting laser 200 will be described with reference to the flowchart (steps S41 to S53) in FIG. 29. Here, as an example, a plurality of the surface emitting lasers 200 is generated at a time using one wafer as a base material of the substrate 111 by a semiconductor manufacturing method using a semiconductor manufacturing device. Next, the plurality of surface emitting lasers 200 integrated in series is separated from each other to obtain a plurality of chip-shaped surface emitting lasers 200 (surface emitting laser chips).

Figure 29:
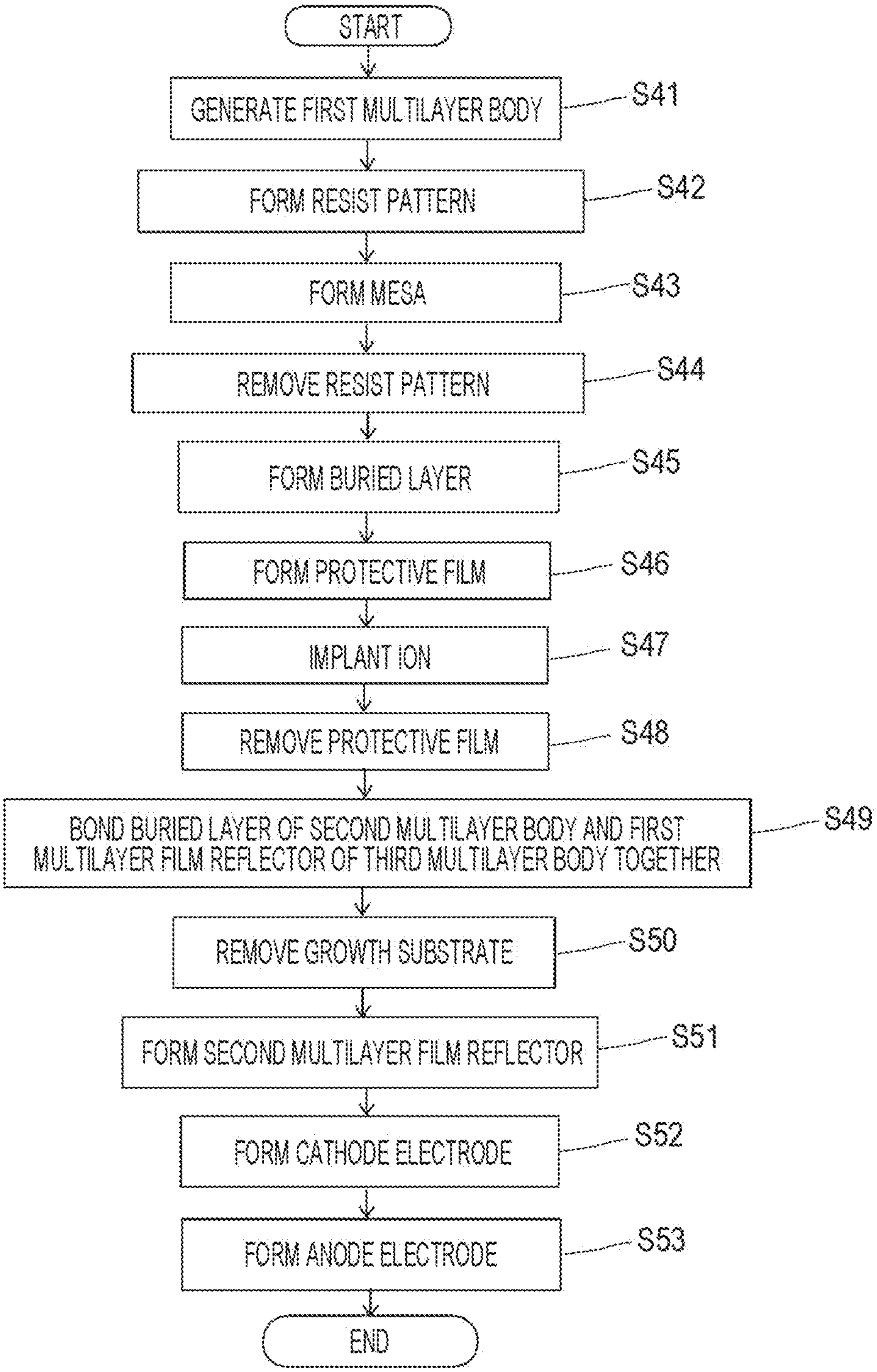
FIG. 29 is a flowchart for describing an example of a method for manufacturing the surface emitting laser in FIG. 28.

As an example, the surface emitting laser 200 is manufactured by the semiconductor manufacturing device by following the procedure of the flowchart in FIG. 29.

In the first step S41, the first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region 106*b* of the tunnel junction layer 106 are layered (epitaxially grown) in this order on the growth substrate 101 (for example, an InP substrate) in a growth chamber by metal organic chemical vapor deposition (MOCVD) or molecular beam epitaxy (MBE).

In the next step S42, the resist pattern RP is formed (see FIG. 9). Specifically, on the tunnel junction layer 106 of the first multilayer body L1, the resist pattern RP is formed, the resist pattern RP having an opening at a position corresponding to a position other than a position where a plurality of mesas having an interval between two mesas adjacent to each other of less than or equal to 30 μm is to be formed.

In the next step S43, the mesa is formed (see FIG. 10). Specifically, the tunnel junction layer 106 is etched by wet etching or dry etching using the resist pattern RP as a mask to form the mesa. An etching depth at this time is, for example, up to the surface of the first cladding layer 105. As a result, the plurality of mesas having the interval between two mesas M adjacent to each other of less than or equal to 30 μm is formed.

In the next step S44, the resist pattern RP is removed (see FIG. 11).

In the next step S45, the buried layer 112 is formed (see FIG. 12). Specifically, for example, an n-InP film is grown on the tunnel junction layer 106 (specifically, on each mesa and on the peripheral region of the mesa of the first cladding layer 105) at a growth temperature of 580° C., for example, with a film thickness of 2 μm. At this time, since the interval between two mesas adjacent to each other is less than or equal to 30 μm, a gap between the two mesas adjacent to each other is almost completely buried with In atoms to planarize the buried layer 112. The second multilayer body L2 replacing the first multilayer body L1 is generated by forming the buried layer 112.

Figure 30:
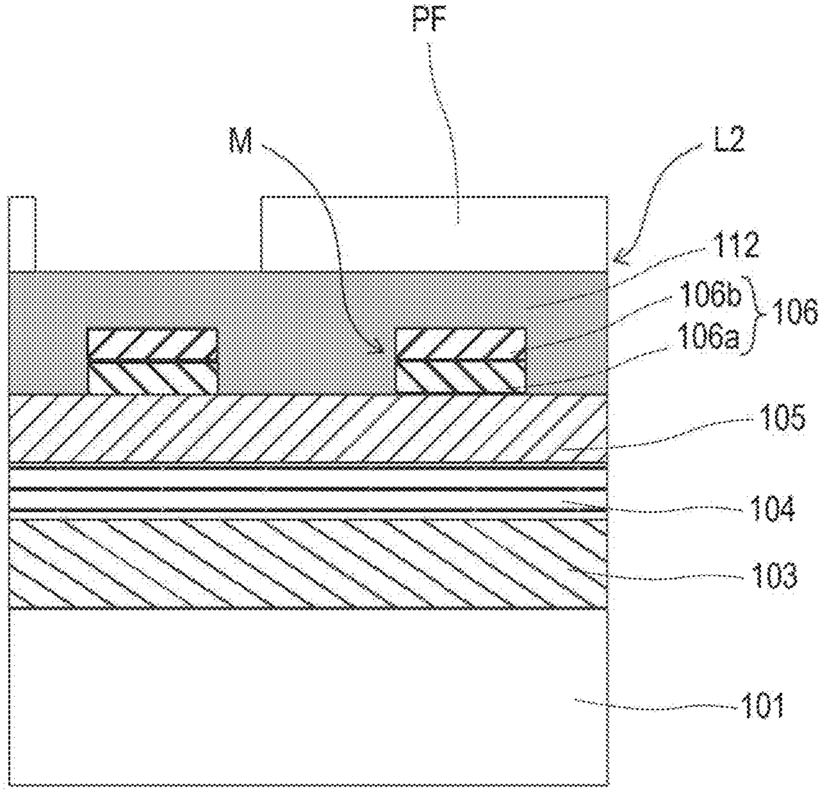
FIG. 30 is a cross-sectional view illustrating a sixth process in FIG. 29.

In the next step S46, a protective film PF is formed (see FIG. 30). Specifically, on the buried layer 112 of the second multilayer body L2, the protective film PF is formed, the protective film PF including a resist, an oxide (for example, $SiO_2$), or the like and having an opening at a position corresponding to a region where the dummy mesa DM of the tunnel junction layer 106 is to be formed.

Figure 31:
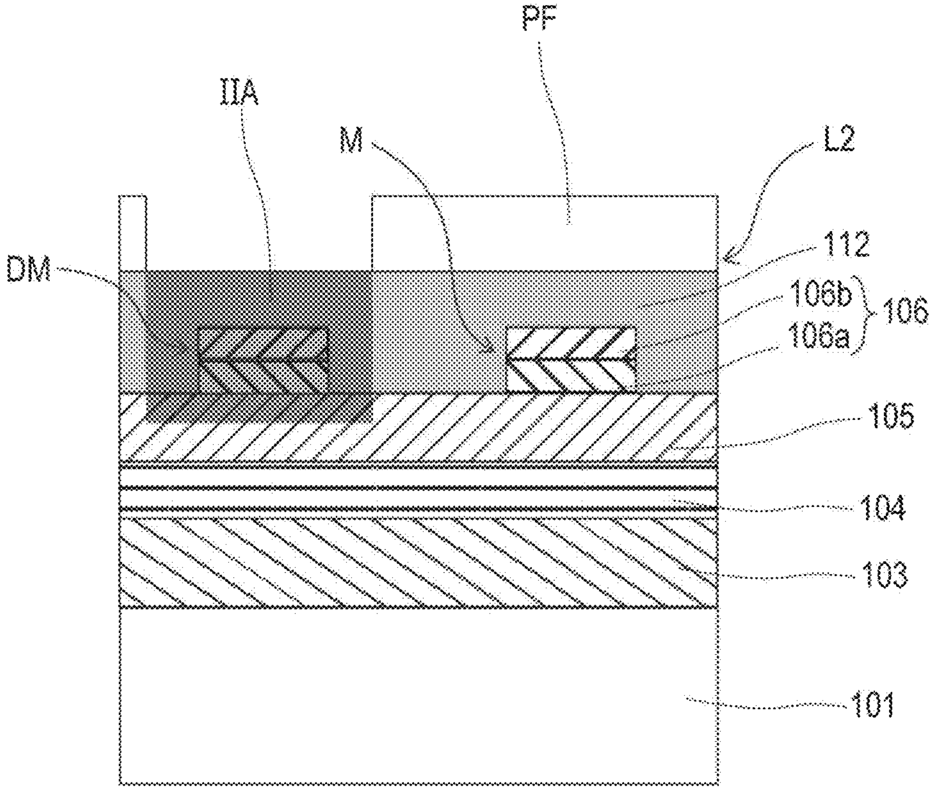
FIG. 31 is a cross-sectional view illustrating a seventh process in FIG. 29.

In the next step S47, ions are implanted (see FIG. 31). Specifically, ions such as protons (II+) are implanted into the buried layer 112 and the tunnel junction layer 106 from the opening of the protective film PF. At this time, ion implantation energy is set so as to allow the ions to spread at least all over a region in the thickness direction of the tunnel junction layer 106, for example. As a result, the mesa in the region into which the ions are implanted (ion implantation region IIA) becomes the dummy mesa DM.

Figure 32:
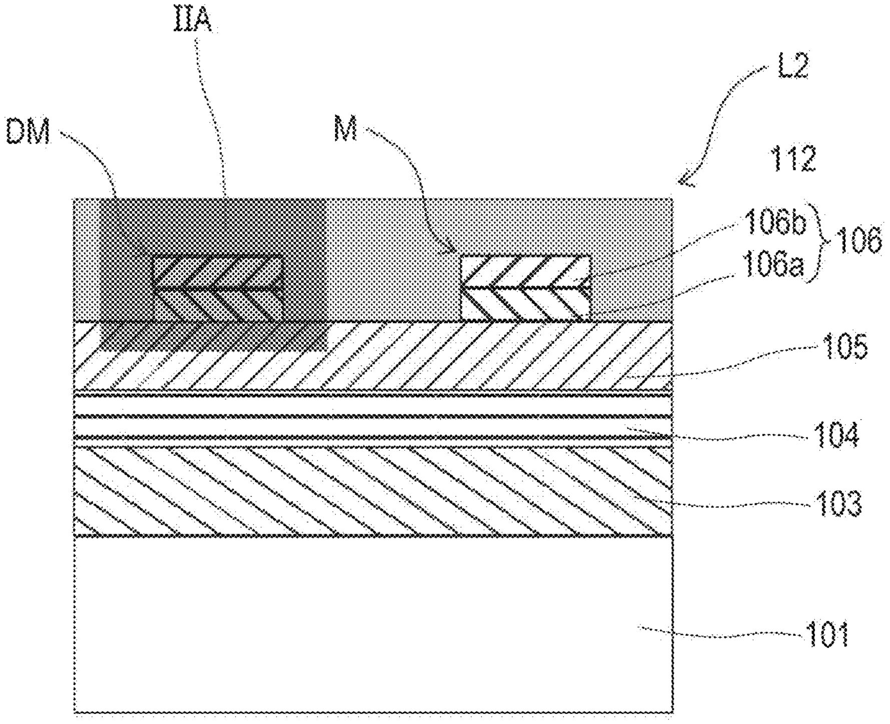
FIG. 32 is a cross-sectional view illustrating an eighth process in FIG. 29.

In the next step S48, the protective film PF is removed (see FIG. 32).

Figure 33:
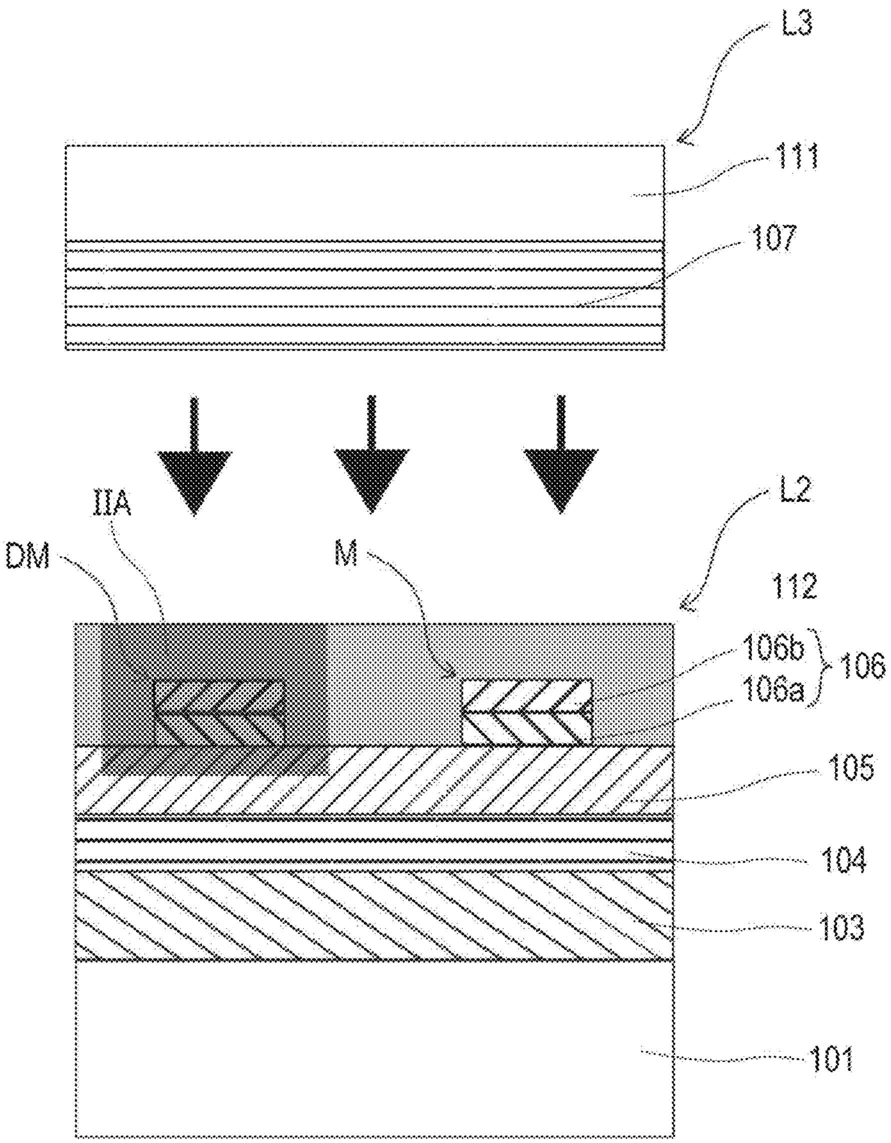
FIG. 33 is a cross-sectional view illustrating a ninth process (before bonding) in FIG. 29.
Figure 34:
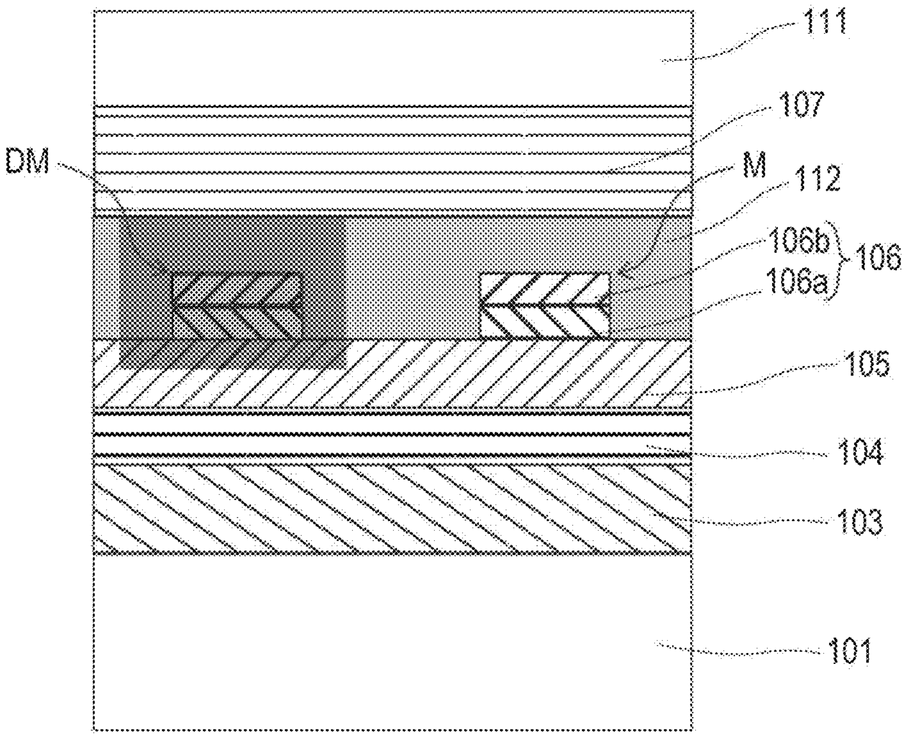
FIG. 34 is a cross-sectional view illustrating the ninth process (after bonding) in FIG. 29.

In the next step S49, the buried layer 112 of the second multilayer body L2 and the first multilayer film reflector 107 of the third multilayer body L3 are bonded together (see FIGS. 33 and 34). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector as the first multilayer film reflector 107 are alternately layered on the substrate 111 to generate the third multilayer body L3.

Figure 35:
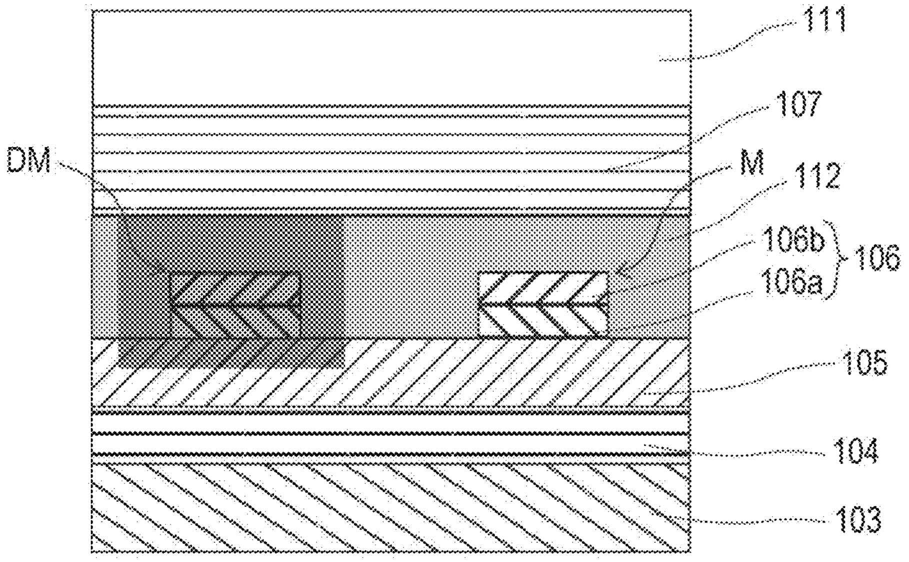
FIG. 35 is a cross-sectional view illustrating a tenth process in FIG. 29.

In the next step S50, the growth substrate 101 is removed (see FIG. 35). Specifically, after the back surface of the growth substrate 101 (see FIG. 34) is ground, a remaining portion is selectively removed by wet etching. As a result of removing the growth substrate 101, the second cladding layer 103 is exposed.

Figure 36:
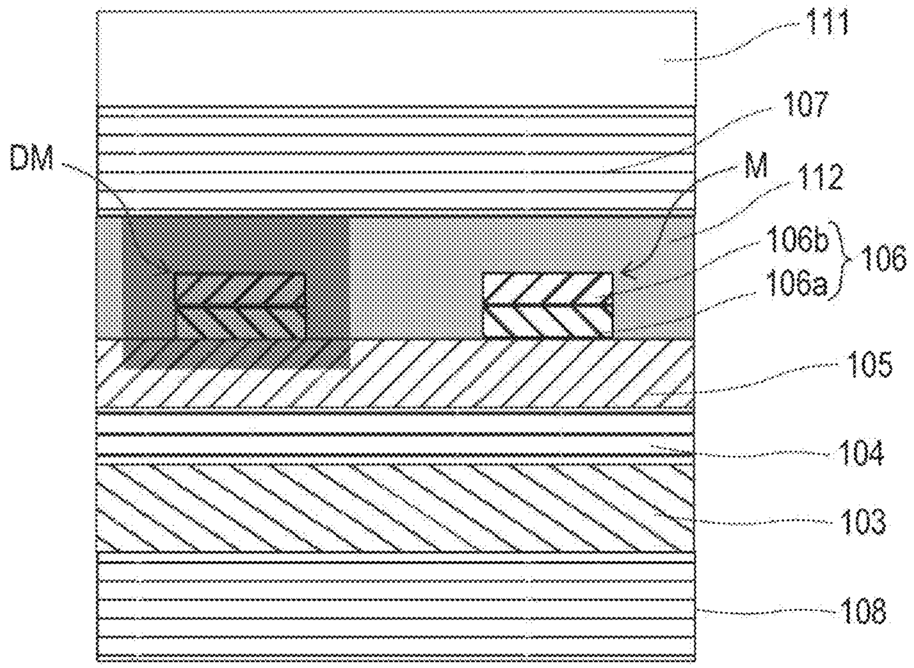
FIG. 36 is a cross-sectional view illustrating an eleventh process (after deposition) in FIG. 29.
Figure 37:
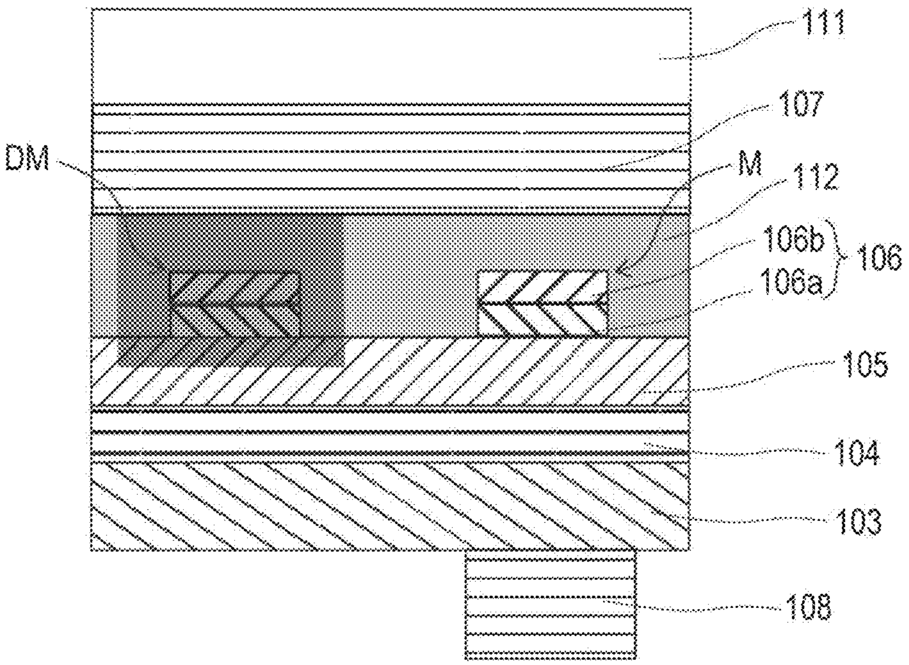
FIG. 37 is a cross-sectional view illustrating the eleventh process (after etching) in FIG. 29.

In the next step S51, the second multilayer film reflector 108 is formed (see FIGS. 36 and 37). Specifically, first, a high refractive index layer and a low refractive index layer constituting the dielectric multilayer film reflector as the second multilayer film reflector 108 are alternately deposited on the back surface (lower surface) of the second cladding layer 103 (see FIG. 36). Next, the dielectric multilayer film reflector is etched to leave only a portion corresponding to the light-emitting position setting mesa M (see FIG. 37).

Figure 38:
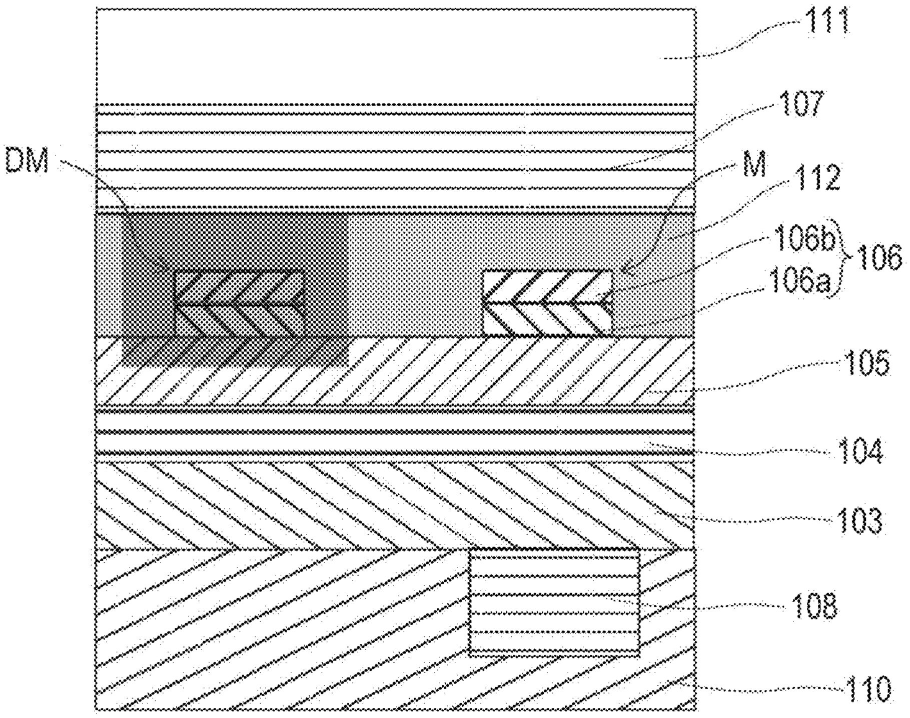
FIG. 38 is a cross-sectional view illustrating a twelfth process in FIG. 29.

In the next step S52, the cathode electrode 110 is formed (see FIG. 38). Specifically, for example, an electrode material constituting the cathode electrode 110 is formed by a lift-off method so as to cover at least the second multilayer film reflector 108 corresponding to the light-emitting position setting mesa M.

Figure 39:
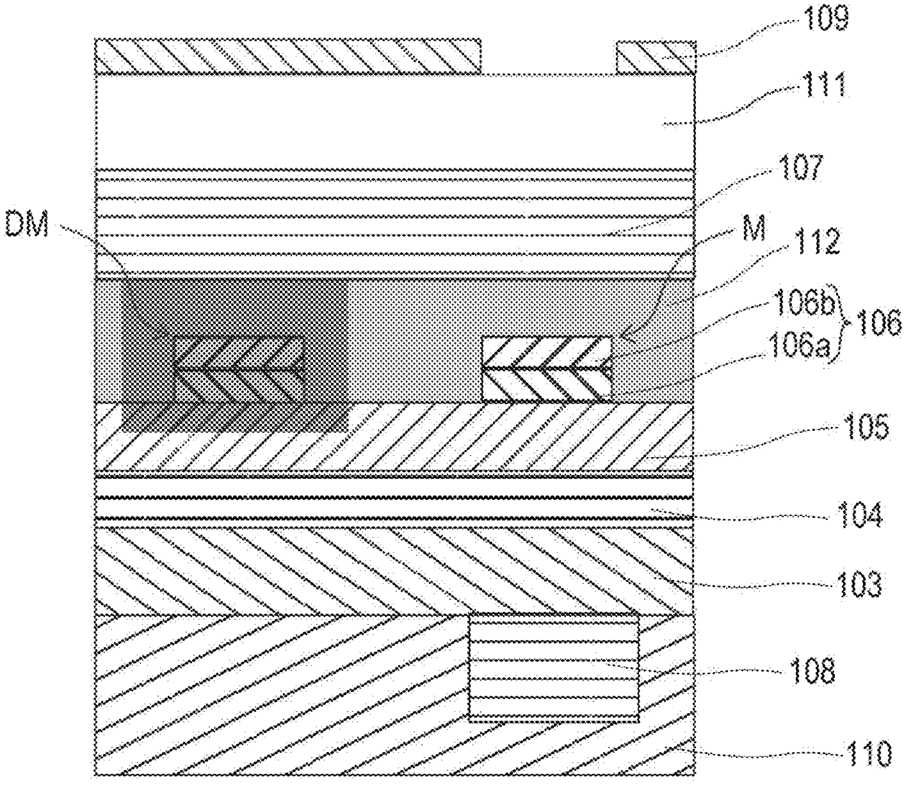
FIG. 39 is a cross-sectional view illustrating a thirteenth process in FIG. 29.

In the last step S53, the anode electrode 109 is formed (see FIG. 39). Specifically, for example, an electrode material constituting the anode electrode 109 is formed on the substrate 111 by a lift-off method so as to generate an opening serving as an emission port at a position corresponding to the light-emitting position setting mesa M.

(4) Effects of Surface Emitting Laser and Method for Manufacturing the Same

In the surface emitting laser 200, another mesa adjacent to the mesa M (light-emitting position setting mesa M) is the dummy mesa DM that is made higher in resistance.

With the surface emitting laser 200, it is possible to produce effects similar to the effects of the surface emitting laser 100 of the first embodiment, and it is further possible to make, by, for example, making a mesa located between two light-emitting position setting mesas M serve as the dummy mesa DM, the interval between the two light-emitting position setting mesas M substantially larger and in turn possible to make the interval between two light-emitting positions adjacent to each other of the active layer 104 substantially larger.

With the surface emitting laser 200, it is possible to produce effects similar to the effects of the surface emitting laser 100 of the first embodiment, and it is further possible to make, by, for example, making a mesa adjacent to the light-emitting position setting mesa M serve as the dummy mesa DM, the light-emitting position setting mesa M serve as a single light-emitting position setting mesa M and in turn possible to make the light-emitting position of the active layer 104 serve as a single light-emitting position.

In summary, with the surface emitting laser 200, it is possible to produce effects similar to the effects of the surface emitting laser 100 of the first embodiment, and it is further possible to set a desired number of light-emitting positions of the active layer 104 by appropriately selecting a mesa to serve as the dummy mesa DM from the plurality of mesas and set a desired interval between two light-emitting positions adjacent to each other in a case where there is a plurality of light-emitting positions, so that the degree of freedom in designing the light-emitting pattern (pattern determined by the number and layout of light-emitting portions) becomes high.

The method for manufacturing the surface emitting laser 200 includes: a process of generating the first multilayer body L1 (multilayer body) by layering the active layer 104 and the tunnel junction layer 106 in this order on the growth substrate 101 (first substrate); a process of forming the mesa M and the adjacent region (for example, another mesa) adjacent to the mesa M such that the interval between the mesa M and the adjacent region is less than or equal to 30 μm by etching the tunnel junction layer 106 of the first multilayer body L1; and a process of generating the second multilayer body L2 (another multilayer body) replacing the first multilayer body L1 by layering the buried layer 112 that buries the periphery of the mesa M and the periphery of the adjacent region (for example, the periphery of another mesa) on the tunnel junction layer 106.

The method for manufacturing the surface emitting laser 200 further includes a process of making the adjacent region higher in resistance by implanting ions into the second multilayer body L2 from the buried layer 112.

Note that, in the method for manufacturing the surface emitting laser 200, ions may be implanted into the first multilayer body L1 from the tunnel junction layer 106 to make the adjacent region (for example, another mesa) or a portion where the adjacent region is to be formed higher in resistance.

With the method for manufacturing the surface emitting laser 200, it is possible to produce effects similar to the effects of the method for manufacturing the surface emitting laser 100 of the first embodiment, and it is further possible to manufacture the surface emitting laser 200 in which the interval between two light-emitting positions adjacent to each other of the active layer 104 can be made substantially larger, for example.

With the method for manufacturing the surface emitting laser 200, it is possible to produce effects similar to the effects of the method for manufacturing the surface emitting laser 100 of the first embodiment, and it is further possible to manufacture the surface emitting laser 200 that allows the light-emitting position of the active layer 104 to serve as a single light-emitting position, for example.

5. Surface Emitting Laser According to Third Embodiment of Present Technology Hereinafter, a surface emitting laser 300 according to a third embodiment of the present technology will be described.

Figure 40:
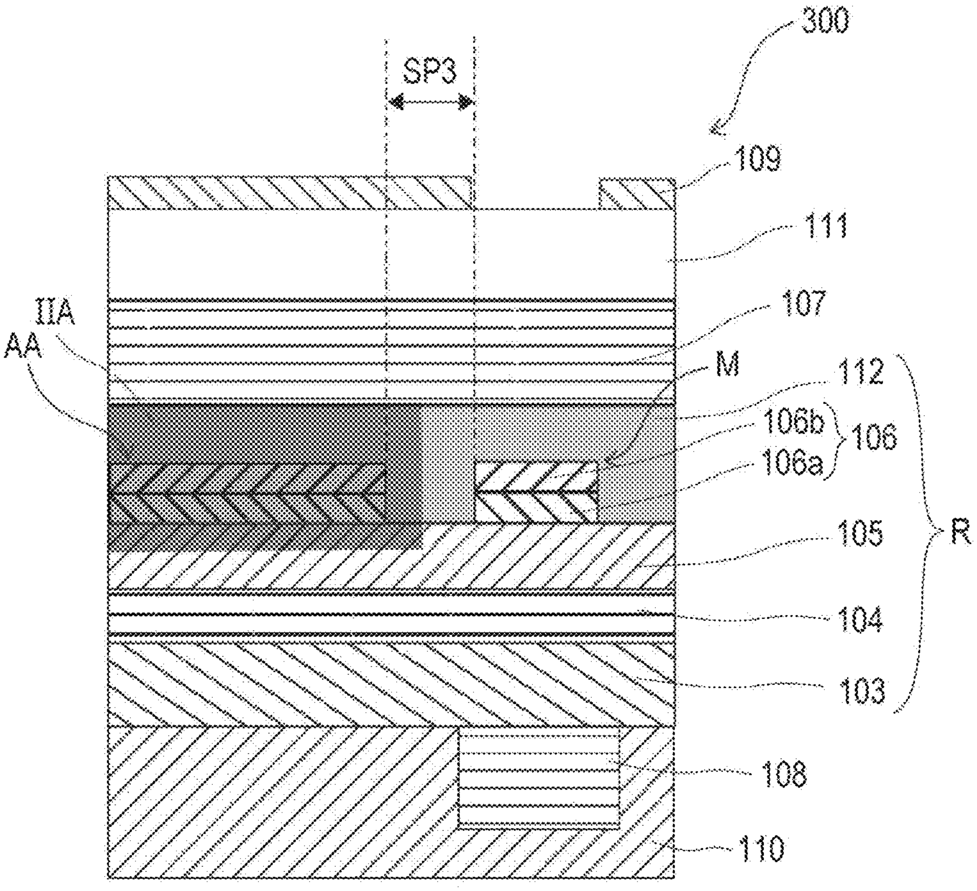
FIG. 40 is a cross-sectional view of at least a part of a surface emitting laser according to a third embodiment of the present technology.

FIG. 40 is a cross-sectional view of at least a part of the surface emitting laser 300 of the third embodiment.

As illustrated in FIG. 40, the surface emitting laser 300 of the third embodiment of the present technology has a configuration substantially similar to the configuration of the surface emitting laser 100 of the first embodiment except that an adjacent region AA adjacent to the mesa M (light-emitting position setting mesa M) is made higher in resistance.

More specifically, in the tunnel junction layer 106 of the surface emitting laser 300, the adjacent region AA adjacent to the mesa M is an ion implantation region (high resistance region) that is made higher in resistance by ion implantation (for example, a proton, B, O, or the like is implanted) to prevent a current from flowing therethrough. That is, the adjacent region AA is a region where the light-emitting position of the active layer 104 is not set. In the surface emitting laser 300, as the emission port and the second multilayer film reflector 108, only the emission port and the second multilayer film reflector 108 corresponding to the light-emitting position setting mesa M are provided.

In the surface emitting laser 300, in a case where the surface emitting laser 300 has a plurality of the mesas M (for example, in a case where the surface emitting laser 300 has a cross section including a plurality of unit cross-sectional structures in FIG. 40), it is possible to make the interval between two light-emitting position setting mesas M adjacent to each other larger while making an interval SP3 between the mesa M and the adjacent region AA adjacent to each other smaller (for example, less than or equal to 30 μm). With this configuration, it is possible to make the interval between the light-emitting positions of the active layer 104 substantially larger while improving the flatness of the buried layer 112.

Therefore, in the surface emitting laser 300, it is possible to set a desired number of light-emitting positions of the active layer 104 and set a desired interval between two light-emitting positions adjacent to each other of the active layer 104 by appropriately adjusting the number and layout of each of the mesas M and the adjacent regions AA.

In the surface emitting laser 300, in a case where the surface emitting laser 300 has the mesa M and the adjacent region AA (for example, in a case where the surface emitting laser 300 has a cross section of the unit cross-sectional structure in FIG. 40), it is possible to make the light-emitting position setting mesa M serve as a single light-emitting position setting mesa M while making the interval SP3 between the mesa M and the adjacent region AA adjacent to each other smaller (for example, less than or equal to 30 μm). With this configuration, it is possible to make the light-emitting position of the active layer 104 serve as a substantially single light-emitting position while improving the flatness of the buried layer 112.

In summary, with the surface emitting laser 300, it is possible to set a desired number of light-emitting positions of the active layer 104 by appropriately forming the mesa M and the adjacent region AA and set a desired interval between two light-emitting positions adjacent to each other in a case where there is a plurality of light-emitting positions, so that the degree of freedom in designing the light-emitting pattern (pattern determined by the number and layout of light-emitting portions) becomes high.

The surface emitting laser 300 operates in a manner similar to the surface emitting laser 200 of the second embodiment.

Hereinafter, a method for manufacturing the surface emitting laser 300 will be described with reference to the flowchart (steps S61 to S73) in FIG. 41. Here, as an example, a plurality of the surface emitting lasers 300 is generated at a time using one wafer as a base material of the substrate 111 by a semiconductor manufacturing method using a semiconductor manufacturing device. Next, the plurality of surface emitting lasers 300 integrated in series is separated from each other to obtain a plurality of chip-shaped surface emitting lasers 300 (surface emitting laser chips).

Figure 41:
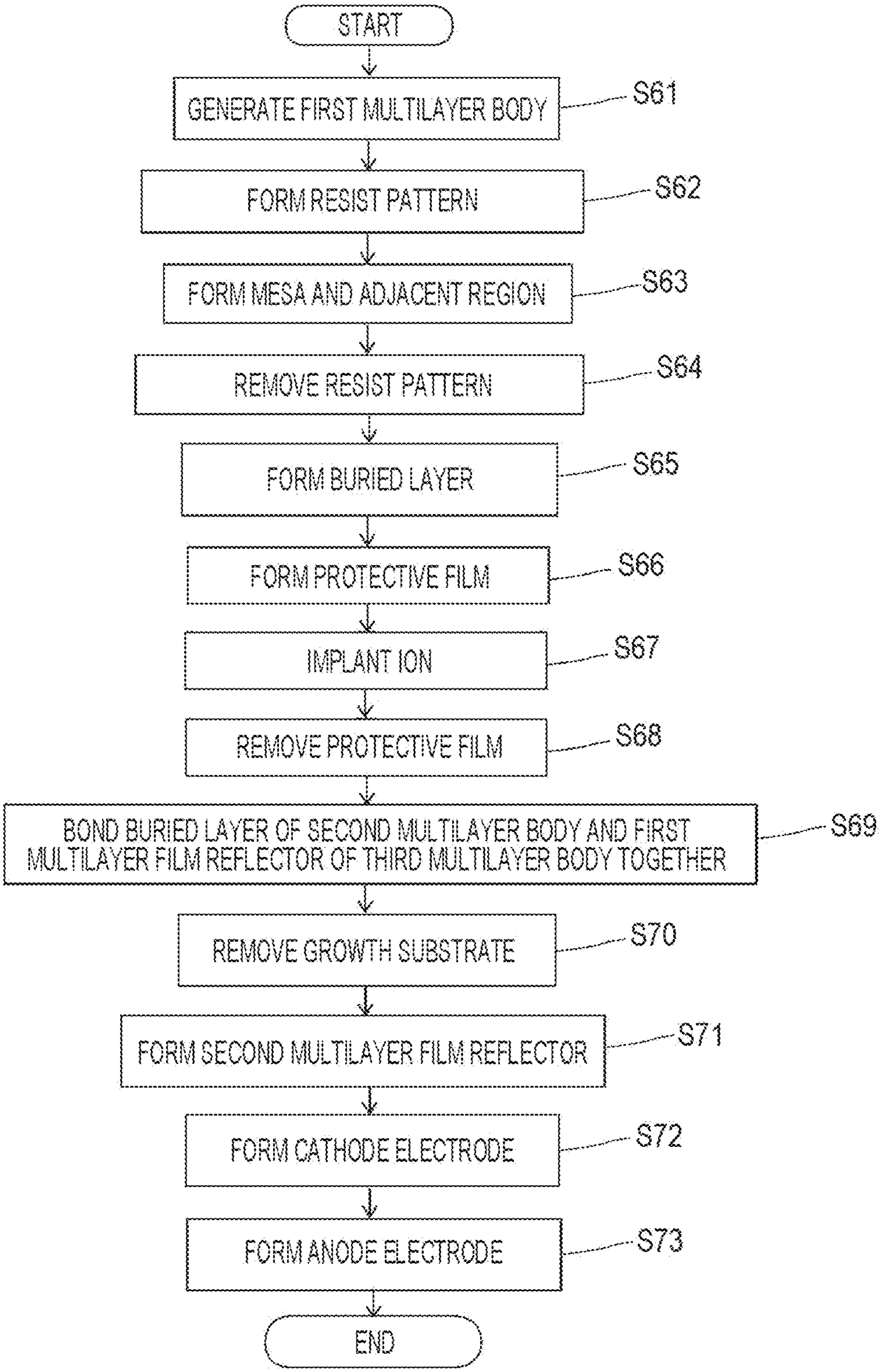
FIG. 41 is a flowchart for describing an example of a method for manufacturing the surface emitting laser in FIG. 40.

As an example, the surface emitting laser 300 is manufactured by the semiconductor manufacturing device by following the procedure of the flowchart in FIG. 41.

In the first step S61, the first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region 106*b* of the tunnel junction layer 106 are layered (epitaxially grown) in this order on the growth substrate 101 (for example, an InP substrate) in a growth chamber by metal organic chemical vapor deposition (MOCVD) or molecular beam epitaxy (MBE).

Figure 42:
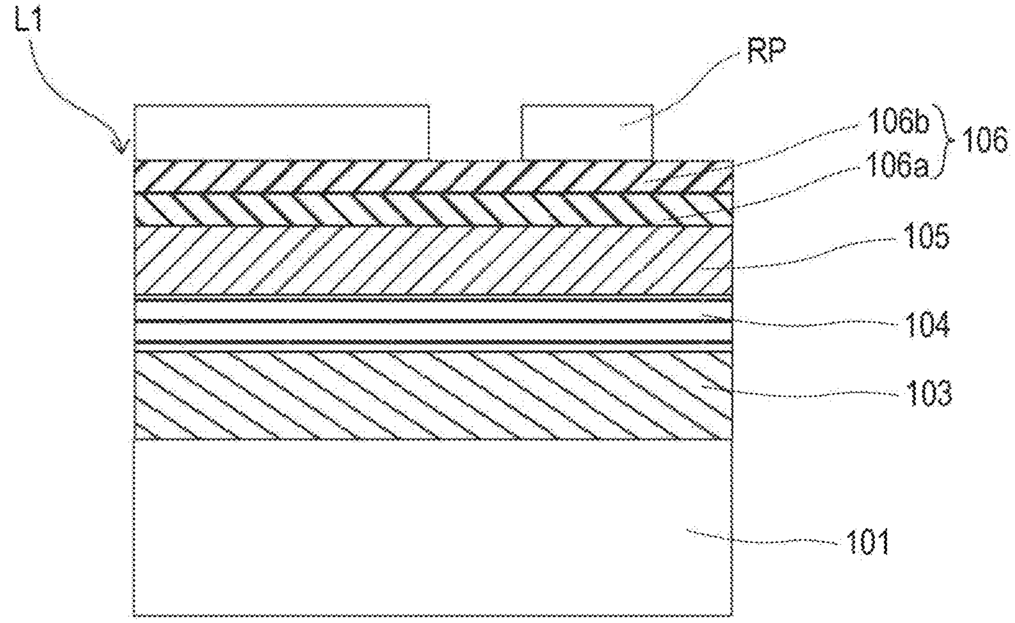
FIG. 42 is a cross-sectional view illustrating a second process in FIG. 41.

In the next step S62, the resist pattern RP is formed (see FIG. 42). Specifically, on the tunnel junction layer 106 of the first multilayer body L1, the resist pattern RP is formed, the resist pattern RP having an opening at a position corresponding to a position other than a position where at least one mesa M and at least one adjacent region AA having an interval between the mesa M and the adjacent region AA adjacent to each other of less than or equal to 30 μm are to be formed.

Figure 43:
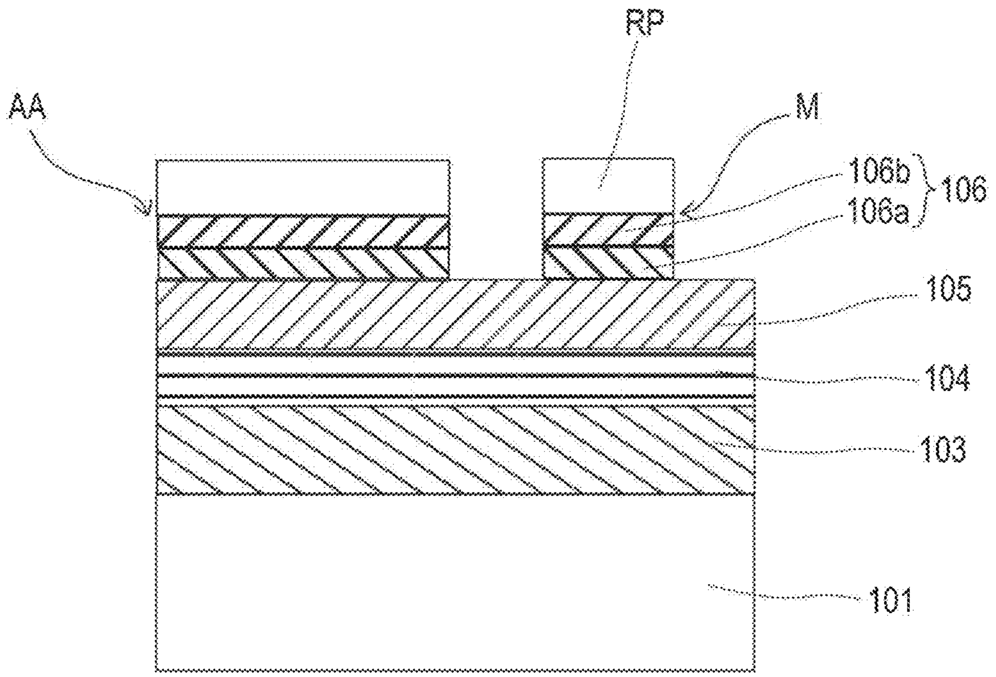
FIG. 43 is a cross-sectional view illustrating a third process in FIG. 41.

In the next step S63, the mesa M and the adjacent region AA are formed (see FIG. 43). Specifically, the tunnel junction layer 106 is etched by wet etching or dry etching using the resist pattern RP as a mask to form the mesa M and the adjacent region AA. An etching depth at this time is, for example, up to the surface of the first cladding layer 105. As a result, at least one mesa M and at least one adjacent region AA having the interval between the mesa M and the adjacent region AA adjacent to each other of less than or equal to 30 μm are formed.

Figure 44:
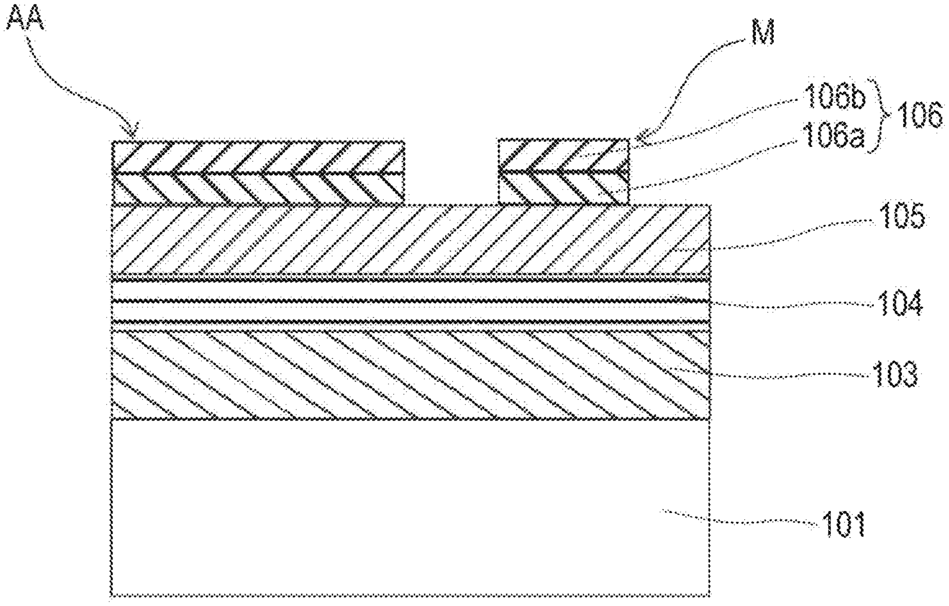
FIG. 44 is a cross-sectional view illustrating a fourth process in FIG. 41.

In the next step S64, the resist pattern RP is removed (see FIG. 44).

Figure 45:
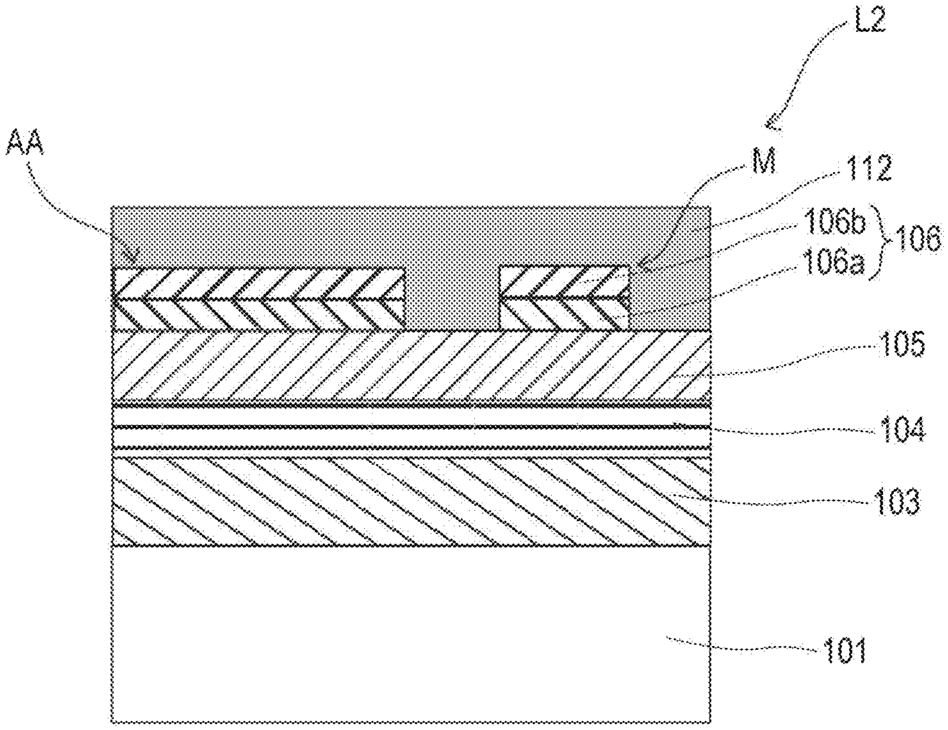
FIG. 45 is a cross-sectional view illustrating a fifth process in FIG. 41.

In the next step S65, the buried layer 112 is formed (see FIG. 45). Specifically, for example, an n-InP film is grown on the tunnel junction layer 106 (specifically, on the mesa M, on the adjacent region AA, and on the peripheral region of the mesa M of the first cladding layer 105) at a growth temperature of 580° C., for example, with a film thickness of 2 μm. At this time, since the interval between the light-emitting position setting mesa M and the adjacent region AA adjacent to each other is less than or equal to 30 μm, a gap between the mesa M and the adjacent region AA is almost completely buried with In atoms to planarize the buried layer 112. The second multilayer body L2 replacing the first multilayer body L1 is generated by forming the buried layer 112.

Figure 46:
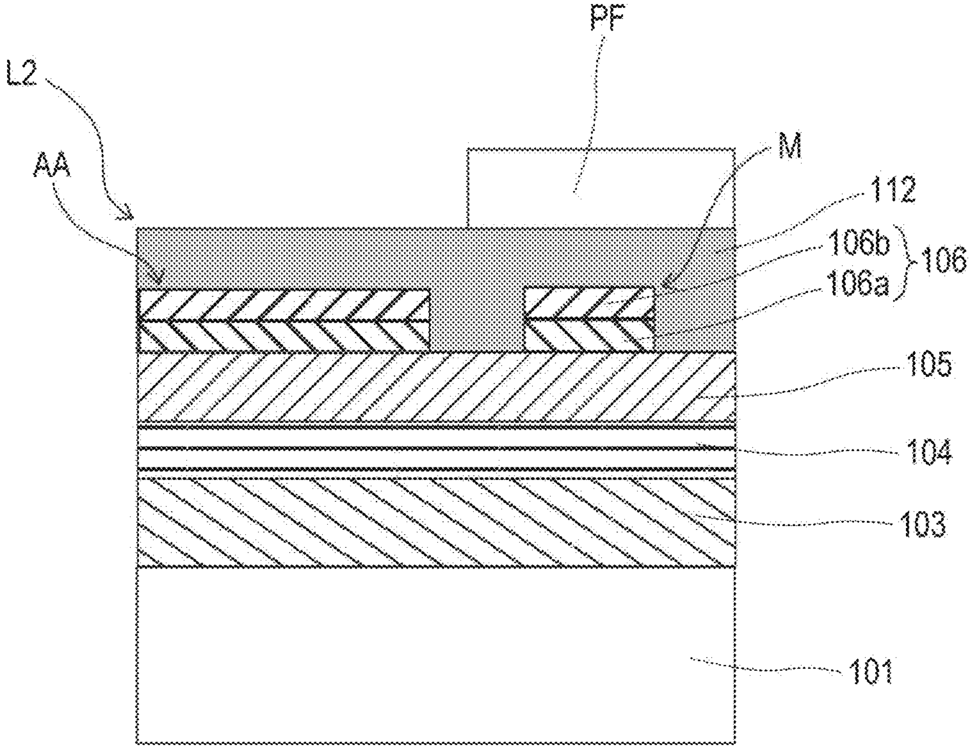
FIG. 46 is a cross-sectional view illustrating a sixth process in FIG. 41.

In the next step S66, the protective film PF is formed (see FIG. 46). Specifically, on the buried layer 112 of the second multilayer body L2, the protective film PF is formed, the protective film PF including a resist, an oxide (for example, $SiO_2$), or the like and having an opening at a position corresponding to the adjacent region AA of the tunnel junction layer 106.

Figure 47:
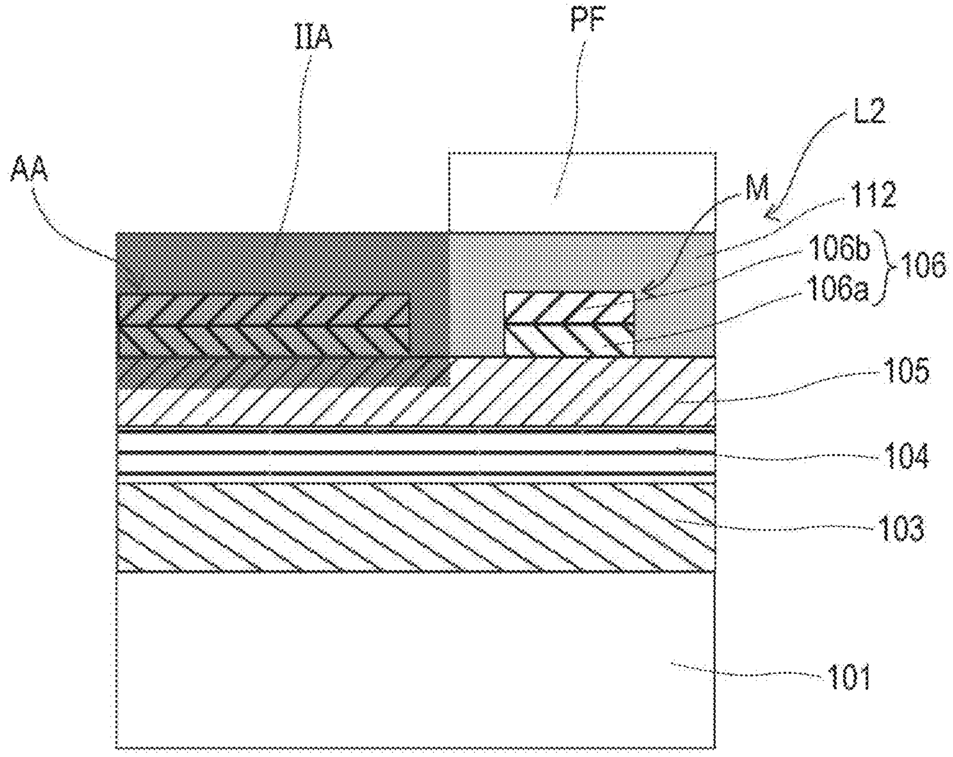
FIG. 47 is a cross-sectional view illustrating a seventh process in FIG. 41.

In the next step S67, ions are implanted (see FIG. 47). Specifically, ions such as protons (II+) are implanted into the buried layer 112 and the tunnel junction layer 106 from the opening of the protective film PF. At this time, ion implantation energy is set so as to allow the ions to spread at least all over a region in the thickness direction of the tunnel junction layer 106, for example. As a result, the adjacent region AA included in the region into which the ions have been implanted (ion implantation region IIA) becomes higher in resistance.

Figure 48:
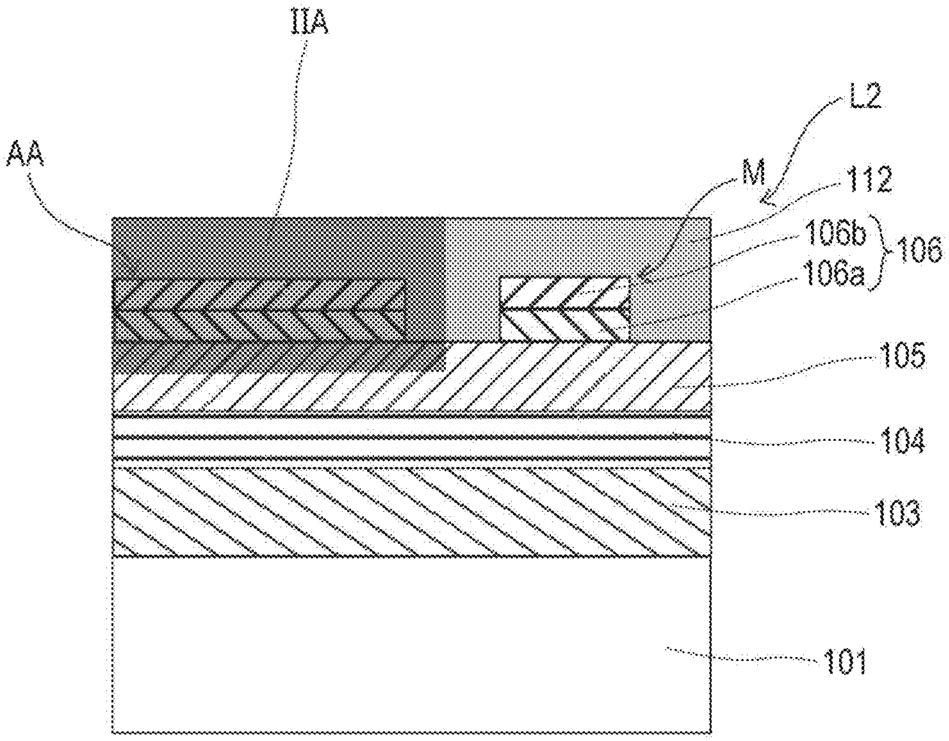
FIG. 48 is a cross-sectional view illustrating an eighth process in FIG. 41.

In the next step S68, the protective film PF is removed (see FIG. 48).

Figure 49:
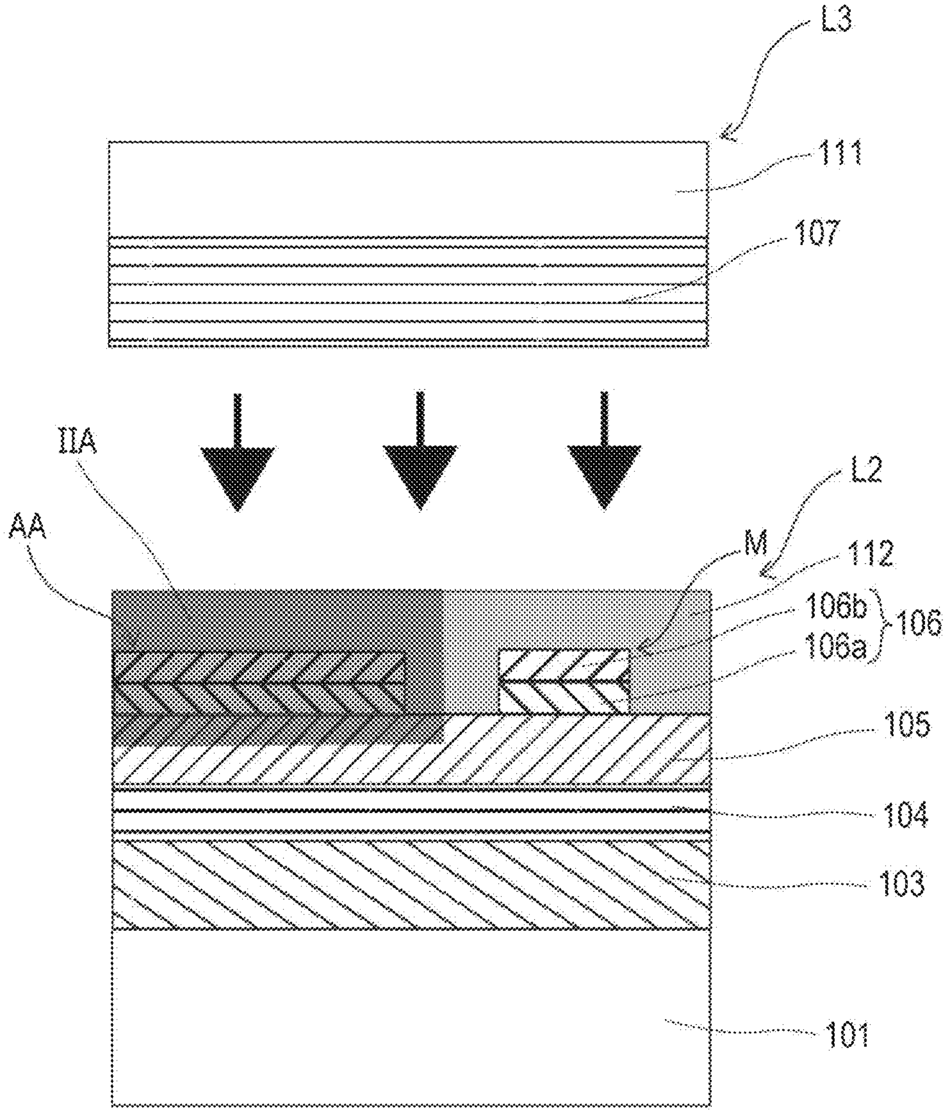
FIG. 49 is a cross-sectional view illustrating a ninth process (before bonding) in FIG. 41.
Figure 50:
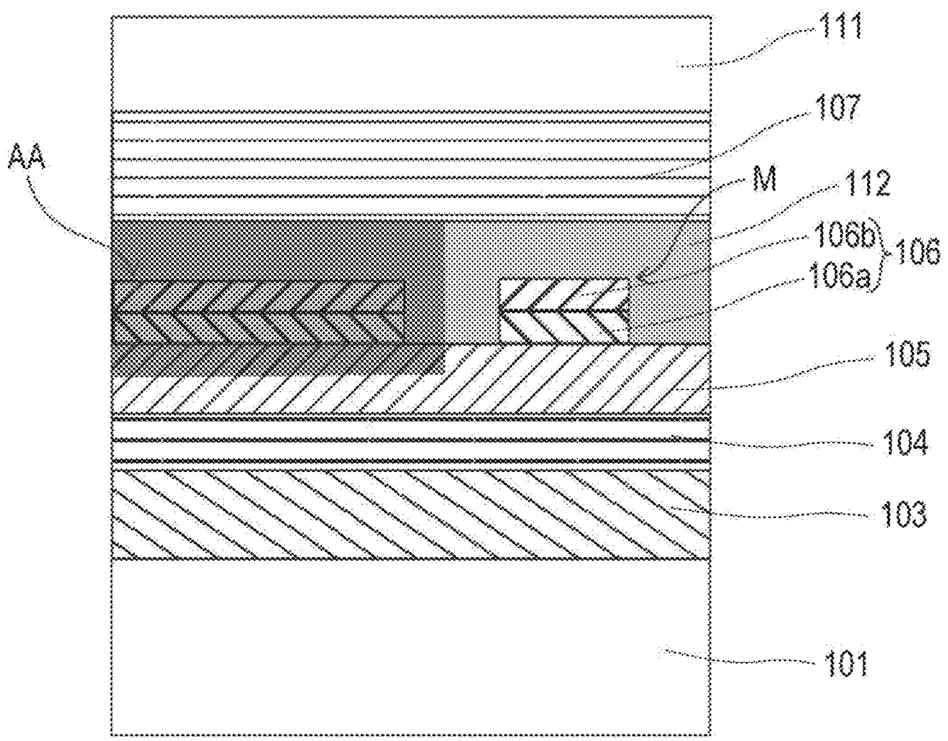
FIG. 50 is a cross-sectional view illustrating the ninth process (after bonding) in FIG. 41.

In the next step S69, the buried layer 112 of the second multilayer body L2 and the first multilayer film reflector 107 of the third multilayer body L3 are bonded together (see FIGS. 49 and 50). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector as the first multilayer film reflector 107 are alternately layered on the substrate 111 to generate the third multilayer body L3.

Figure 51:
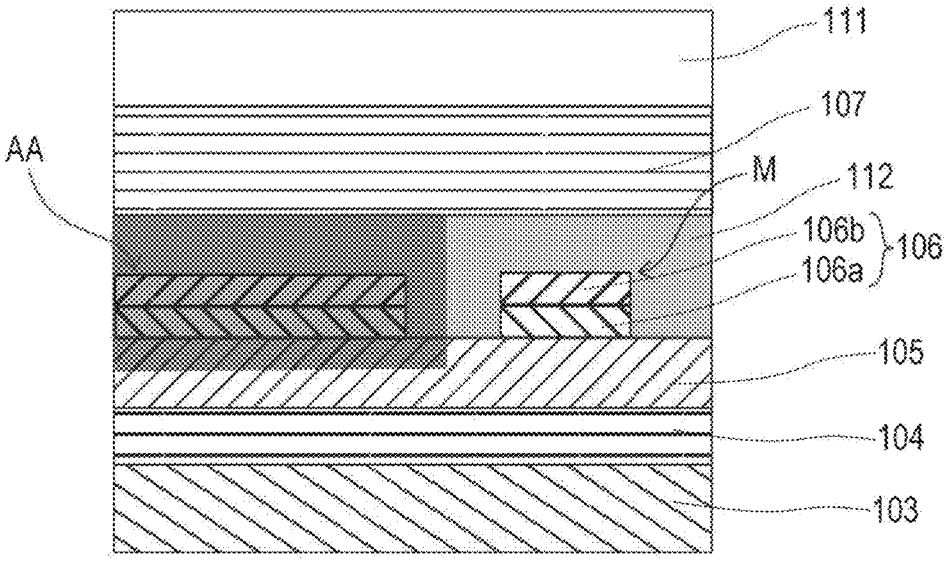
FIG. 51 is a cross-sectional view illustrating a tenth process in FIG. 41.

In the next step S70, the growth substrate 101 is removed (see FIG. 51). Specifically, after the back surface of the growth substrate 101 (see FIG. 50) is ground, a remaining portion is selectively removed by wet etching. As a result of removing the growth substrate 101, the second cladding layer 103 is exposed.

Figure 52:
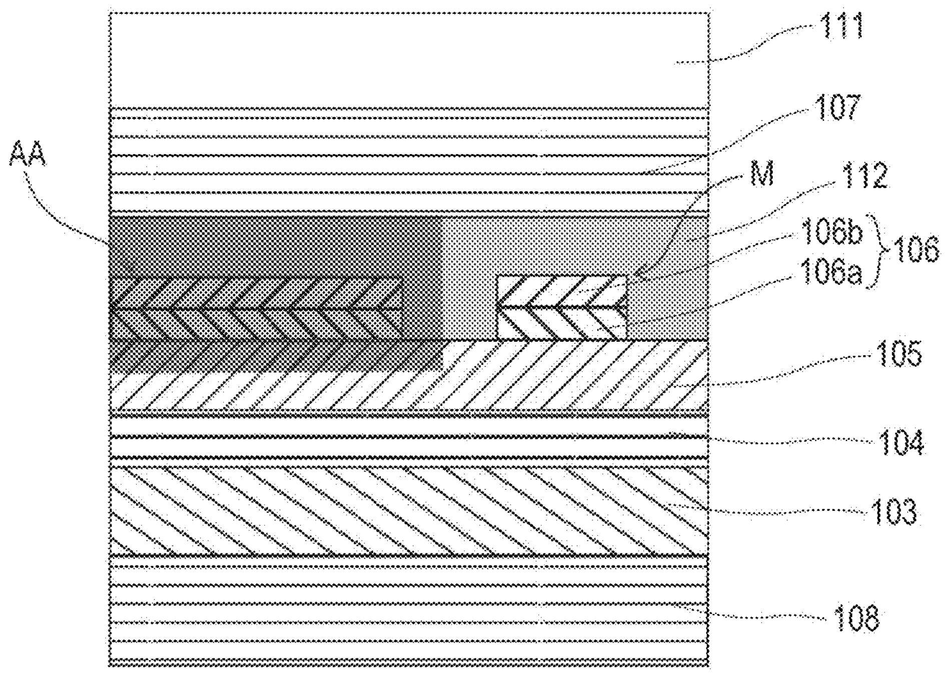
FIG. 52 is a cross-sectional view illustrating an eleventh process (after deposition) in FIG. 41.
Figure 53:
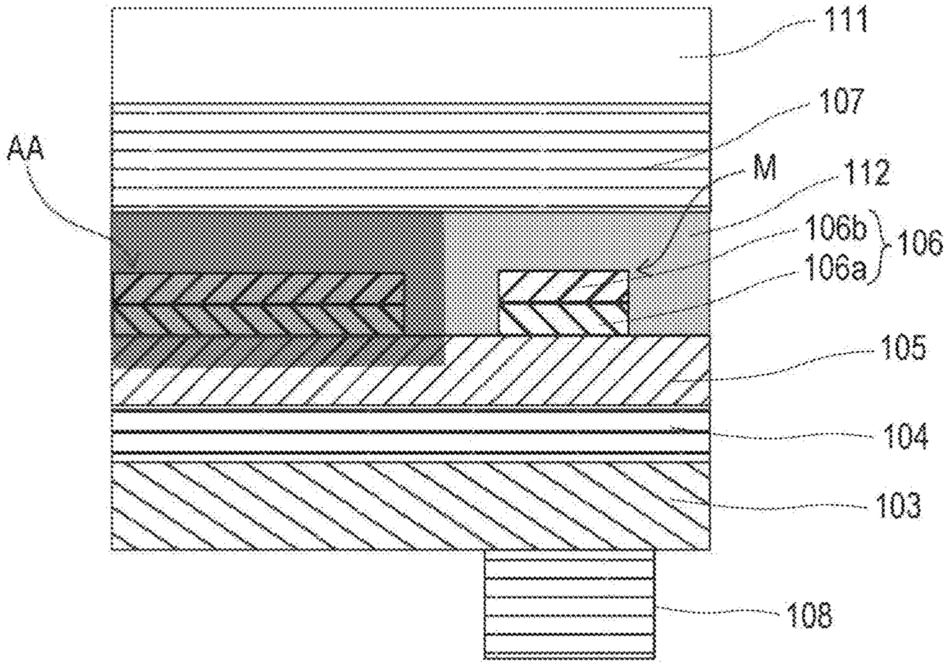
FIG. 53 is a cross-sectional view illustrating the eleventh process (after etching) in FIG. 41.

In the next step S71, the second multilayer film reflector 108 is formed (see FIGS. 52 and 53). Specifically, first, a high refractive index layer and a low refractive index layer constituting the dielectric multilayer film reflector as the second multilayer film reflector 108 are alternately deposited on the back surface (lower surface) of the second cladding layer 103 (see FIG. 52). Next, the dielectric multilayer film reflector is etched to leave only a portion corresponding to the light-emitting position setting mesa M (see FIG. 53).

Figure 54:
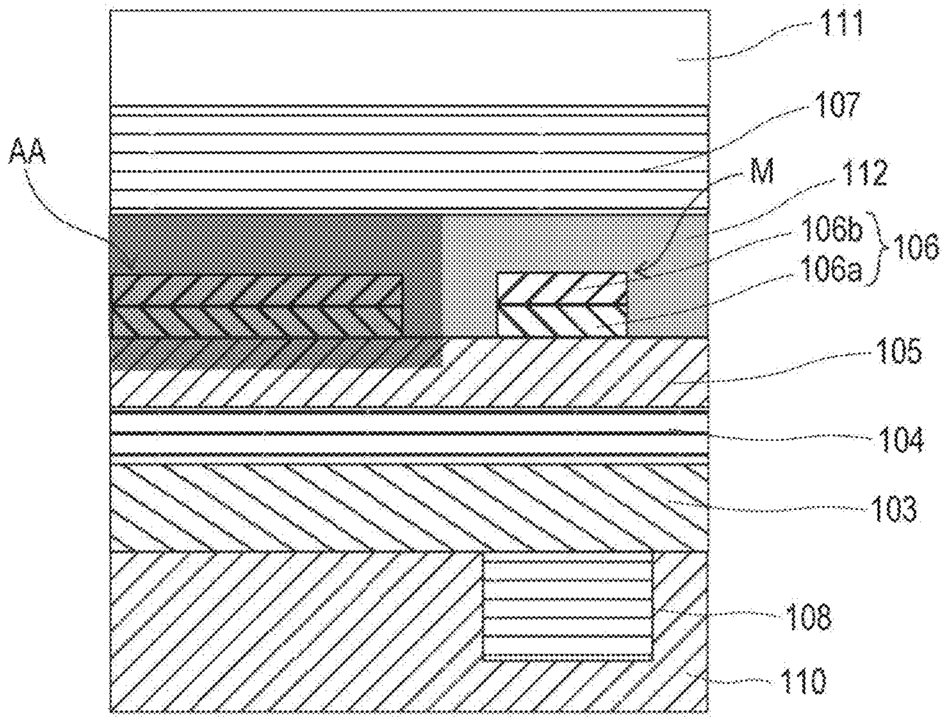
FIG. 54 is a cross-sectional view illustrating a twelfth process in FIG. 41.

In the next step S72, the cathode electrode 110 is formed (see FIG. 54). Specifically, for example, an electrode material constituting the cathode electrode 110 is formed by a lift-off method so as to cover at least the second multilayer film reflector 108 corresponding to the light-emitting position setting mesa M.

Figure 55:
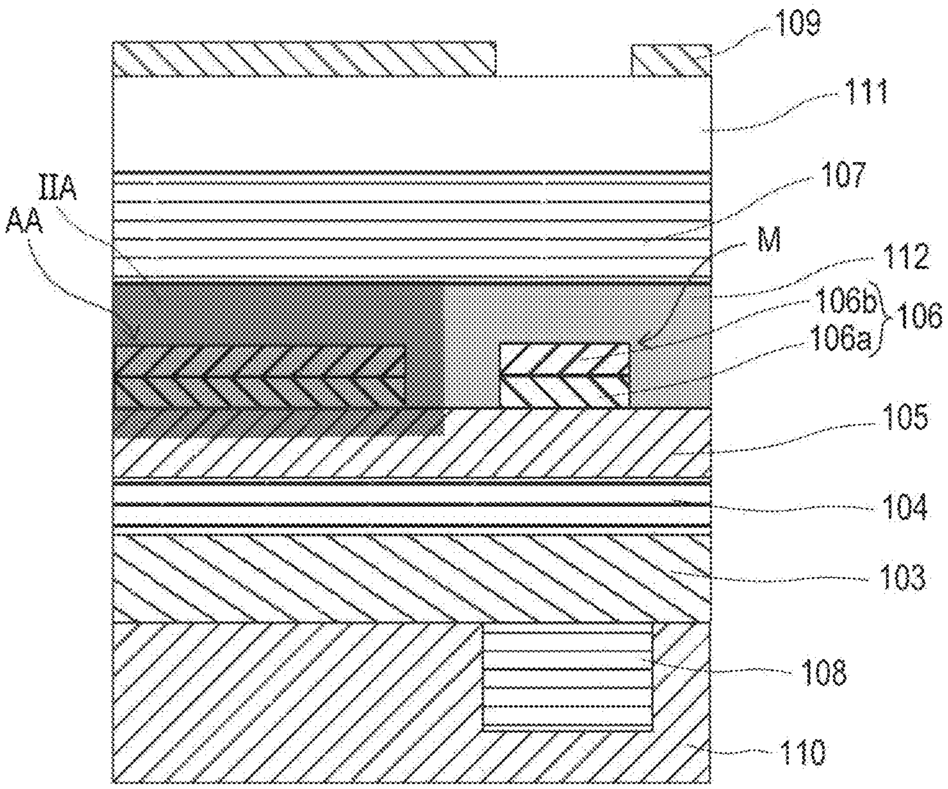
FIG. 55 is a cross-sectional view illustrating a thirteenth process in FIG. 41.

In the last step S73, the anode electrode 109 is formed (see FIG. 55). Specifically, for example, an electrode material constituting the anode electrode 109 is formed on the substrate 111 by a lift-off method so as to generate an opening serving as an emission port at a position corresponding to the light-emitting position setting mesa M.

The method for manufacturing the surface emitting laser 300 described above includes: a process of generating the first multilayer body L1 (multilayer body) by layering the active layer 104 and the tunnel junction layer 106 in this order on the growth substrate 101 (first substrate); a process of forming the mesa M and the adjacent region AA adjacent to the mesa M such that the interval between the mesa M and the adjacent region AA is less than or equal to 30 μm by etching the tunnel junction layer 106 of the first multilayer body L1; and a process of generating the second multilayer body L2 (another multilayer body) replacing the first multilayer body L1 by layering the buried layer 112 that buries the periphery of the mesa M and the periphery of the adjacent region AA on the tunnel junction layer 106.

The method for manufacturing the surface emitting laser 300 further includes a process of making the adjacent region AA higher in resistance by implanting ions into the second multilayer body L2 from the buried layer 112.

Note that, in the method for manufacturing the surface emitting laser 300, ions may be implanted into the first multilayer body L1 from the tunnel junction layer 106 to make the adjacent region AA or a portion where the adjacent region AA is to be formed higher in resistance.

6. Surface Emitting Laser According to Fourth Embodiment of Present Technology Hereinafter, a surface emitting laser 400 according to a fourth embodiment of the present technology will be described.

Figure 56:
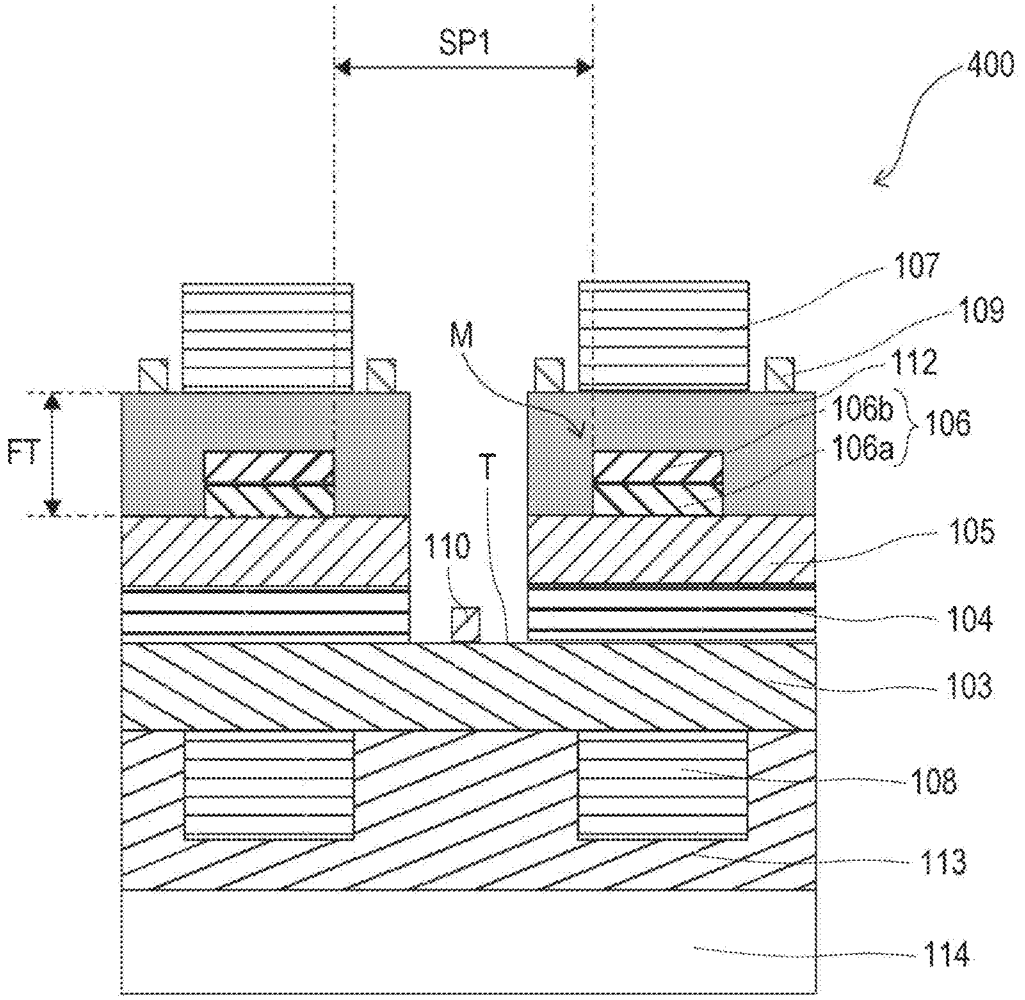
FIG. 56 is a cross-sectional view of at least a part of a surface emitting laser according to a fourth embodiment of the present technology.

FIG. 56 is a cross-sectional view of at least a part of the surface emitting laser 400 of the fourth embodiment.

As illustrated in FIG. 56, the surface emitting laser 400 of the fourth embodiment of the present technology has a configuration similar to the configuration of the surface emitting laser 100 of the first embodiment except that the surface emitting laser 400 has an intracavity structure.

More specifically, in the surface emitting laser 400, a trench T (groove) is formed between two mesas M adjacent to each other. The cathode electrode 110 shared by each mesa M is provided on the bottom surface of the trench T. The bottom surface of the trench T is, for example, the upper surface of the second cladding layer 103.

Furthermore, in the surface emitting laser 400, the first multilayer film reflector 107 and the anode electrode 109 having a loop shape (for example, annular shape) surrounding the first multilayer film reflector 107 are provided on the upper surface of the buried layer 112 provided around each mesa M.

Furthermore, in the surface emitting laser 400, a metal layer 113 constituting a reflector together with the second multilayer film reflector 108 (for example, a dielectric multilayer film reflector) corresponding to each mesa M is provided so as to cover each second multilayer film reflector 108 together. A support substrate 114 is provided on the back surface (lower surface) of the metal layer 113. The metal layer 113 includes, for example, Au, Ag, Cu, or the like. The support substrate 114 is, for example, a semiconductor substrate, a semi-insulating substrate, an insulating substrate, or the like.

Hereinafter, a method for manufacturing the surface emitting laser 400 will be described with reference to the flowchart (steps S81 to S95) in FIG. 57. Here, as an example, a plurality of the surface emitting lasers 400 is generated at a time using one wafer as a base material of the support substrate 114 by a semiconductor manufacturing method using a semiconductor manufacturing device. Next, the plurality of surface emitting lasers 400 integrated in series is separated from each other to obtain a plurality of chip-shaped surface emitting lasers 400 (surface emitting laser chips).

Figure 57:
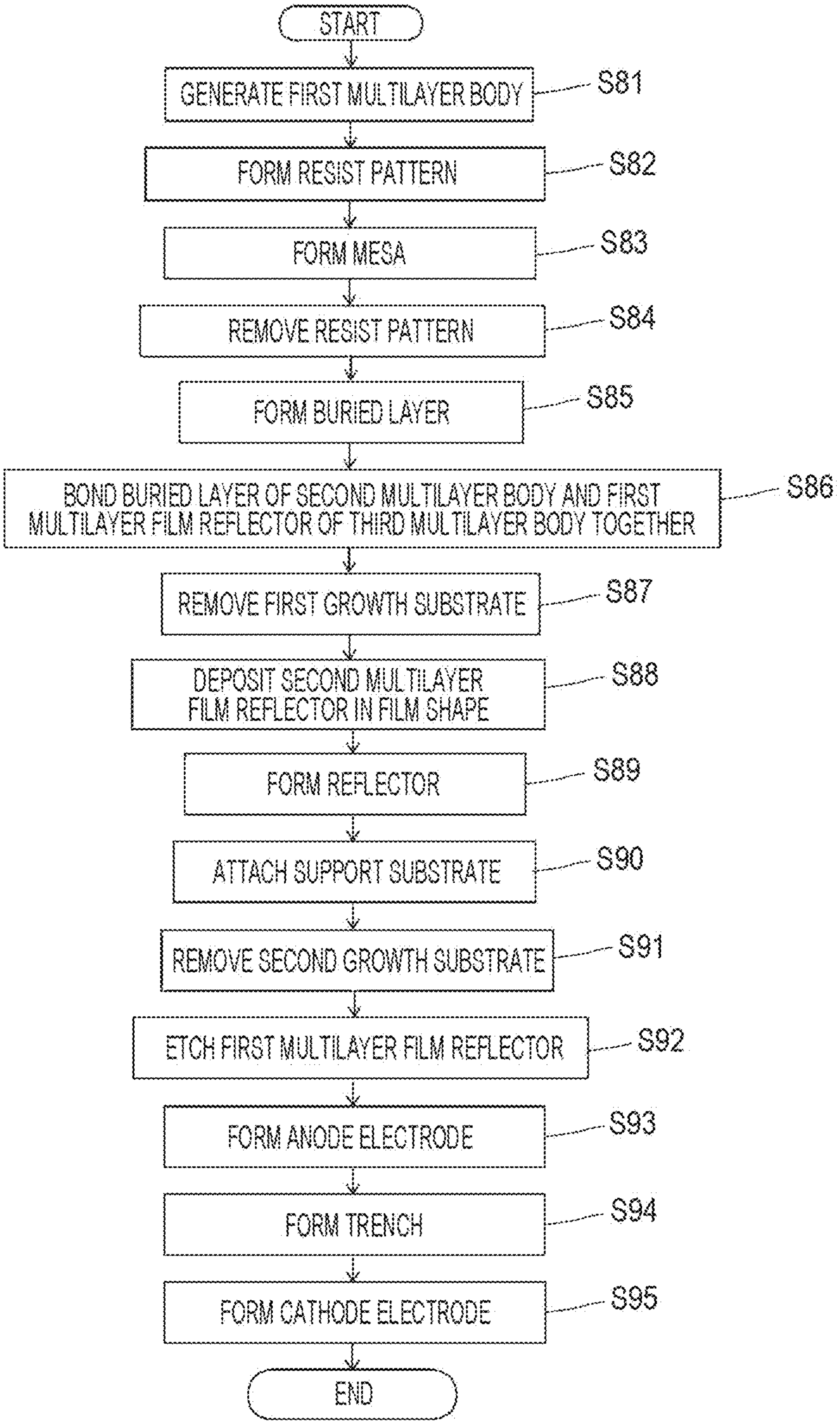
FIG. 57 is a flowchart for describing an example of a method for manufacturing the surface emitting laser in FIG. 56.

As an example, the surface emitting laser 400 is manufactured by the semiconductor manufacturing device by following the procedure of the flowchart in FIG. 57.

In the first step S81, the first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region 106*b* of the tunnel junction layer 106 are layered in this order on the growth substrate 101 (for example, an InP substrate, hereinafter also referred to as a "first growth substrate 101") in a growth chamber by metal organic chemical vapor deposition (MOCVD) or molecular beam epitaxy (MBE).

In the next step S82, the resist pattern RP is formed (see FIG. 9). Specifically, on the tunnel junction layer 106 of the first multilayer body L1, the resist pattern RP is formed, the resist pattern RP having an opening at a position corresponding to a position other than a position where a plurality of the mesas M having an interval between two mesas M adjacent to each other of less than or equal to 30 μm is to be formed.

In the next step S83, the mesa M is formed (see FIG. 10). Specifically, the tunnel junction layer 106 is etched by wet etching or dry etching using the resist pattern RP as a mask to form the mesa M. An etching depth at this time is, for example, up to the surface of the first cladding layer 105. As a result, the plurality of mesas M having the interval between two mesas M adjacent to each other of less than or equal to 30 μm is formed.

In the next step S84, the resist pattern RP is removed (see FIG. 11).

In the next step S85, the buried layer 112 is formed (see FIG. 12). Specifically, for example, an n-InP film is grown on the tunnel junction layer 106 (specifically, on the mesa M and on the peripheral region of the mesa of the first cladding layer 105) at a growth temperature of 580° C., for example, with a film thickness of 2 μm. At this time, since the interval between two mesas M adjacent to each other is 30 μm or less, a gap between the two mesas M adjacent to each other is almost completely buried with In atoms to planarize the buried layer 112. The second multilayer body L2 replacing the first multilayer body L1 is generated by forming the buried layer 112.

In the next step S86, the buried layer 112 of the second multilayer body L2 and the first multilayer film reflector 107 of the third multilayer body L3 are bonded together (see FIGS. 13 and 14). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector as the first multilayer film reflector 107 are alternately layered on the substrate 111 (hereinafter also referred to as a "second growth substrate 111") to generate the third multilayer body L3.

In the next step S87, the first growth substrate 101 is removed (see FIG. 15). Specifically, after the back surface of the first growth substrate 101 (see FIG. 14) is ground, a remaining portion is selectively removed by wet etching. As a result of removing the first growth substrate 101, the second cladding layer 103 is exposed.

In the next step S88, the second multilayer film reflector 108 is deposited (see FIG. 16). Specifically, a high refractive index layer and a low refractive index layer constituting the dielectric multilayer film reflector as the second multilayer film reflector 108 are alternately deposited on the back surface (lower surface) of the second cladding layer 103.

Figure 58:
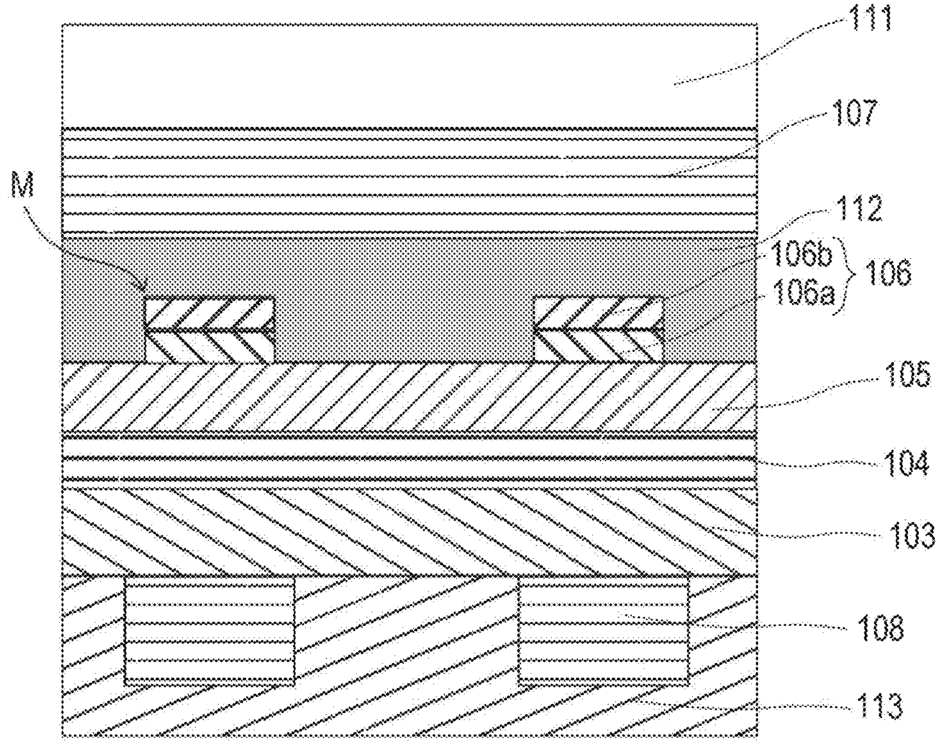
FIG. 58 is a cross-sectional view illustrating a ninth process in FIG. 56.

In the next step S89, a reflector is formed (see FIG. 17, FIG. 58). First, the dielectric multilayer film reflector as the second multilayer film reflector 108 is etched to leave only a portion corresponding to each mesa M (see FIG. 17). Next, a metal material constituting the metal layer 113 is formed by, for example, a plating method or the like so as to cover the second multilayer film reflector 108 corresponding to each mesa M together (see FIG. 58).

Figure 59:
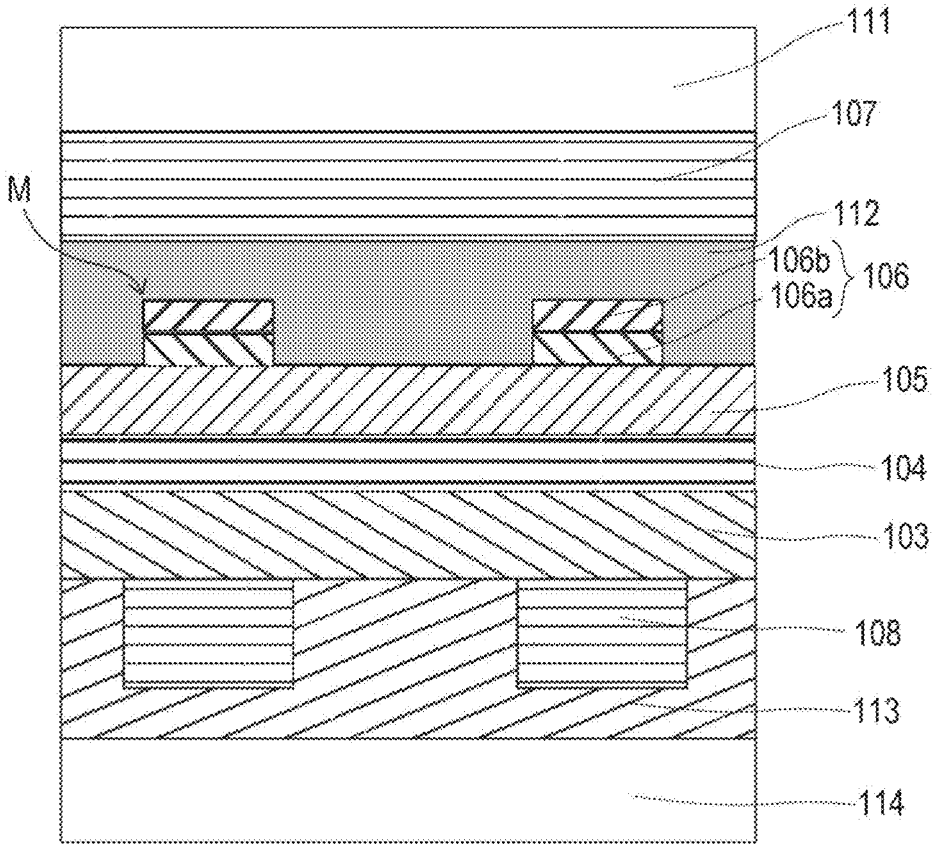
FIG. 59 is a cross-sectional view illustrating a tenth process in FIG. 56.

In the next step S90, the support substrate 114 is attached (see FIG. 59). Specifically, the support substrate 114 is bonded to the back surface (lower surface) of the metal layer 113.

Figure 60:
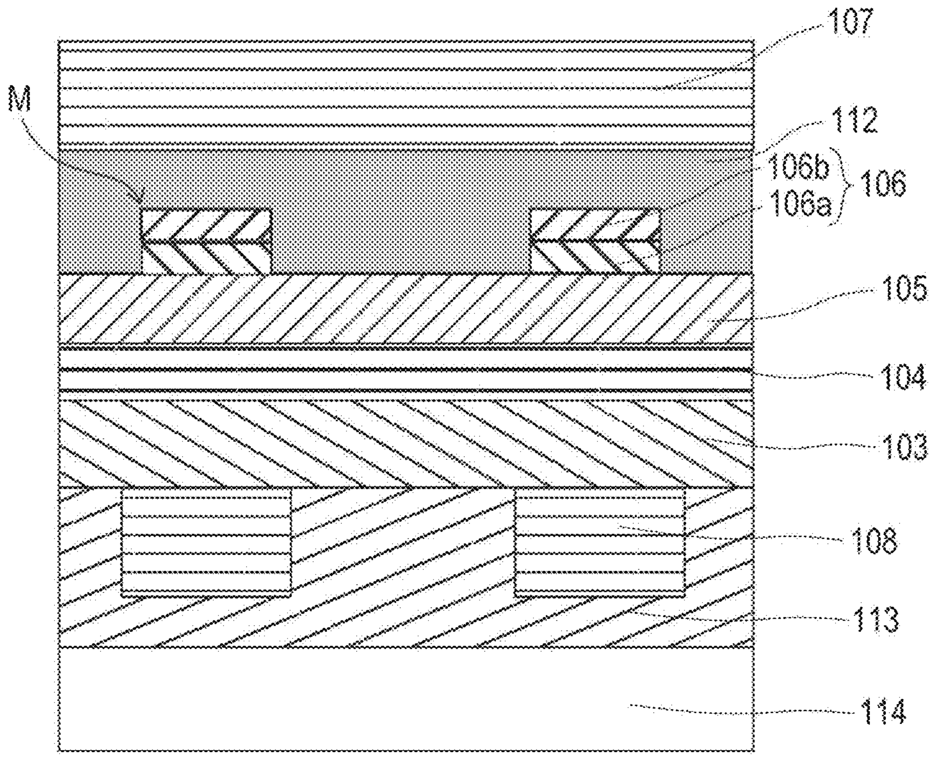
FIG. 60 is a cross-sectional view illustrating an eleventh process in FIG. 56.

In the next step S91, the second growth substrate 111 is removed (see FIG. 60). Specifically, after the front surface (upper surface) of the second growth substrate 111 is ground, a remaining portion is selectively removed by wet etching.

Figure 61:
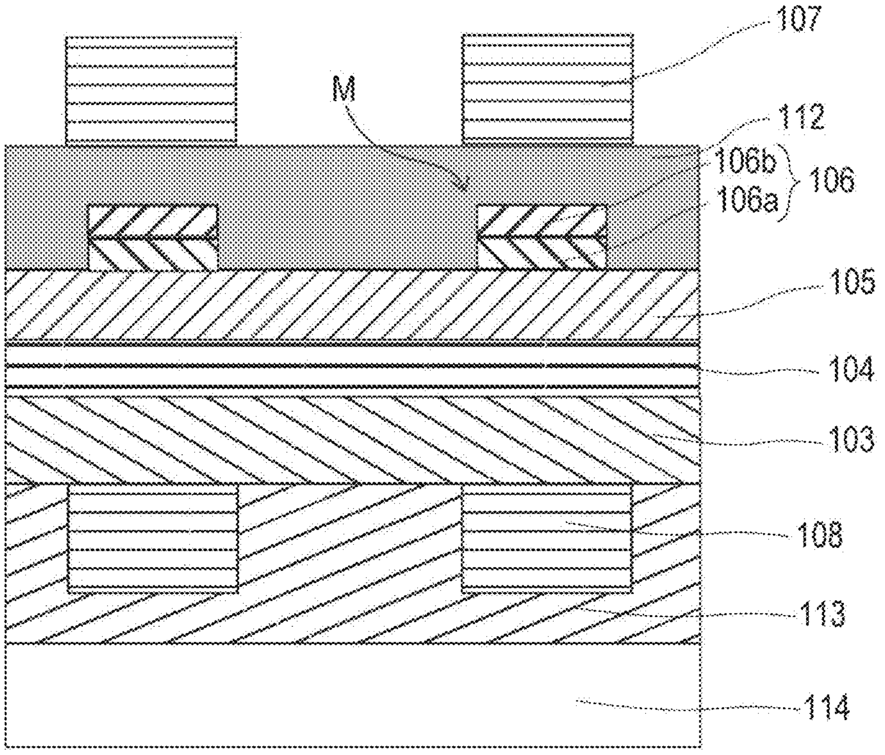
FIG. 61 is a cross-sectional view illustrating a twelfth process in FIG. 56.

In the next step S92, the first multilayer film reflector 107 is etched (see FIG. 61). Specifically, the first multilayer film reflector 107 is dry-etched or wet-etched to leave only a portion corresponding to each mesa M.

Figure 62:
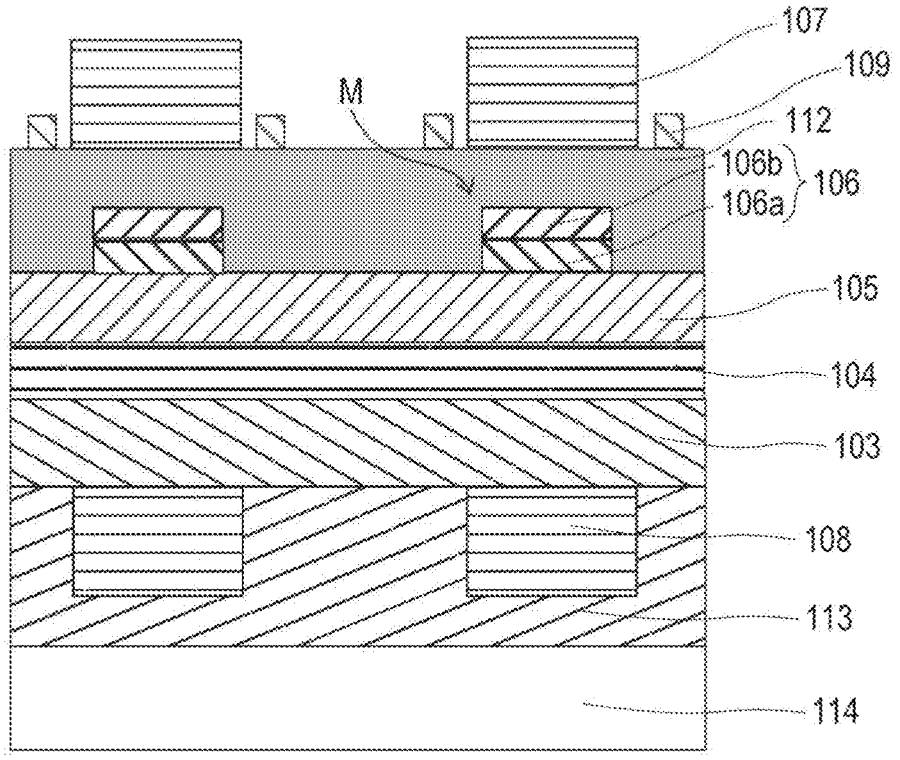
FIG. 62 is a cross-sectional view illustrating a thirteenth process in FIG. 56.

In the next step S93, the anode electrode 109 is formed (see FIG. 62). Specifically, for example, an electrode material constituting the anode electrode 109 is formed, by a lift-off method, on the buried layer 112 in a loop shape (for example, annular shape) so as to surround the first multilayer film reflector 107 corresponding to each mesa M.

Figure 63:
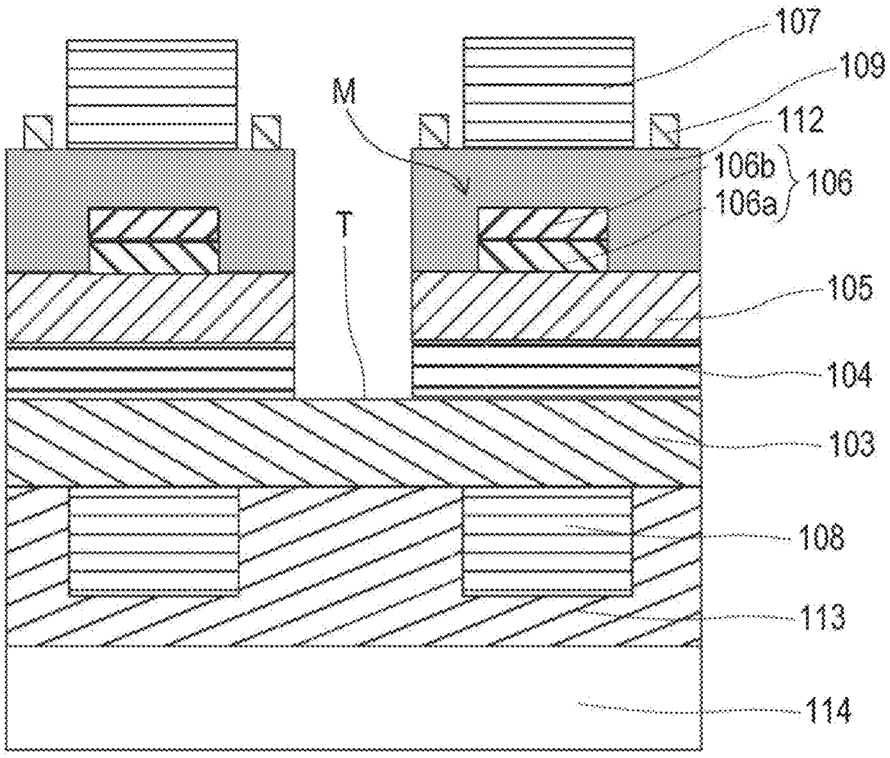
FIG. 63 is a cross-sectional view illustrating a fourteenth process in FIG. 56.

In the next step S94, the trench T is formed (see FIG. 63). Specifically, at least a region between two mesas M adjacent to each other in the buried layer 112, the first cladding layer 105, and the active layer 104 is removed by dry etching or wet etching to form the trench T. An etching depth at this time is, for example, up to the second cladding layer 103.

Figure 64:
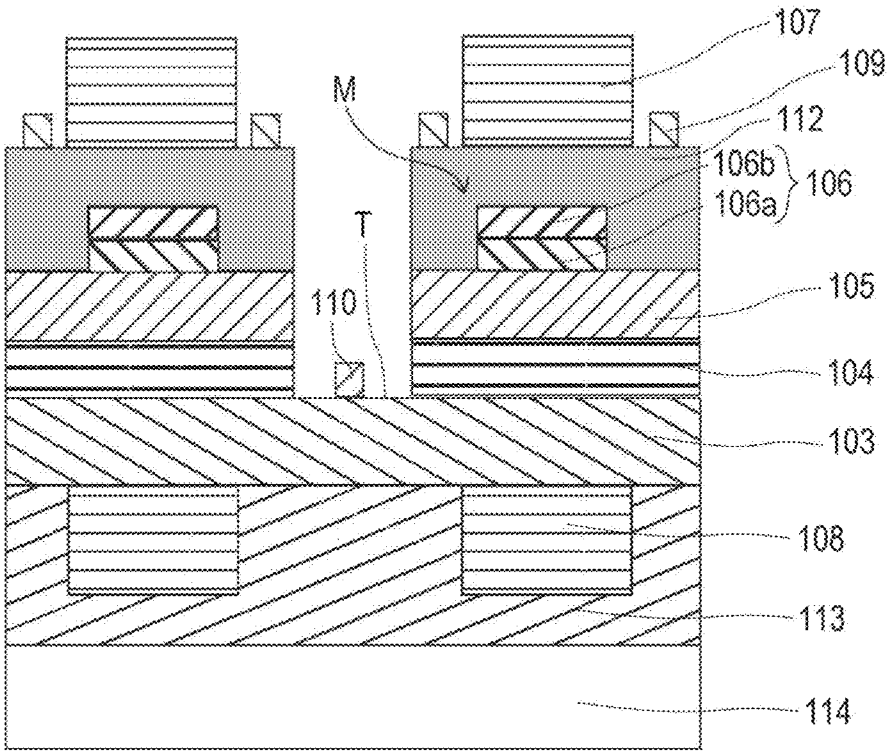
FIG. 64 is a cross-sectional view illustrating a fifteenth process in FIG. 56.

In the last step S95, the cathode electrode 110 is formed (see FIG. 64). Specifically, for example, an electrode material constituting the cathode electrode 110 is formed on the bottom surface of the trench T by a lift-off method.

7. Surface Emitting Laser According to Fifth Embodiment of Present Technology Hereinafter, a surface emitting laser 500 according to a fifth embodiment of the present technology will be described.

Figure 65:
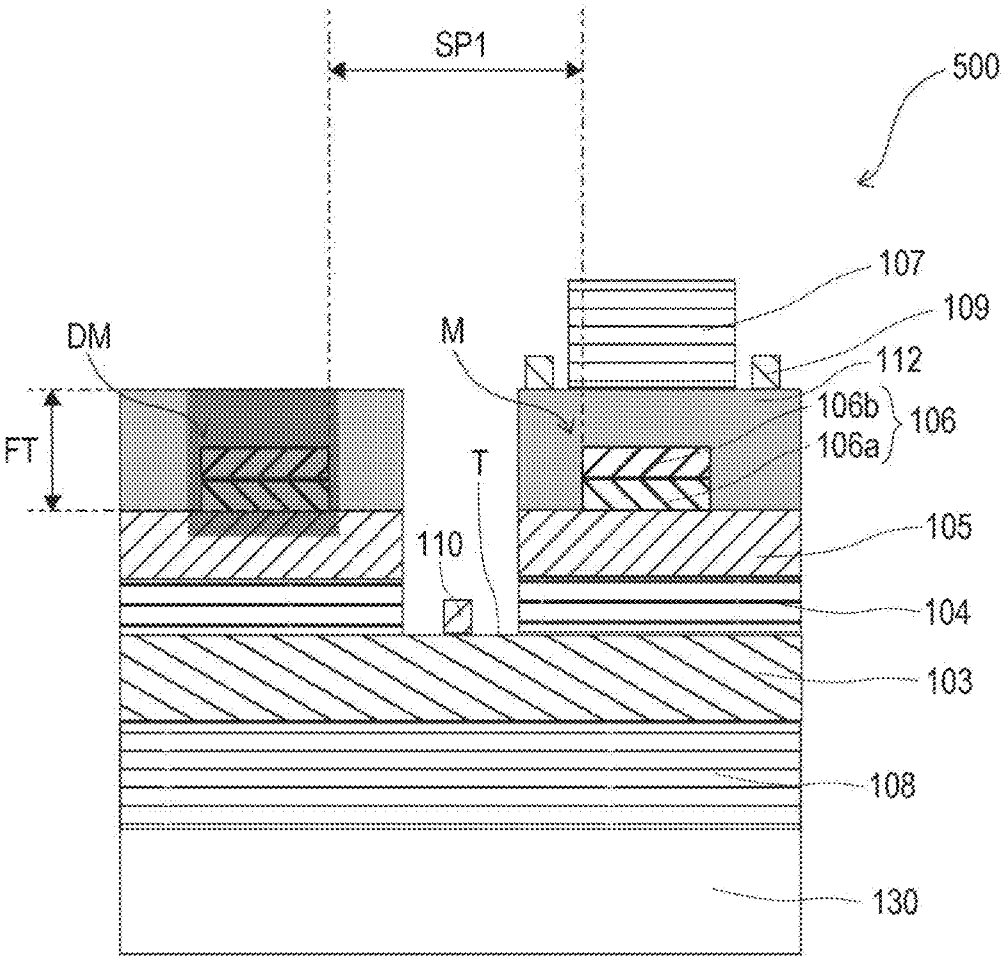
FIG. 65 is a cross-sectional view of at least a part of a surface emitting laser according to a fifth embodiment of the present technology.

FIG. 65 is a cross-sectional view of at least a part of the surface emitting laser 500 of the fifth embodiment.

As illustrated in FIG. 65, the surface emitting laser 500 of the fifth embodiment of the present technology has a configuration similar to the configuration of the surface emitting laser 200 of the second embodiment except that the surface emitting laser 500 has an intracavity structure, and the second structure including the second multilayer film reflector 108 is different.

More specifically, in the surface emitting laser 500, the trench T (groove) is formed between the mesa M and the dummy mesa DM adjacent to each other. The cathode electrode 110 is provided on the bottom surface of the trench T. The bottom surface of the trench T is, for example, the upper surface of the second cladding layer 103.

In the second structure of the surface emitting laser 500, the semiconductor multilayer film reflector (for example, an AlGaAs-based DBR) as the second multilayer film reflector 108 is uniformly provided on the back surface (lower surface) of the first cladding layer 103, and the substrate 130 (for example, a GaAs substrate) is provided on the back surface (lower surface) of the second multilayer film reflector 108.

In the surface emitting laser 500, the first multilayer film reflector 107 and the anode electrode 109 having a loop shape (for example, an annular shape) surrounding the first multilayer film reflector 107 are provided on the upper surface of the buried layer 112 provided around the mesa M (light-emitting position determining mesa M).

Hereinafter, a method for manufacturing the surface emitting laser 500 will be described with reference to the flowchart (steps S101 to S116) in FIG. 66. Here, as an example, a plurality of the surface emitting lasers 500 is generated at a time using one wafer as a base material of the substrate 130 by a semiconductor manufacturing method using a semiconductor manufacturing device. Next, the plurality of surface emitting lasers 500 integrated in series is separated from each other to obtain a plurality of chip-shaped surface emitting lasers 500 (surface emitting laser chips).

Figure 66:
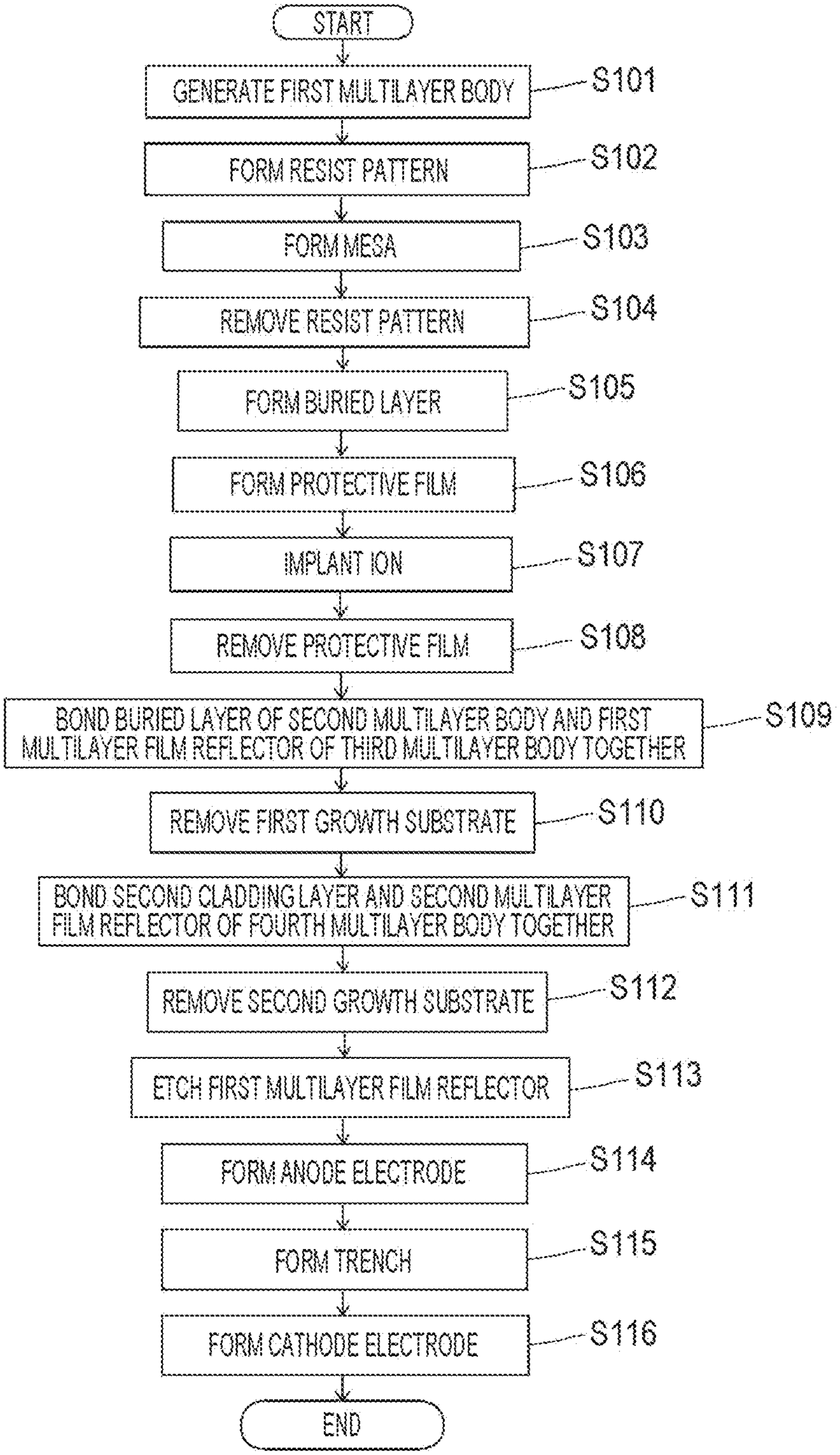
FIG. 66 is a flowchart for describing an example of a method for manufacturing the surface emitting laser in FIG. 65.

As an example, the surface emitting laser 500 is manufactured by the semiconductor manufacturing device by following the procedure of the flowchart in FIG. 66.

In the first step S101, the first multilayer body L1 is generated (see FIG. 8). Specifically, as an example, the second cladding layer 103, the active layer 104, the first cladding layer 105, the p-type semiconductor region 106*a* of the tunnel junction layer 106, and the n-type semiconductor region 106*b* of the tunnel junction layer 106 are layered (epitaxially grown) in this order on the growth substrate 101 (for example, an InP substrate, hereinafter also referred to as a "first growth substrate 101") in a growth chamber by metal organic chemical vapor deposition (MOCVD) or molecular beam epitaxy (MBE).

In the next step S102, the resist pattern RP is formed (see FIG. 9). Specifically, on the tunnel junction layer 106 of the first multilayer body L1, the resist pattern RP is formed, the resist pattern RP having an opening at a position corresponding to a position other than a position where a plurality of mesas having an interval between two mesas M adjacent to each other of less than or equal to 30 μm is to be formed.

In the next step S103, the mesa is formed (see FIG. 10). Specifically, the tunnel junction layer 106 is etched by wet etching or dry etching using the resist pattern RP as a mask to form the mesa. An etching depth at this time is, for example, up to the surface of the first cladding layer 105. As a result, the plurality of mesas having the interval between two mesas M adjacent to each other of less than or equal to 30 μm is formed.

In the next step S104, the resist pattern RP is removed (see FIG. 11).

In the next step S105, the buried layer 112 is formed (see FIG. 12). Specifically, for example, an n-InP film is grown on the tunnel junction layer 106 (specifically, on the mesa and on the peripheral region of the mesa of the first cladding layer 105) at a growth temperature of 580° C., for example, with a film thickness of 2 μm. At this time, since the interval between two mesas adjacent to each other is 30 μm or less, a gap between the two mesas adjacent to each other is almost completely buried with In atoms to planarize the buried layer 112. The second multilayer body L2 replacing the first multilayer body L1 is generated by forming the buried layer 112.

In the next step S106, the protective film PF is formed (see FIG. 30). Specifically, on the buried layer 112 of the second multilayer body L2, the protective film PF is formed, the protective film PF including a resist, an oxide (for example, $SiO_2$), or the like and having an opening at a position corresponding to a region where the dummy mesa DM of the tunnel junction layer 106 is to be formed.

In the next step S107, ions are implanted (see FIG. 31). Specifically, ions such as protons (II+) are implanted into the buried layer 112 and the tunnel junction layer 106 from the opening of the protective film PF. At this time, ion implantation energy is set so as to allow the ions to spread at least all over a region in the thickness direction of the tunnel junction layer 106, for example. As a result, the mesa in the region into which the ions are implanted (ion implantation region IIA) becomes the dummy mesa DM.

In the next step S108, the protective film PF is removed (see FIG. 32).

In the next step S109, the buried layer 112 of the second multilayer body L2 and the first multilayer film reflector 107 of the third multilayer body L3 are bonded together (see FIGS. 33 and 34). Specifically, the first multilayer film reflector 107 of the third multilayer body L3 is attached to the buried layer 112 of the second multilayer body L2. Note that a high refractive index layer and a low refractive index layer constituting the semiconductor multilayer film reflector as the first multilayer film reflector 107 are alternately layered on the substrate 111 (hereinafter also referred to as a "second growth substrate 111") to generate the third multilayer body L3.

In the next step S110, the first growth substrate 101 is removed (see FIG. 35). Specifically, after the back surface of the first growth substrate 101 (see FIG. 14) is ground, a remaining portion is selectively removed by wet etching. As a result of removing the first growth substrate 101, the second cladding layer 103 is exposed.

Figure 67:
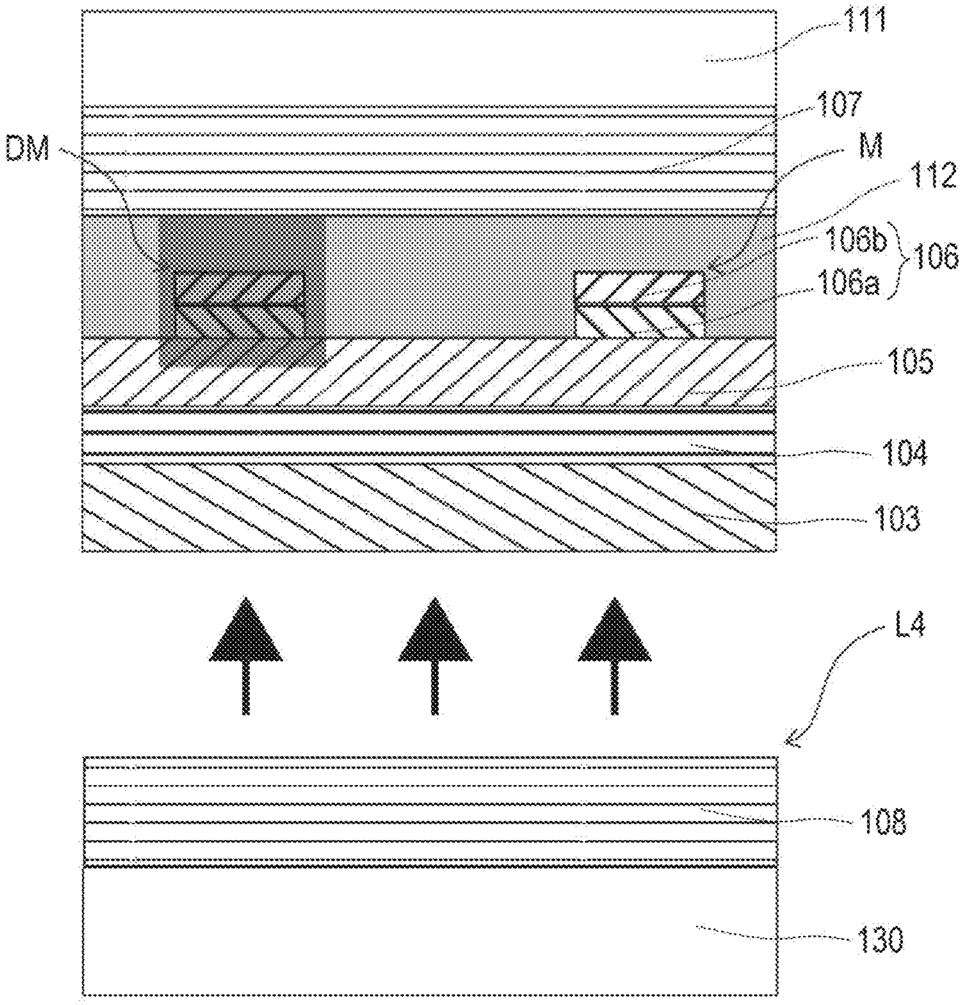
FIG. 67 is a cross-sectional view illustrating an eleventh process (before bonding) in FIG. 66.
Figure 68:
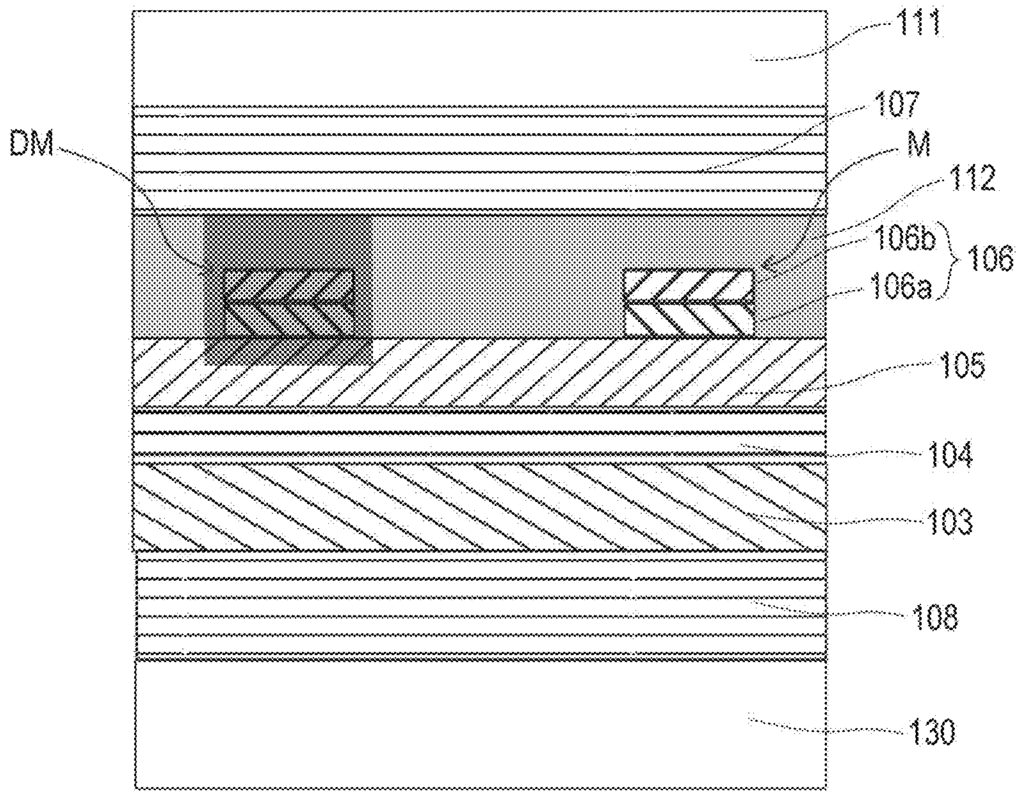
FIG. 68 is a cross-sectional view illustrating the eleventh process (after bonding) in FIG. 66.

In the next step S111, the second cladding layer 103 (see FIG. 35) and the second multilayer film reflector 108 of the fourth multilayer body L4 are bonded together (see FIGS. 67 and 68). Note that a high refractive index layer and a low refractive index layer constituting the semiconductor multilayer film reflector as the second multilayer film reflector 108 are alternately layered on the substrate 130 (for example, a GaAs substrate) to generate the fourth multilayer body L4.

Figure 69:
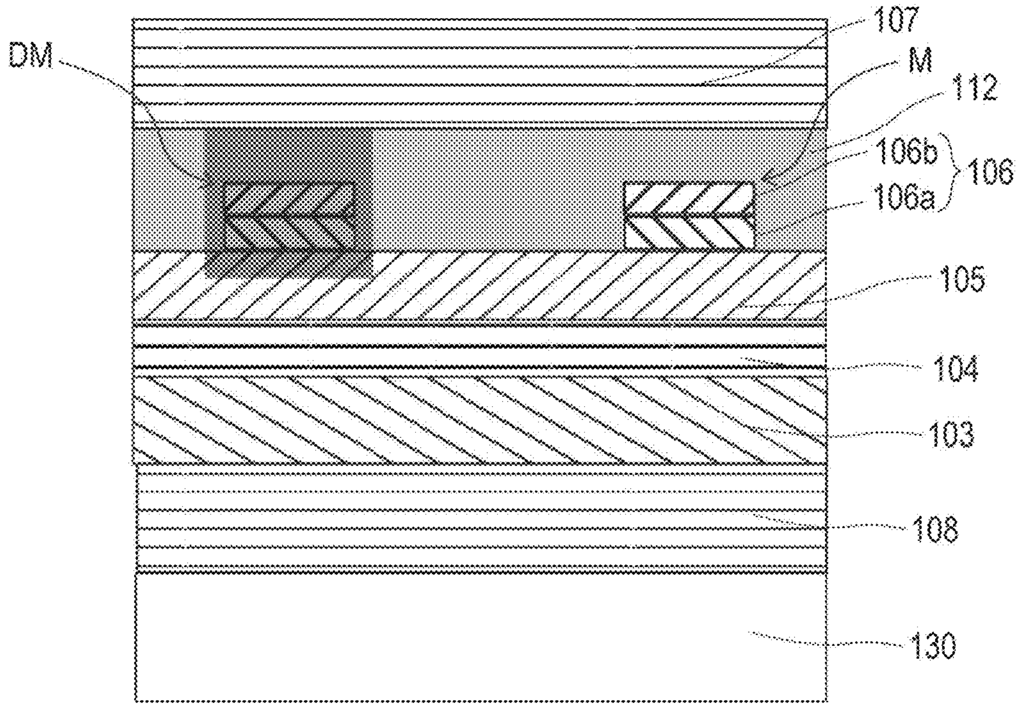
FIG. 69 is a cross-sectional view illustrating a twelfth process in FIG. 66.

In the next step S112, the second growth substrate 111 is removed (see FIG. 69). Specifically, after the front surface (upper surface) of the second growth substrate 111 is ground, a remaining portion is selectively removed by wet etching.

Figure 70:
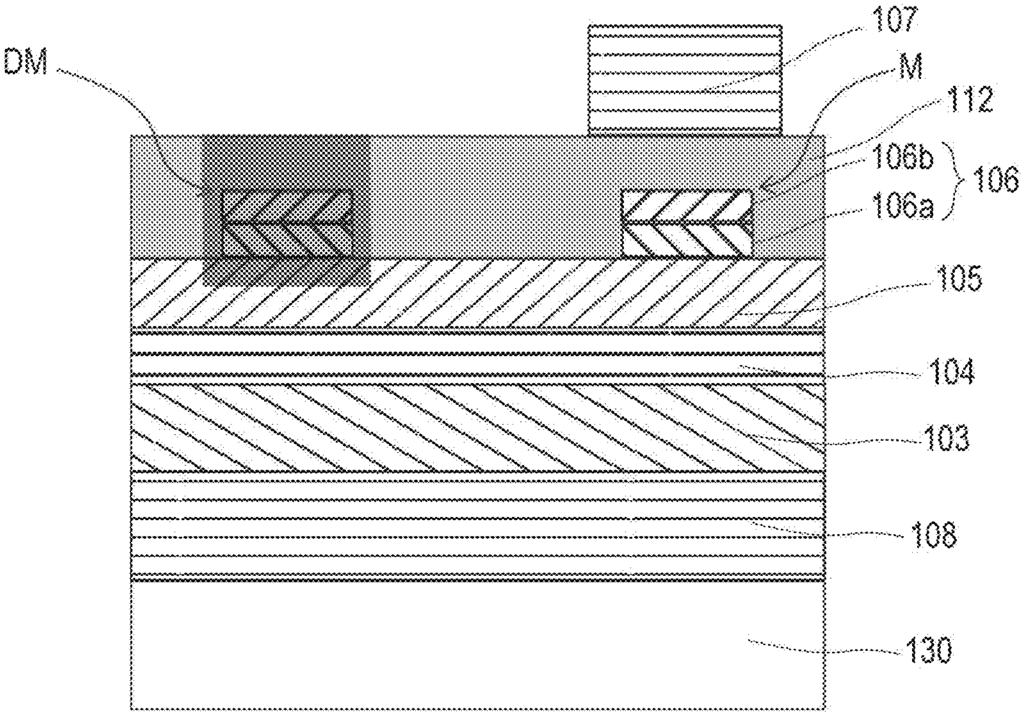
FIG. 70 is a cross-sectional view illustrating a thirteenth process in FIG. 66.

In the next step S113, the first multilayer film reflector 107 is etched (see FIG. 70). Specifically, the first multilayer film reflector 107 is dry-etched or wet-etched to leave only a portion corresponding to the mesa M.

Figure 71:
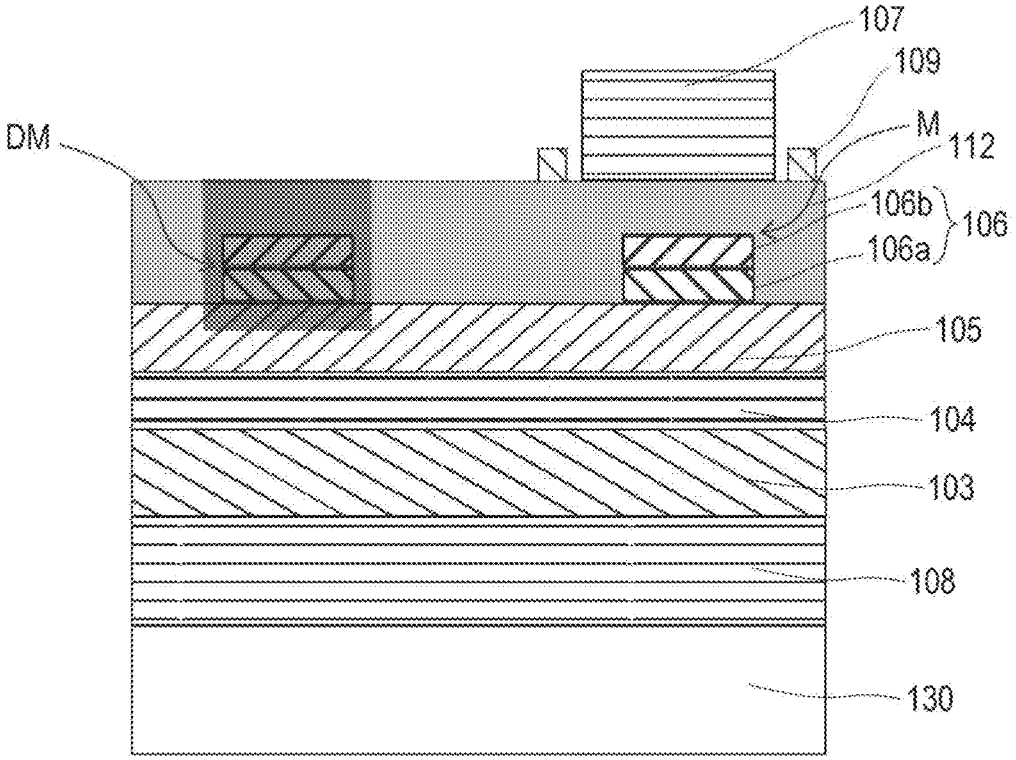
FIG. 71 is a cross-sectional view illustrating a fourteenth process in FIG. 66.

In the next step S114, the anode electrode 109 is formed (see FIG. 71). Specifically, for example, an electrode material constituting the anode electrode 109 is formed, by a lift-off method, on the buried layer 112 in a loop shape (for example, an annular shape) so as to surround the first multilayer film reflector 107 corresponding to the mesa M.

Figure 72:
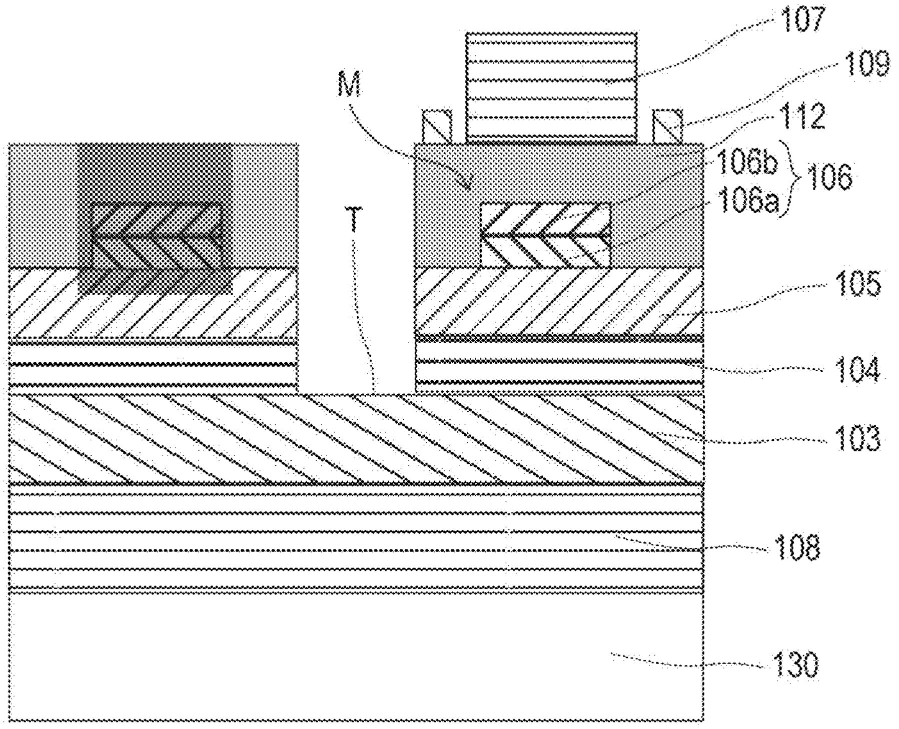
FIG. 72 is a cross-sectional view illustrating a fifteenth process in FIG. 66.

In the next step S115, the trench T is formed (see FIG. 72). Specifically, at least a region between two mesas adjacent to each other in the buried layer 112, the first cladding layer 105, and the active layer 104 is removed by dry etching or wet etching to form the trench T. An etching depth at this time is, for example, up to the second cladding layer 103.

Figure 73:
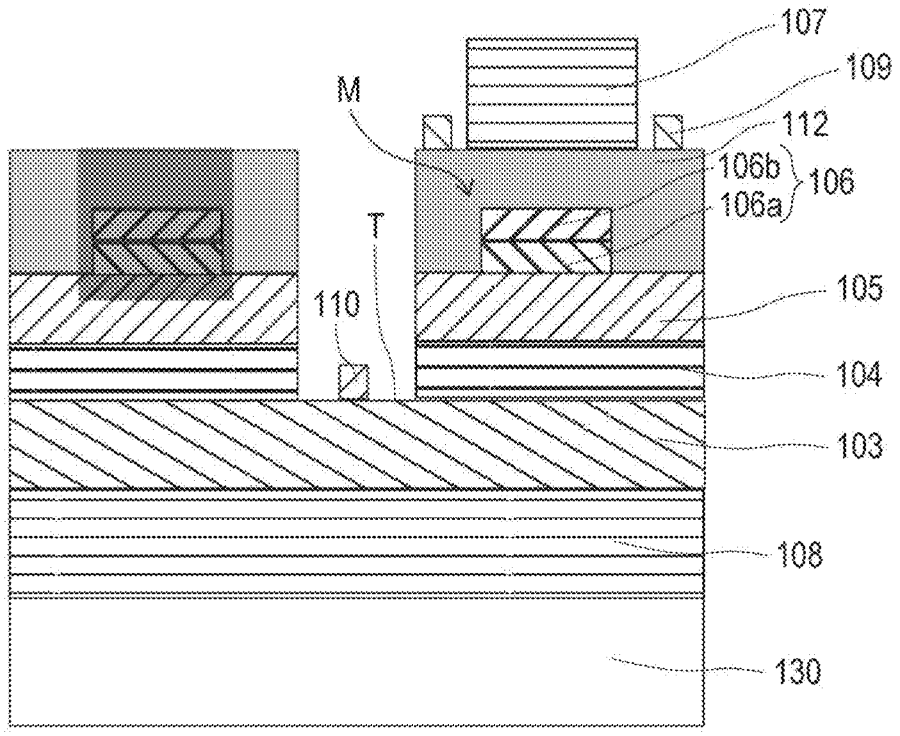
FIG. 73 is a cross-sectional view illustrating a sixteenth process in FIG. 66.

In the last step S116, the cathode electrode 110 is formed (see FIG. 73). Specifically, for example, an electrode material constituting the cathode electrode 110 is formed on the bottom surface of the trench T by a lift-off method.

8. Surface Emitting Laser According to Sixth Embodiment of Present Technology Hereinafter, a surface emitting laser 600 according to a sixth embodiment of the present technology will be described.

Figure 74:
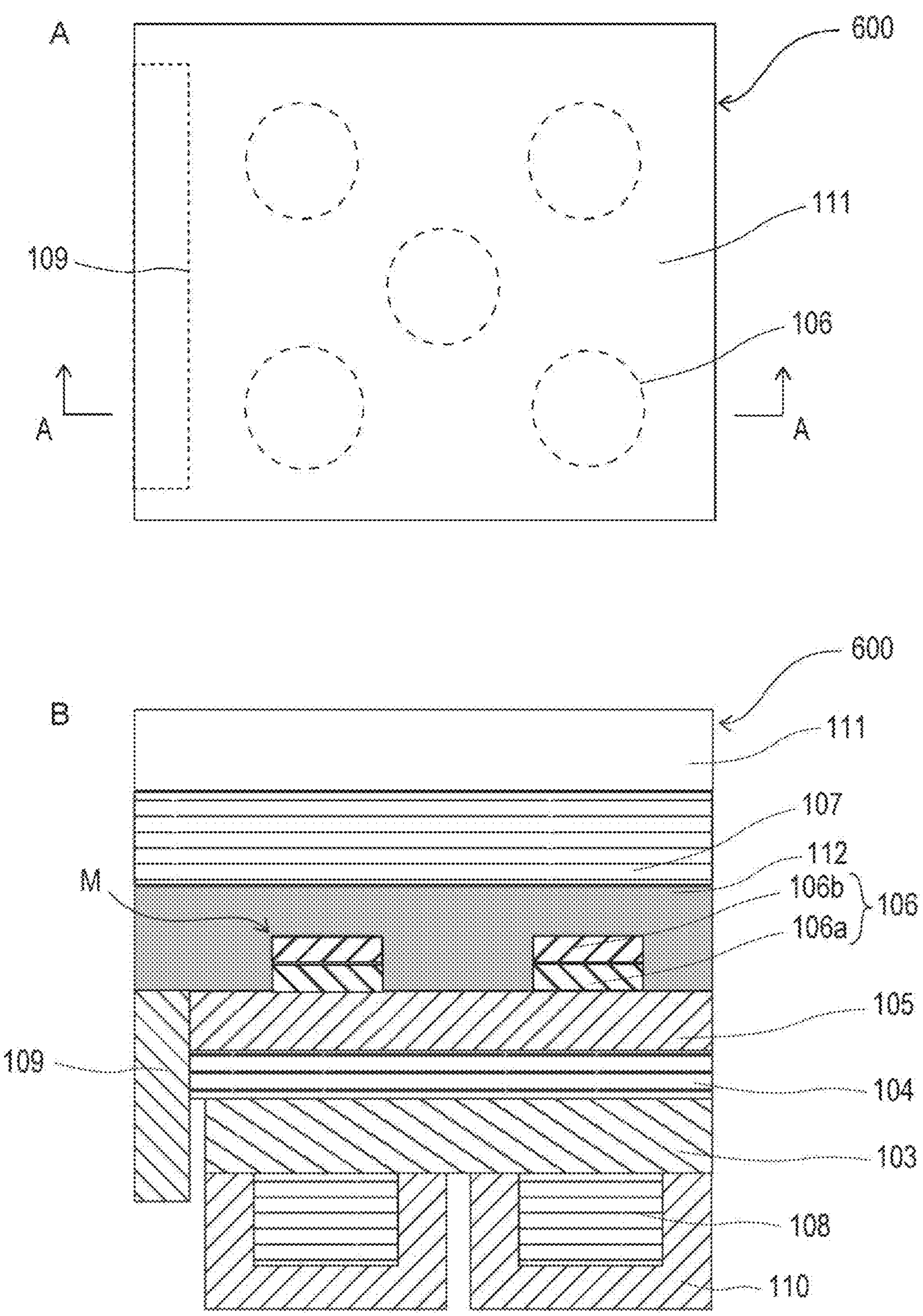
FIG. 74A is a plan view of a surface emitting laser according to a sixth embodiment of the present technology.
FIG. 74B is a cross-sectional view taken along line A-A in FIG. 74A.

FIG. 74A is a plan view of the surface emitting laser 600. FIG. 74B is a cross-sectional view taken along line A-A in FIG. 74A.

As illustrated in FIGS. 74A and 74B, the surface emitting laser 600 of the sixth embodiment has a configuration substantially similar to the configuration of the surface emitting laser 100 of the first embodiment except that the surface emitting laser 600 has an intracavity structure (specifically, the layout of the anode electrode 109 is different).

More specifically, in the surface emitting laser 600, the anode electrode 109 is disposed on an end surface side of the active layer 104 and is in contact with the surface of the buried layer 112 adjacent to the active layer 104.

With the surface emitting laser 600, since the anode electrode 109 is formed in the plane, the proportion of the electrode in the plane increases, but the electrode can be easily bonded.

9. Surface Emitting Laser According to Seventh Embodiment of Present Technology Hereinafter, a surface emitting laser 700 according to a seventh embodiment of the present technology will be described.

Figure 75:
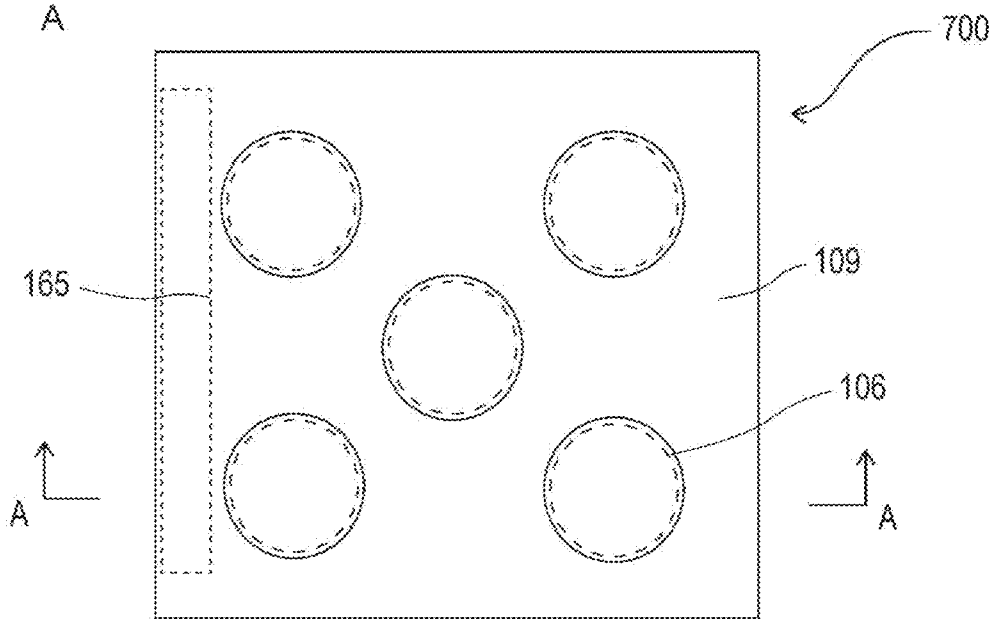
FIG. 75A is a plan view of a surface emitting laser according to a seventh embodiment of the present technology.
FIG. 75B is a cross-sectional view taken along line A-A in FIG. 75A.
Figure 75:
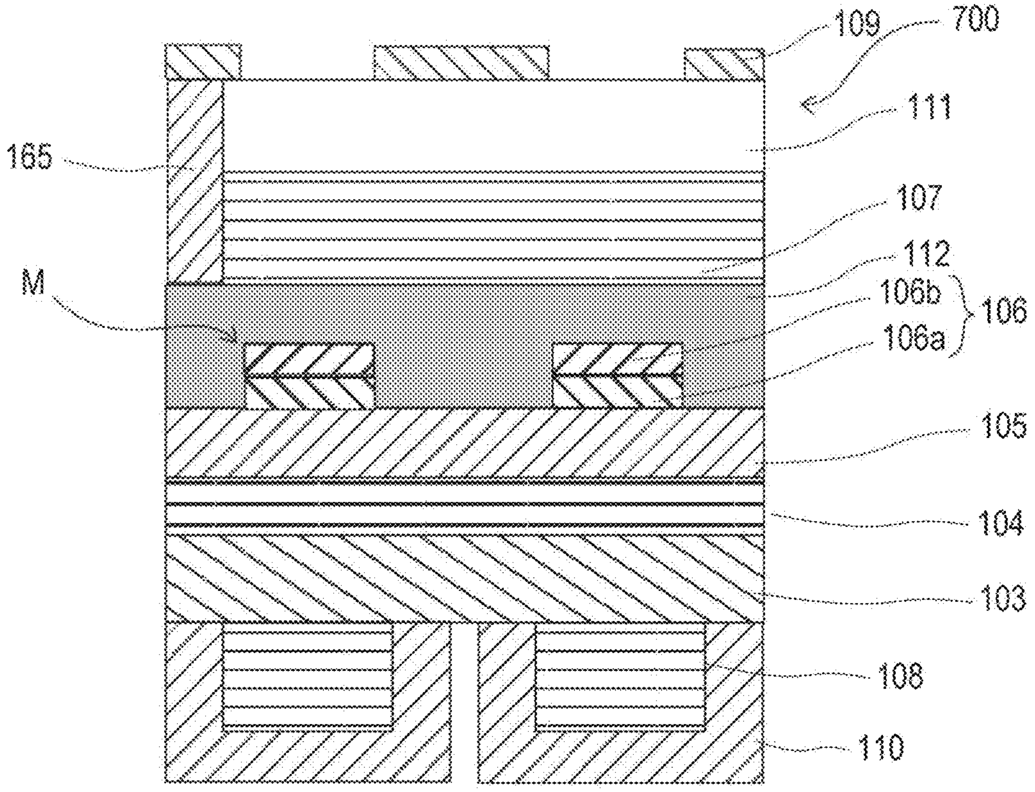

FIG. 75A is a plan view of the surface emitting laser 700. FIG. 75B is a cross-sectional view taken along line A-A in FIG. 75A.

As illustrated in FIGS. 75A and 75B, the surface emitting laser 700 of the seventh embodiment has a configuration substantially similar to the configuration of the surface emitting laser 100 of the first embodiment except that the anode electrode 109 and the buried layer 112 are connected via a conductive via 165.

In the surface emitting laser 700, in the first structure including the first multilayer film reflector 107, the substrate 111 located on a side of the first multilayer film reflector 107 remote from the resonator R is a semi-insulating substrate (for example, a SI—GaAs substrate).

The anode electrode 109 is provided on a surface of the semi-insulating substrate as the substrate 111 remote from the first multilayer film reflector 107.

The via 165 extends through the substrate 111 and the first multilayer film reflector 107, and has one end in contact with the anode electrode 109 and the other end in contact with the buried layer 112.

With the surface emitting laser 700, since the anode electrode 109 and the buried layer 112 are connected via the via 165, it is possible to prevent a current from flowing through the junction interface between the buried layer 112 and the first multilayer film reflector 107, and it is possible to prevent a defect from developing in the junction interface.

With the surface emitting laser 700, since the anode electrode 109 can be disposed on the front surface (upper surface) of the substrate 111, a space can be effectively utilized. Furthermore, it is possible to dispose a semi-insulating substrate having less free carrier absorption on the current path and prevent a decrease in efficiency of current injection into the active layer 104.

10. Surface Emitting Laser According to Eighth Embodiment of Present Technology Hereinafter, a surface emitting laser 800 according to an eighth embodiment of the present technology will be described.

Figure 76:
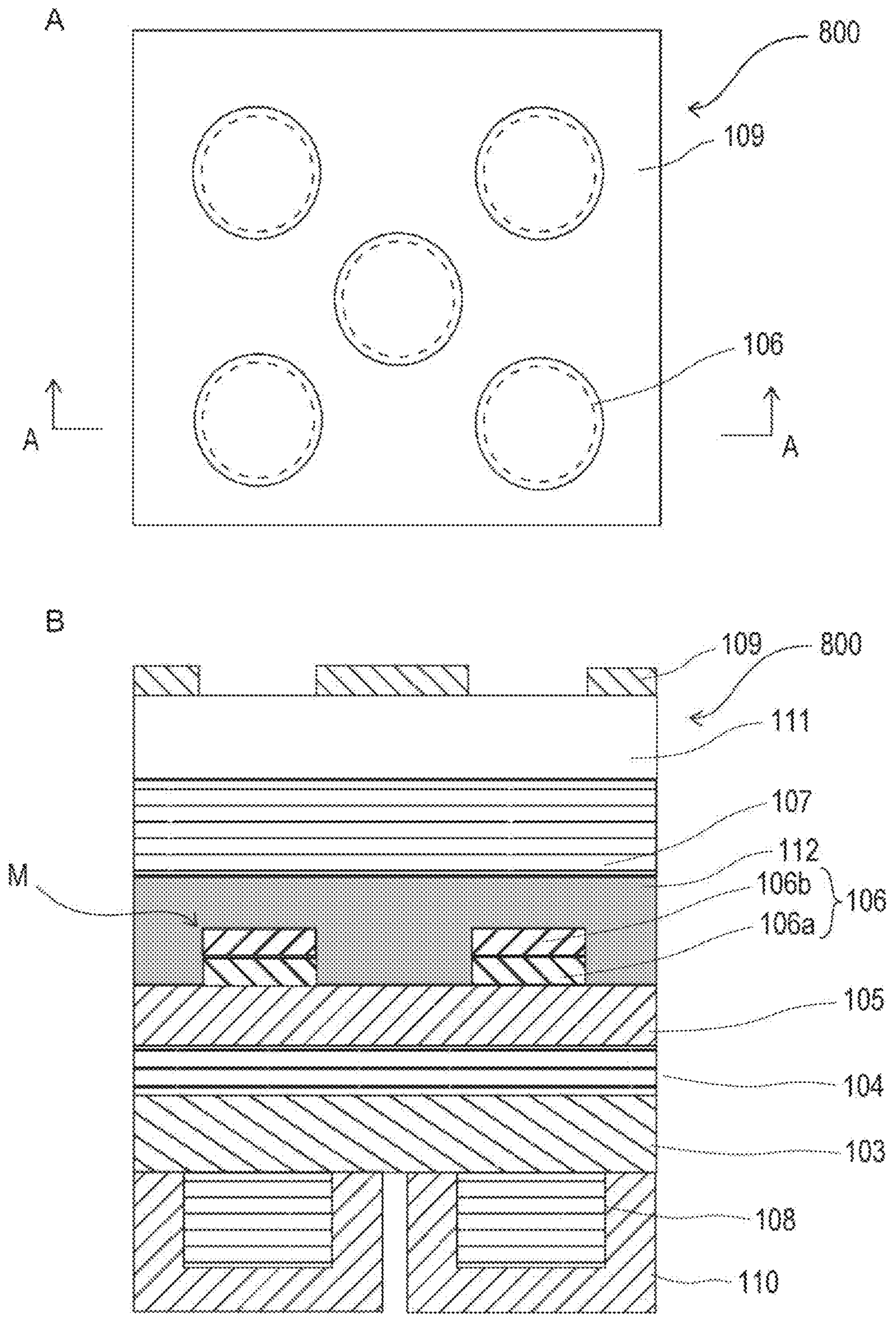
FIG. 76A is a plan view of a surface emitting laser according to an eighth embodiment of the present technology.
FIG. 76B is a cross-sectional view taken along line A-A in FIG. 76A.

FIG. 76A is a plan view of the surface emitting laser 800. FIG. 76B is a cross-sectional view taken along line A-A in FIG. 76A.

In the surface emitting laser 800 of the eighth embodiment, as illustrated in FIGS. 76A and 76B, the anode electrode 109 is an electrode layer provided substantially all over the substrate 111 (for example, an n-GaAs substrate) other than a region corresponding to the mesa M. That is, the electrode layer has an opening at the region corresponding to the mesa M.

In the surface emitting laser 800, the substrate ill of the first structure including the first multilayer film reflector 107 is a conductive substrate (for example, n-GaAs) disposed on a side of the first multilayer film reflector 107 remote from the resonator R.

With the surface emitting laser 800, since the anode electrode 109 is formed large in a planar shape, a current concentration can be minimized, a current density at the junction interface between the buried layer 112 and the first multilayer film reflector 107 can be reduced, and it is therefore possible to prevent a defect from developing in the junction interface.

11. Planar Configuration Examples 1 to 15 of Tunnel Junction Layer and Cross-Sectional Configuration Examples 1 to 6 of Surface Emitting Laser Hereinafter, planar configuration examples 1 to 15 of the tunnel junction layer 106 and cross-sectional configuration examples 1 to 6 of the surface emitting laser will be described.

Planar Configuration Example 1

Figure 77:
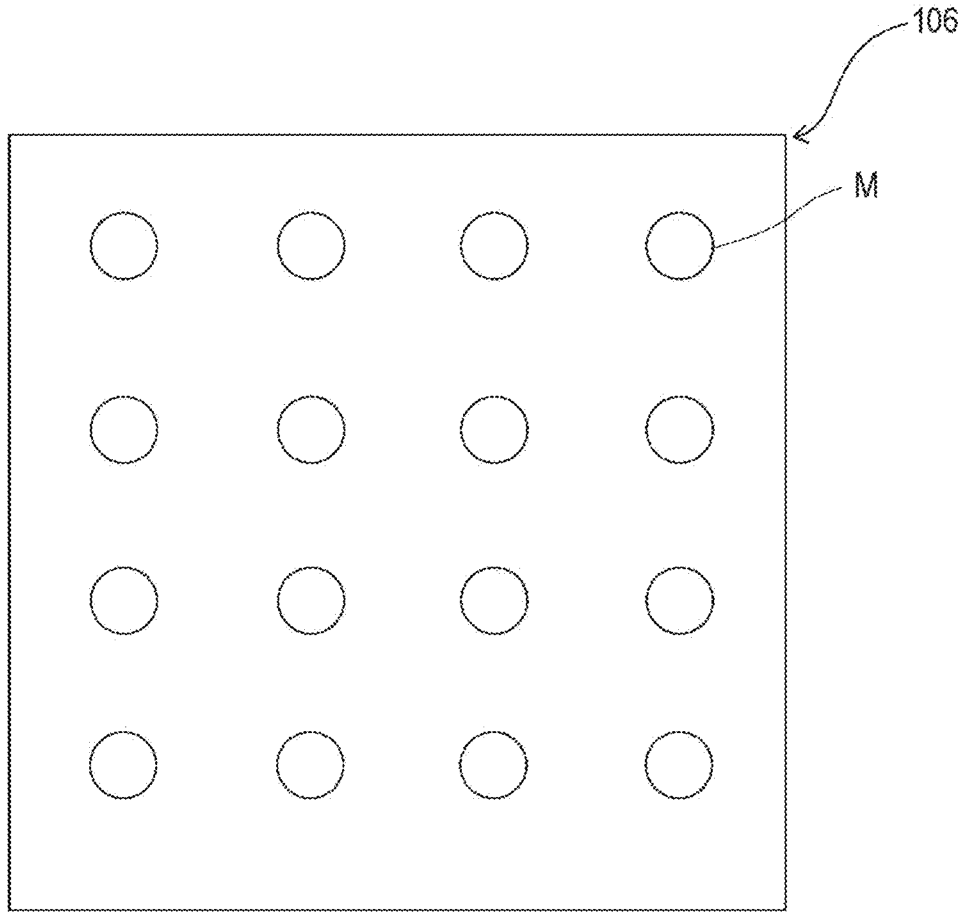
FIG. 77 is a diagram illustrating a planar configuration example 1 of the tunnel junction layer.

In the planar configuration example 1, as illustrated in FIG. 77, the tunnel junction layer 106 has a planar configuration in which a plurality of mesas M is regularly arranged in a matrix pattern, for example.

Planar Configuration Example 2

Figure 78:
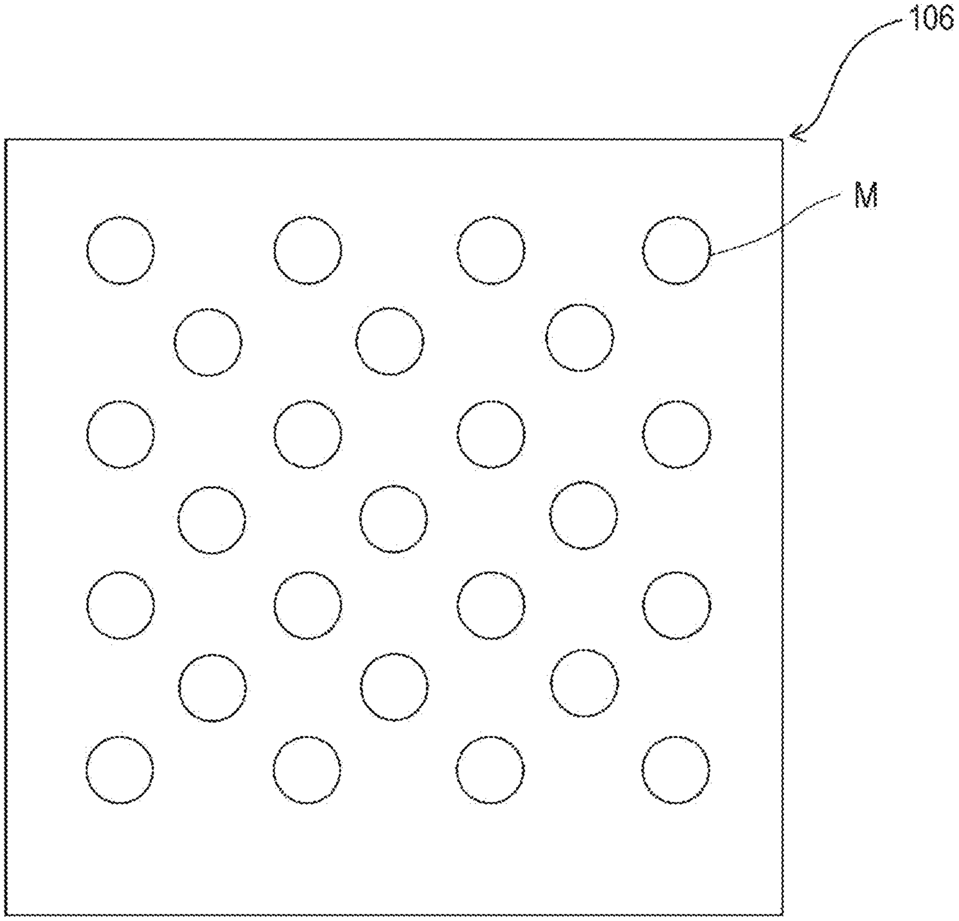
FIG. 78 is a diagram illustrating a planar configuration example 2 of the tunnel junction layer.

In the planar configuration example 2, as illustrated in FIG. 78, the tunnel junction layer 106 has a planar configuration in which a plurality of mesas M is regularly arranged in a staggered pattern, for example. In this case, it is also possible to arrange the plurality of mesas M more densely than the planar configuration example 1 in FIG. 75.

Planar Configuration Example 3

Figure 79:
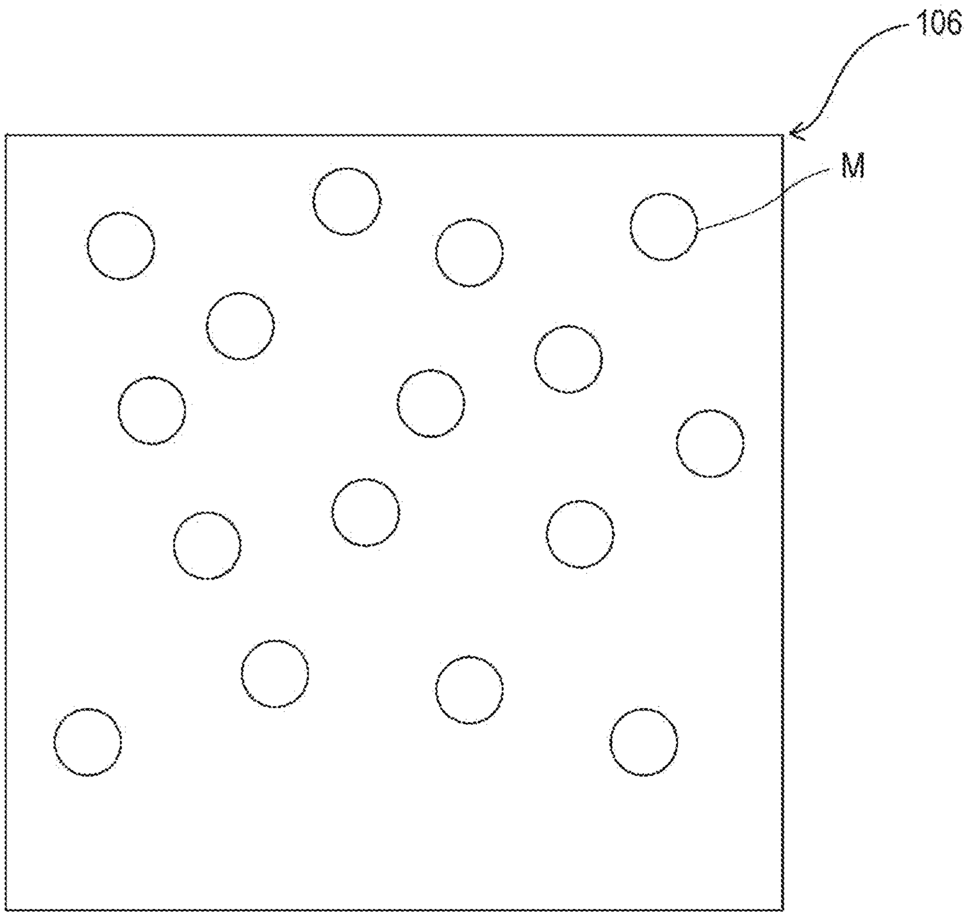
FIG. 79 is a diagram illustrating a planar configuration example 3 of the tunnel junction layer.

In the planar configuration example 3, as illustrated in FIG. 79, the tunnel junction layer 106 has a planar configuration in which a plurality of mesas M is randomly arranged, for example.

Planar Configuration Example 4

Figure 80:
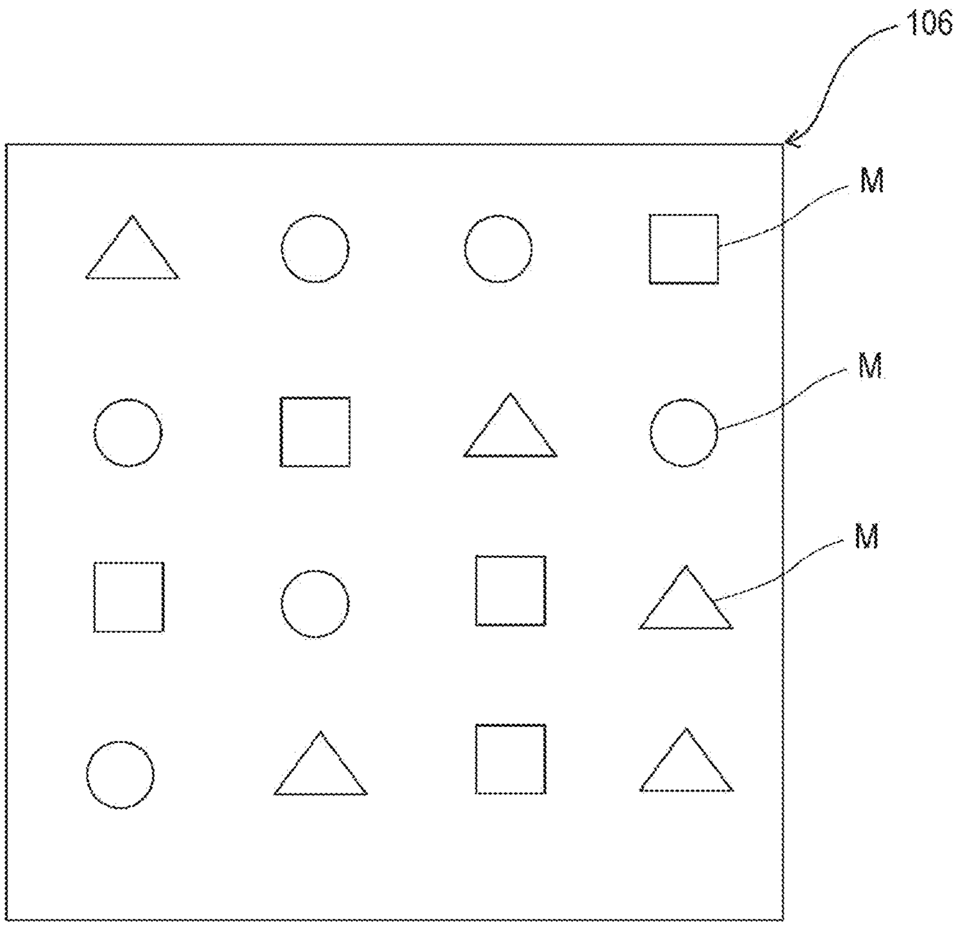
FIG. 80 is a diagram illustrating a planar configuration example 4 of the tunnel junction layer.

In the planar configuration example 4, as illustrated in FIG. 80, the tunnel junction layer 106 has a planar configuration in which a plurality of mesas M includes at least two mesas M having different shapes.

Planar Configuration Example 5

Figure 81:
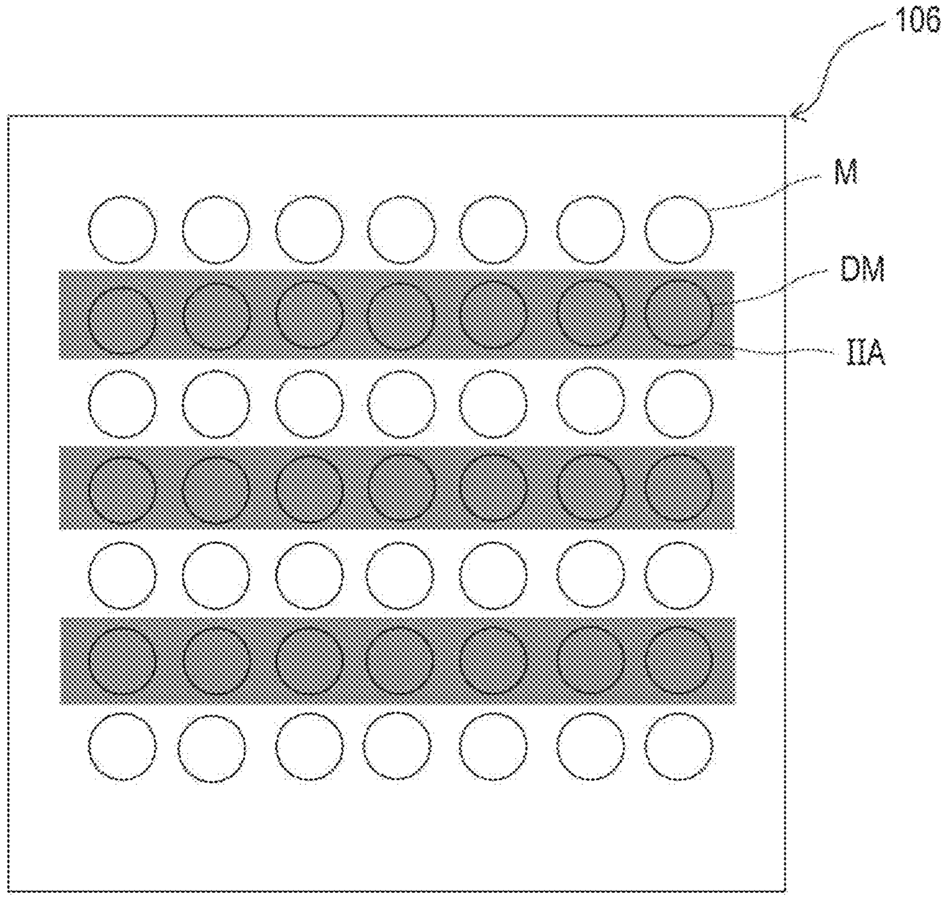
FIG. 81 is a diagram illustrating a planar configuration example 5 of the tunnel junction layer.

In the planar configuration example 5, as illustrated in FIG. 81, in the tunnel junction layer 106, a plurality of mesas arranged in a matrix pattern includes a mesa group and a dummy mesa group alternately arranged in a column direction (vertical direction). Here, the mesa group includes a plurality of mesas M arranged in a row direction (horizontal direction), and the dummy mesa group includes a plurality of dummy mesas DM arranged in the row direction.

Note that, in the tunnel junction layer 106, the plurality of mesas arranged in a matrix pattern may include a mesa group and a dummy mesa group alternately arranged in the row direction. In this case, the mesa group includes a plurality of mesas M arranged in the column direction, and the dummy mesa group includes a plurality of mesas M arranged in the column direction.

Planar Configuration Example 6

Figure 82:
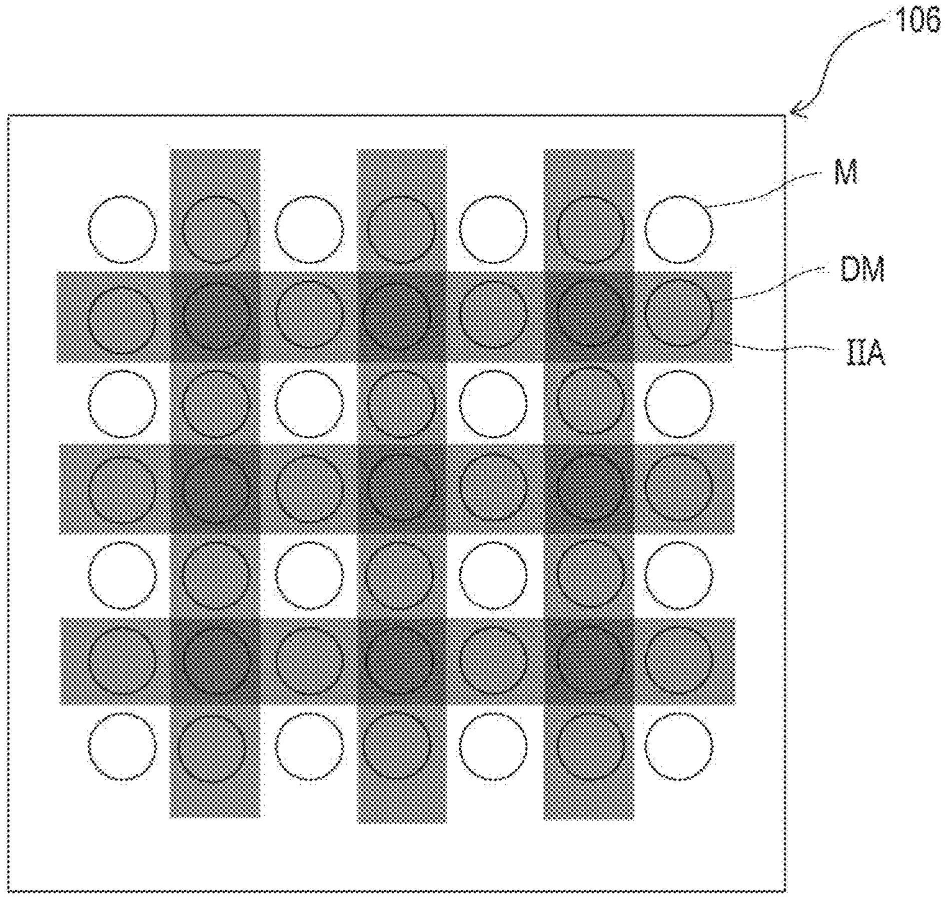
FIG. 82 is a diagram illustrating a planar configuration example 6 of the tunnel junction layer.

In the planar configuration example 6, as illustrated in FIG. 82, in the tunnel junction layer 106, a plurality of mesas arranged in a matrix pattern includes a mesa M and a dummy mesa DM alternately arranged in all of the column direction (vertical direction), the row direction (horizontal direction), and a direction (oblique direction) intersecting both the column direction and the row direction.

Planar Configuration Example 7

Figure 83:
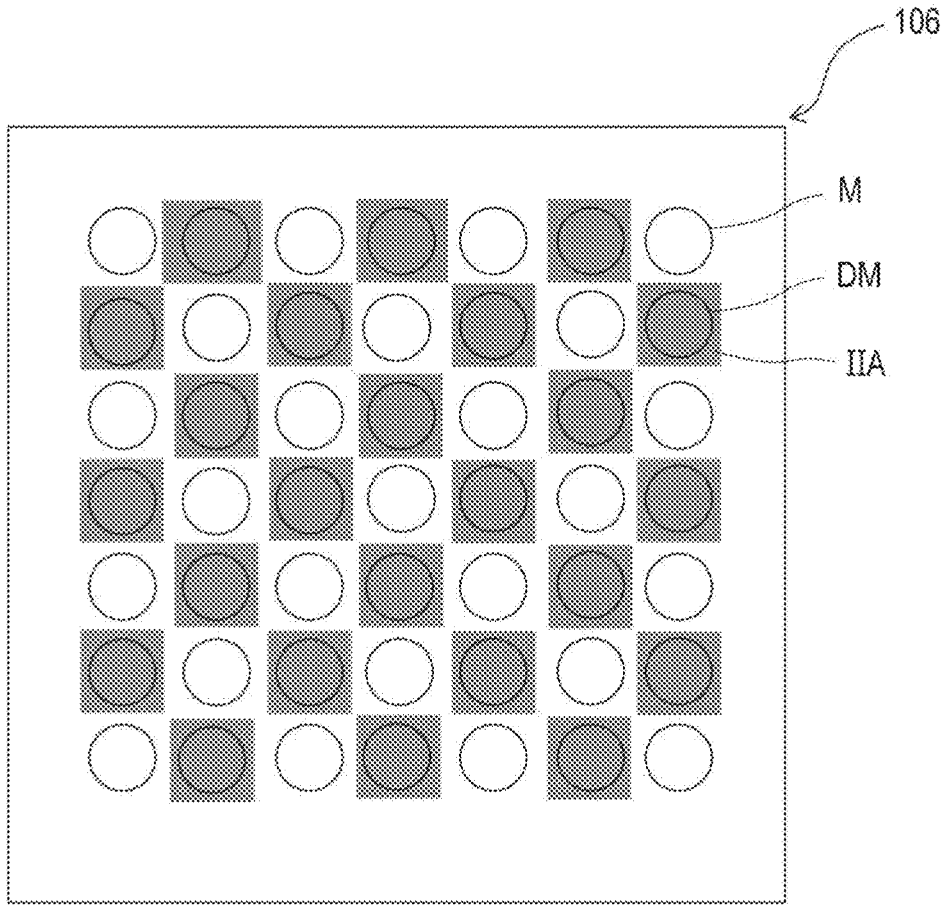
FIG. 83 is a diagram illustrating a planar configuration example 7 of the tunnel junction layer.

In the planar configuration example 7, as illustrated in FIG. 83, in the tunnel junction layer 106, a plurality of mesas arranged in a matrix pattern includes a mesa M and a dummy mesa DM alternately arranged in both the column direction (vertical direction) and the row direction (horizontal direction).

Planar Configuration Example 8

Figure 84:
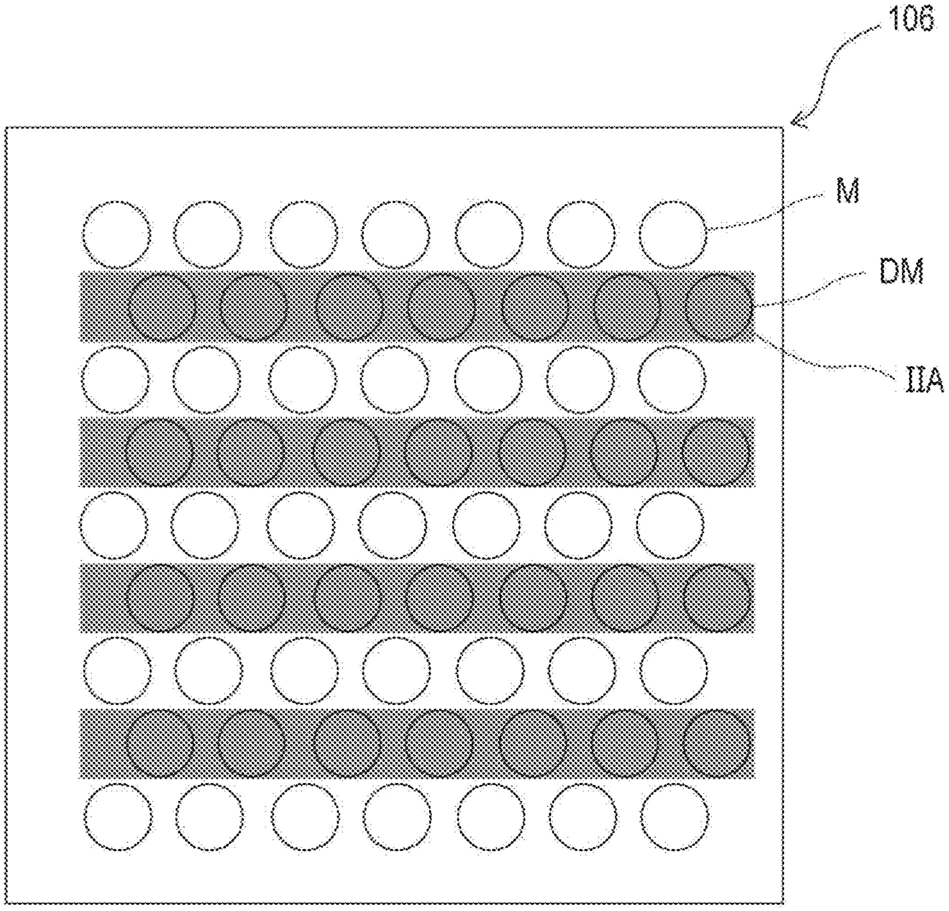
FIG. 84 is a diagram illustrating a planar configuration example 8 of the tunnel junction layer.

In the planar configuration example 8, as illustrated in FIG. 84, in the tunnel junction layer 106, a plurality of mesas arranged in a staggered pattern includes a mesa group and a dummy mesa group alternately arranged in the column direction (vertical direction). Here, the mesa group includes a plurality of mesas M arranged in the row direction (horizontal direction), and the dummy mesa group includes a plurality of dummy mesas DM arranged in the row direction.

Note that, in the tunnel junction layer 106, the plurality of mesas arranged in a staggered pattern may include a mesa group and a dummy mesa group alternately arranged in the row direction. In this case, the mesa group includes a plurality of mesas M arranged in the column direction, and the dummy mesa group includes a plurality of mesas M arranged in the column direction.

Planar Configuration Example 9

Figure 85:
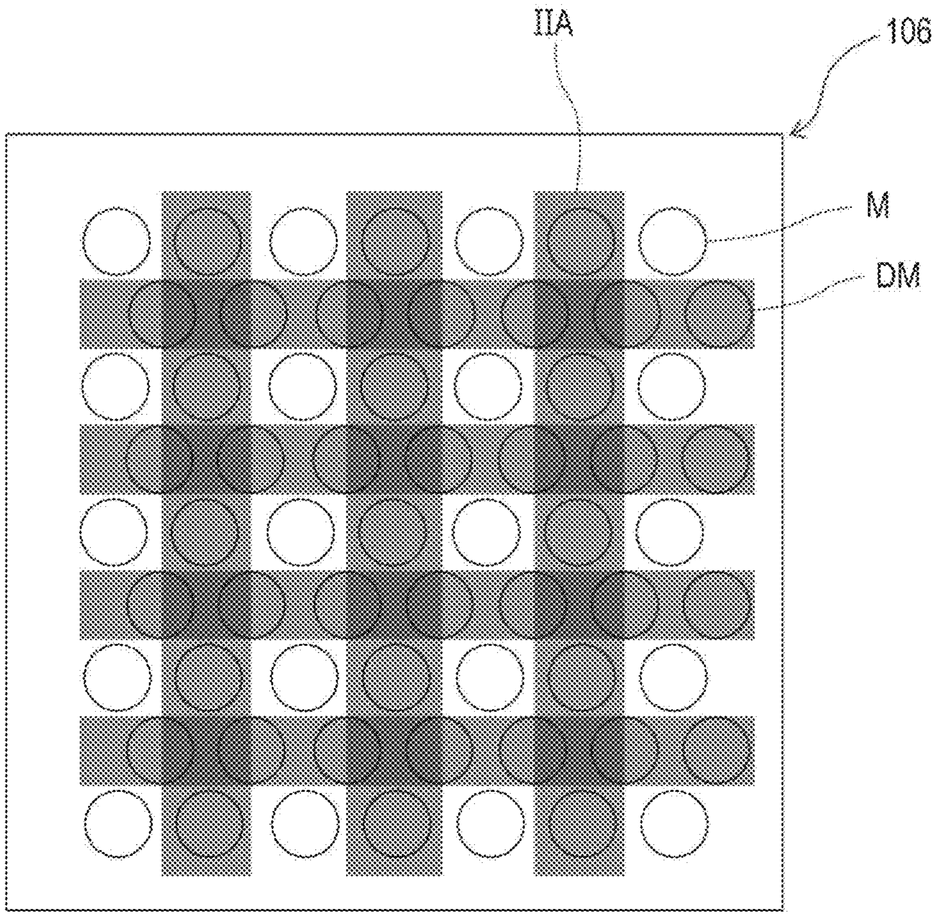
FIG. 85 is a diagram illustrating a planar configuration example 9 of the tunnel junction layer.

In the planar configuration example 9, as illustrated in FIG. 85, in the tunnel junction layer 106, a plurality of mesas arranged in a staggered pattern includes a plurality of mesas M arranged in a matrix pattern and dummy mesas DM arranged between rows and columns of the matrix pattern.

Cross-Sectional Configuration Example 1

Figure 86:
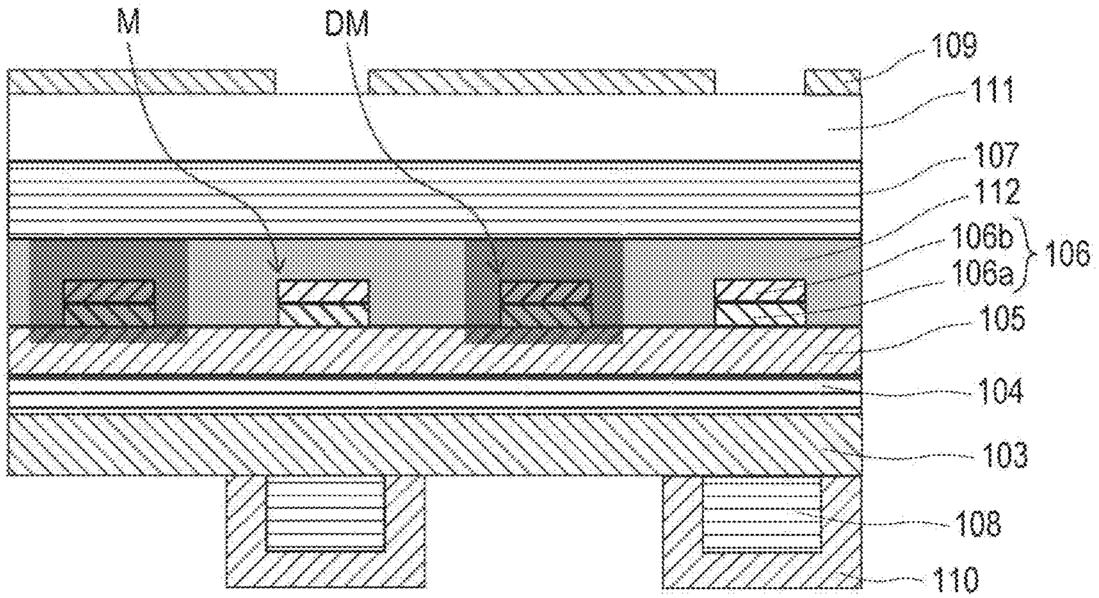
FIG. 86 is a diagram illustrating a cross-sectional configuration example 1 of the surface emitting laser.

In the cross-sectional configuration example 1, as illustrated in FIG. 86, in the tunnel junction layer 106, the mesa M and the dummy mesa DM are alternately arranged. The cross-sectional configuration example 1 corresponds to a cross section of a portion where the mesa M and the dummy mesa DM are alternately arranged in the planar configuration examples 5 to 9 (see FIGS. 81 to 85).

Planar Configuration Example 10

Figure 87:
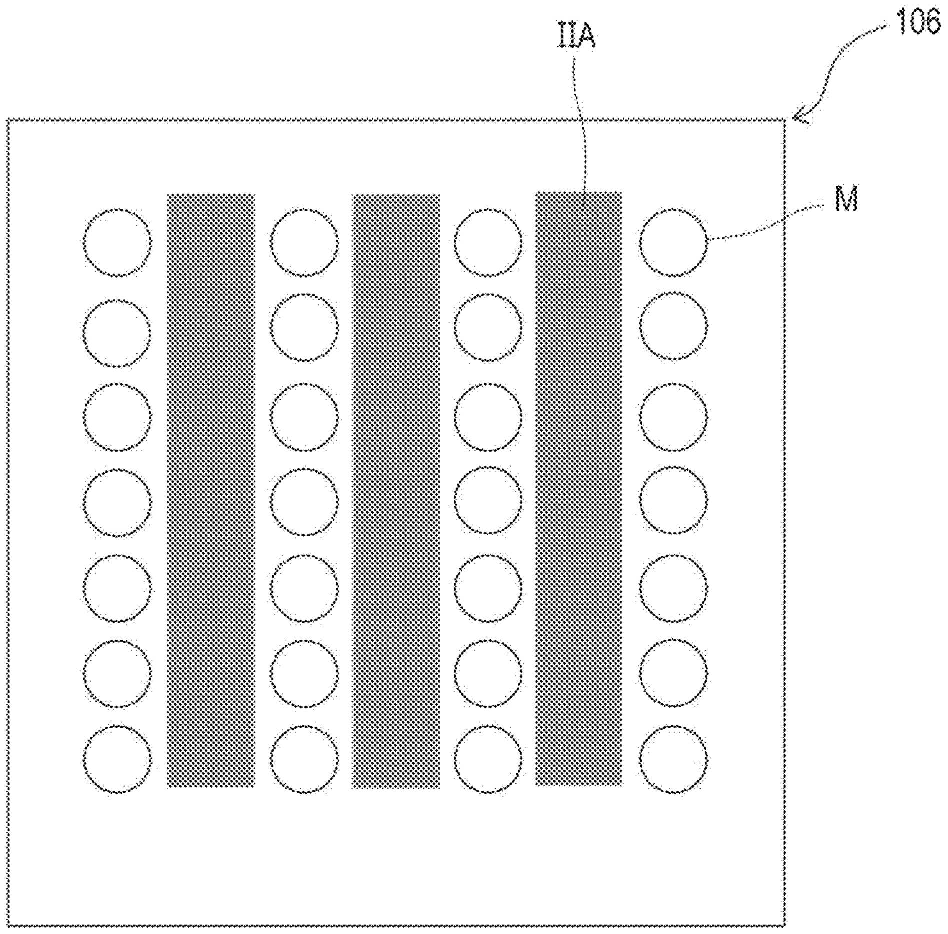
FIG. 87 is a diagram illustrating a planar configuration example 10 of the tunnel junction layer.

In the planar configuration example 10, as illustrated in FIG. 87, in the tunnel junction layer 106, a mesa group including a plurality of mesas M arranged in the column direction (vertical direction) and an ion implantation region IIA as the adjacent region extending in the column direction are alternately arranged in the row direction.

Note that, in the tunnel junction layer 106, a mesa group including a plurality of mesas M arranged in the row direction (horizontal direction) and an ion implantation region IIA as the adjacent region extending in the row direction may be alternately arranged in the column direction.

Planar Configuration Example 11

Figure 88:
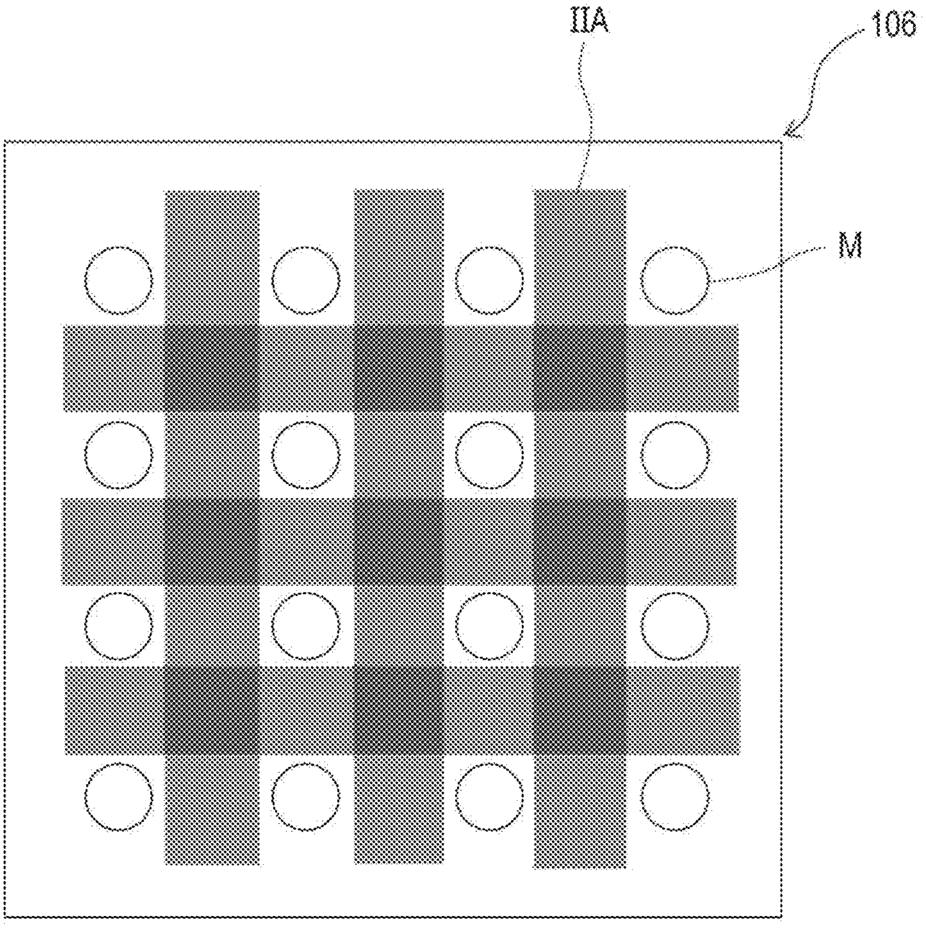
FIG. 88 is a diagram illustrating a planar configuration example 11 of the tunnel junction layer.

In the planar configuration example 11, as illustrated in FIG. 88, in the tunnel junction layer 106, a mesa M and an ion implantation region IIA as the adjacent region are alternately arranged in all of the column direction, the row direction, and the direction (oblique direction) intersecting both the column direction and the row direction.

Cross-Sectional Configuration Example 2

Figure 89:
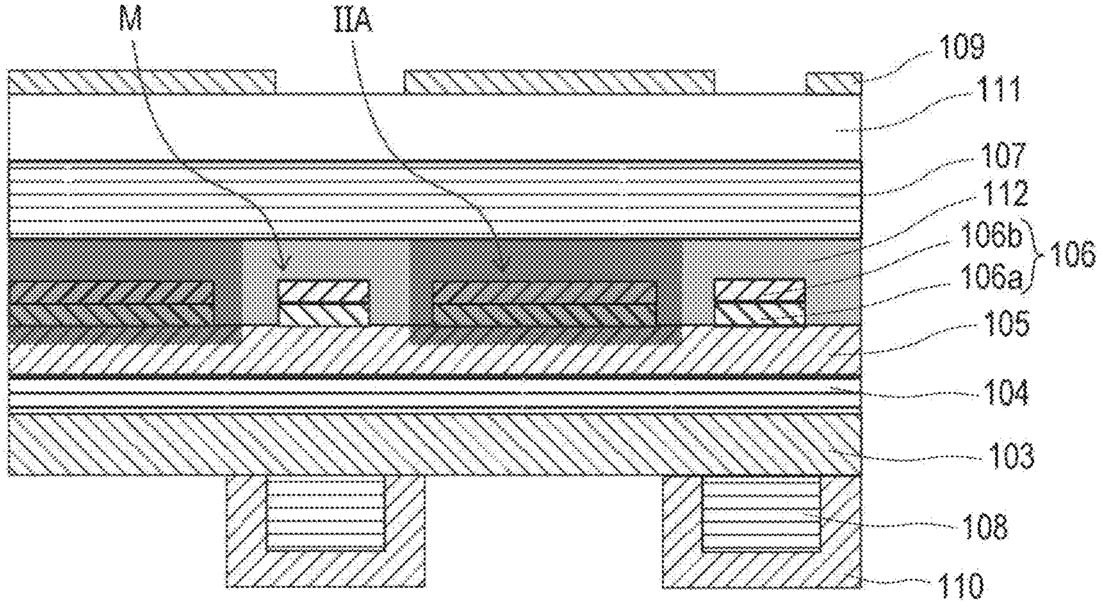
FIG. 89 is a diagram illustrating a cross-sectional configuration example 2 of the surface emitting laser.

In the cross-sectional configuration example 2, as illustrated in FIG. 89, in the tunnel junction layer 106, a mesa M and an ion implantation region IIA as the adjacent region are alternately arranged. The cross-sectional configuration example 2 corresponds to a cross section of a portion where the mesa M and the ion implantation region IIA are alternately arranged in the planar configuration examples 10 and 11 (see FIGS. 87 and 88).

Planar Configuration Example 12

Figure 90:
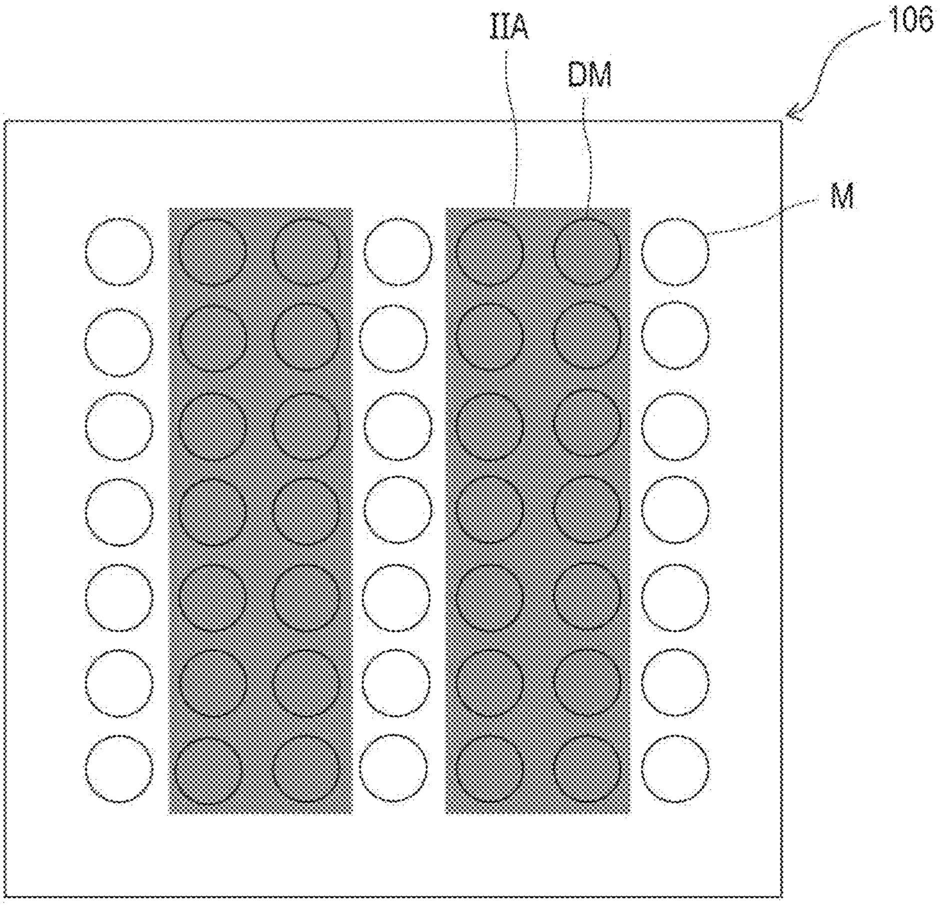
FIG. 90 is a diagram illustrating a planar configuration example 12 of the tunnel junction layer.

In the planar configuration example 12, as illustrated in FIG. 90, in the tunnel junction layer 106, a mesa group including a plurality of mesas M arranged in the column direction (vertical direction) and a dummy mesa group including a plurality of dummy mesas DM arranged in a matrix pattern in all columns in the column direction and in a plurality of rows (for example, two rows) in the row direction (horizontal direction) are alternately arranged in the row direction.

Note that, in the tunnel junction layer 106, a mesa group including a plurality of mesas M arranged in the row direction (horizontal direction) and a dummy mesa group including a plurality of dummy mesas DM arranged in a matrix pattern in all rows in the row direction and in a plurality of columns (for example, two columns) in the column direction (vertical direction) may be alternately arranged in the column direction.

Cross-Sectional Configuration Example 3

Figure 91:
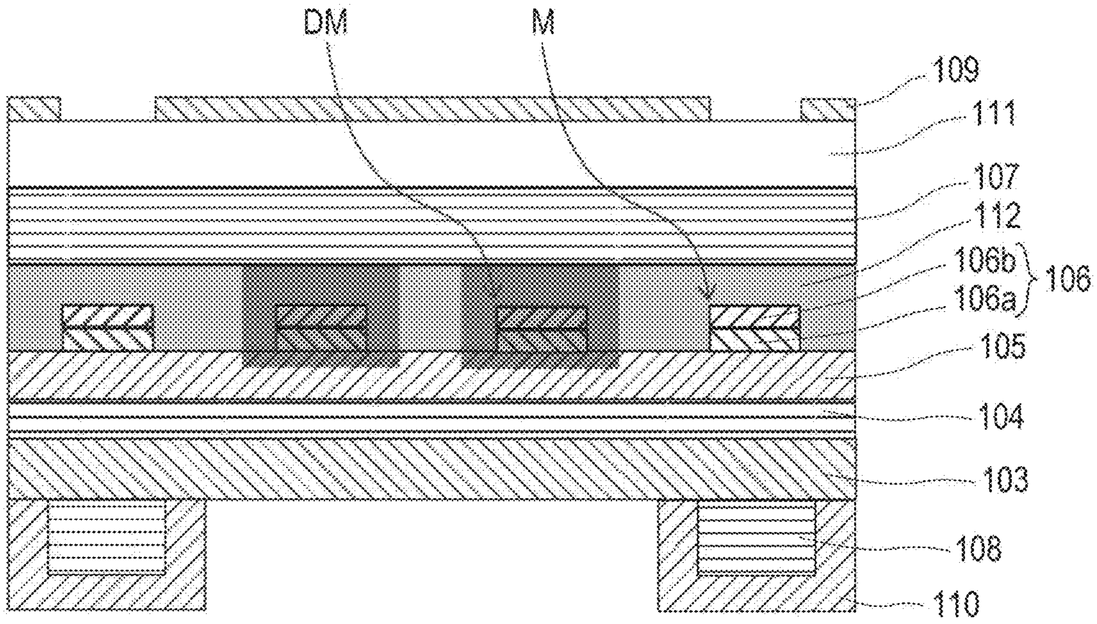
FIG. 91 is a diagram illustrating a cross-sectional configuration example 3 of the surface emitting laser.

In the cross-sectional configuration example 3, as illustrated in FIG. 91, in the tunnel junction layer 106, a plurality of (for example, two) dummy mesas DM adjacent to each other is arranged between two mesas M adjacent to each other. The cross-sectional configuration example 3 corresponds to a cross section of a portion where a plurality of (for example, two) dummy mesas DM is arranged between two mesas M adjacent to each other in the planar configuration example 12 (see FIG. 90).

Planar Configuration Example 13

Figure 92:
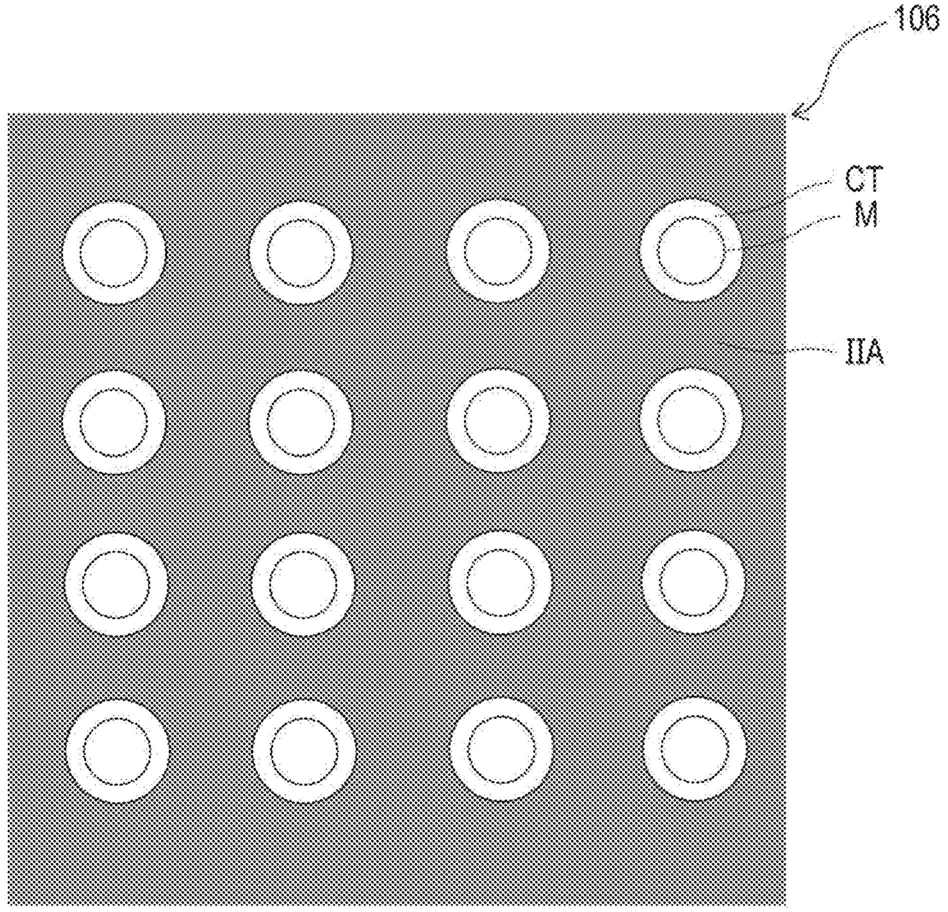
FIG. 92 is a diagram illustrating a planar configuration example 13 of the tunnel junction layer.

In the planar configuration example 13, as illustrated in FIG. 92, an ion implantation region IIA as the adjacent region adjacent to a plurality of mesas M arranged in a matrix pattern is provided substantially all over the tunnel junction layer 106 so as to surround each mesa M. That is, a loop groove CT (loop-shaped groove) having a width of 30 μm or less is formed between each mesa M and the ion implantation region IIA.

Planar Configuration Example 14

Figure 93:
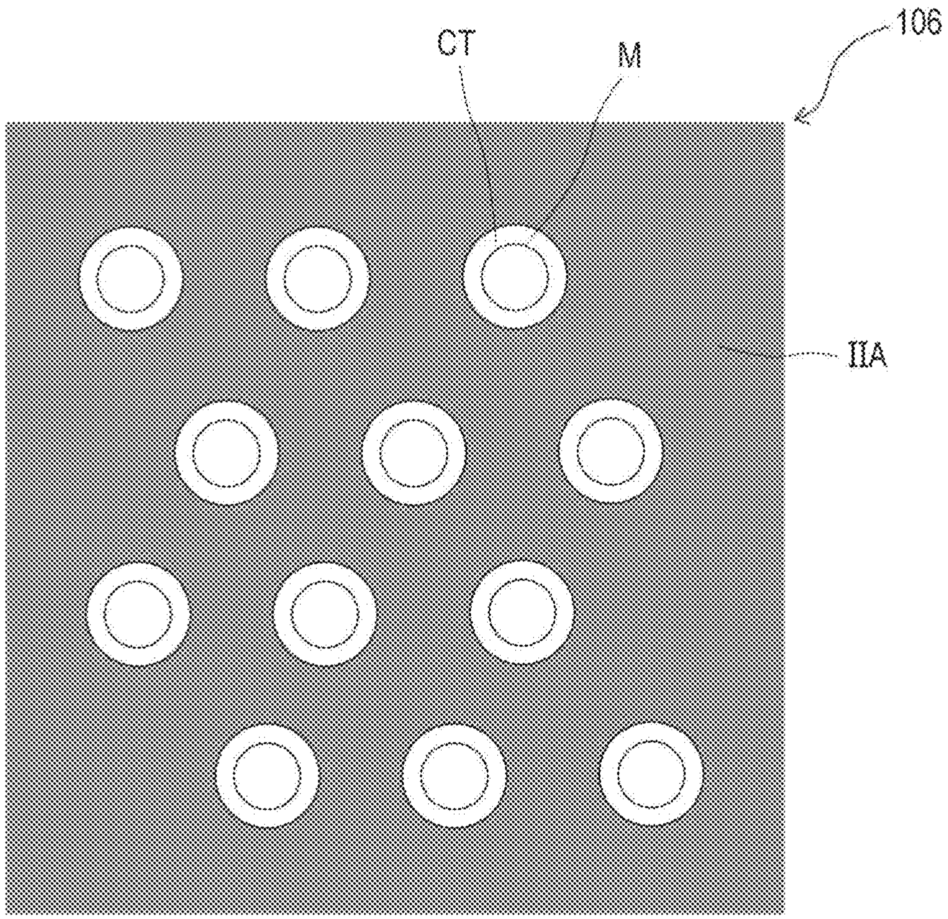
FIG. 93 is a diagram illustrating a planar configuration example 14 of the tunnel junction layer.

In the planar configuration example 14, as illustrated in FIG. 93, an ion implantation region IIA as the adjacent region adjacent to a plurality of mesas M arranged in a staggered pattern is provided substantially all over the tunnel junction layer 106 so as to surround each mesa M. That is, the loop groove CT having a width of 30 μm or less is formed between each mesa M and the ion implantation region IIA.

Planar Configuration Example 15

Figure 94:
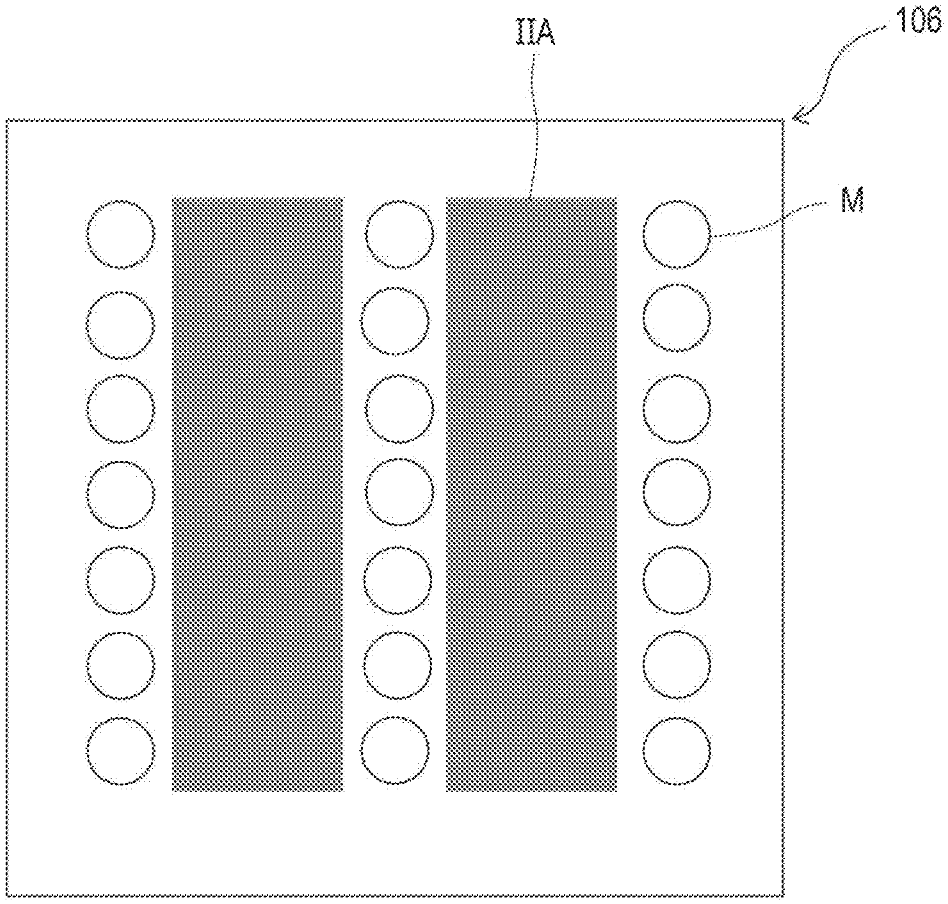
FIG. 94 is a diagram illustrating a planar configuration example 15 of the tunnel junction layer.

In the planar configuration example 15, as illustrated in FIG. 94, in the tunnel junction layer 106, a mesa group including a plurality of mesas M arranged in the column direction (vertical direction) and an ion implantation region IIA, as the adjacent region, having a rectangular shape with the column direction as the longitudinal direction are alternately arranged in the row direction (horizontal direction).

Note that, in the tunnel junction layer 106, a mesa group including a plurality of mesas M arranged in the row direction (horizontal direction) and an ion implantation region IIA, as the adjacent region, having a rectangular shape with the row direction as the longitudinal direction may be alternately arranged in the column direction (vertical direction).

Cross-Sectional Configuration Example 4

Figure 95:
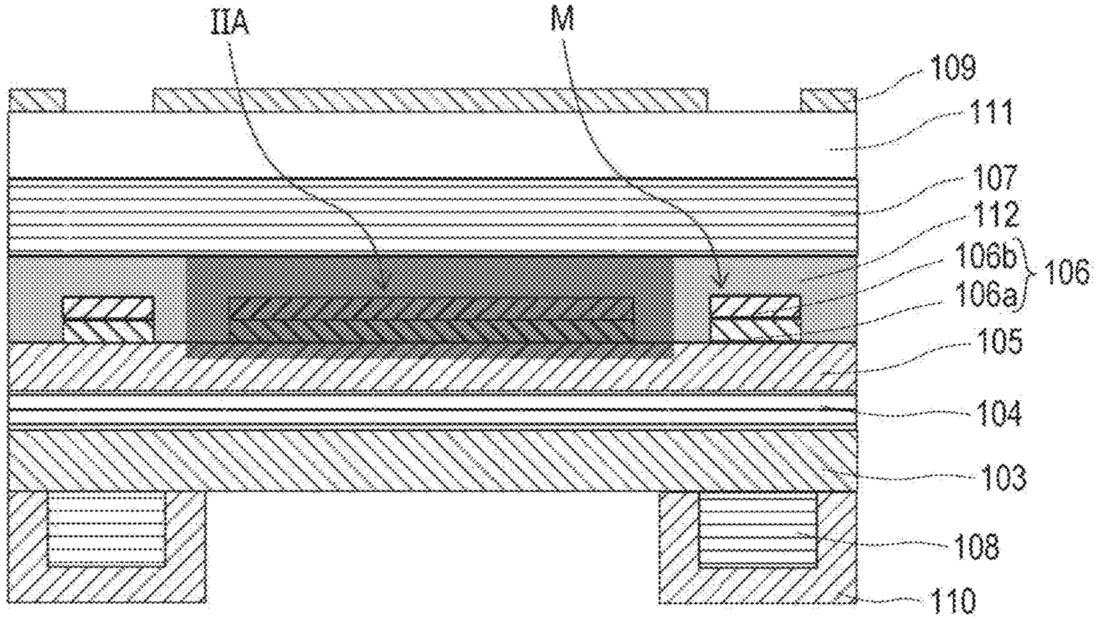
FIG. 95 is a diagram illustrating a cross-sectional configuration example 4 of the surface emitting laser.

In the cross-sectional configuration example 4, as illustrated in FIG. 95, in the tunnel junction layer 106, an ion implantation region IIA as the adjacent region is disposed between two mesas M adjacent to each other. The cross-sectional configuration example 4 corresponds to a cross section of a portion where the ion implantation region IIA as the adjacent region is disposed between two mesas M adjacent to each other in the planar configuration examples 13 to 15 (see FIGS. 92 to 94).

Cross-Sectional Configuration Example 5

Figure 96:
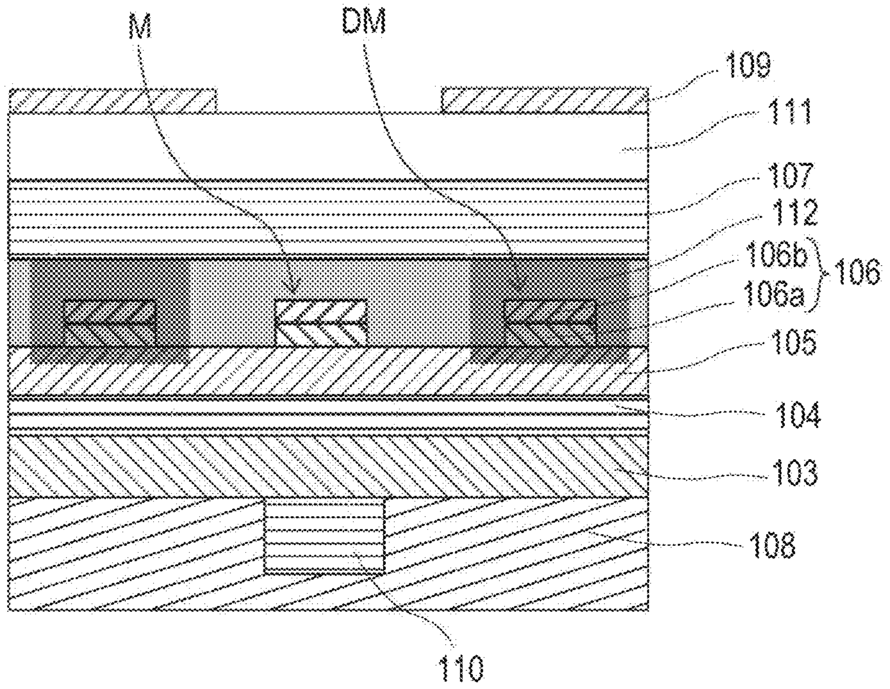
FIG. 96 is a diagram illustrating a cross-sectional configuration example 5 of the surface emitting laser.

In the cross-sectional configuration example 5, as illustrated in FIG. 96, in the tunnel junction layer 106, a single mesa M is disposed between two dummy mesas DM adjacent to each other to make the light-emitting position of the active layer 104 serve as a single light-emitting position.

Cross-Sectional Configuration Example 6

Figure 97:
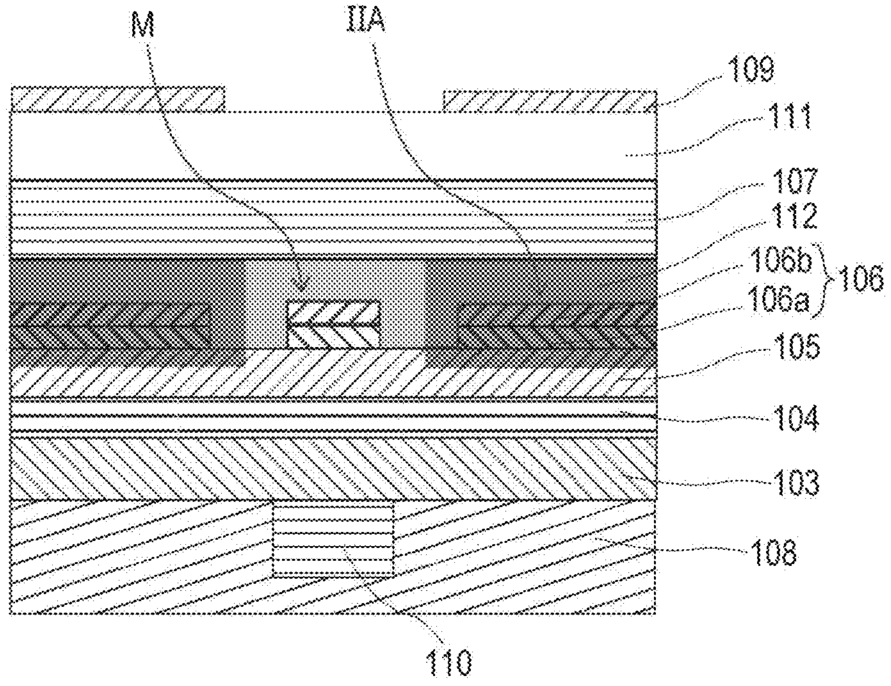
FIG. 97 is a diagram illustrating a cross-sectional configuration example 6 of the surface emitting laser.

In the cross-sectional configuration example 6, as illustrated in FIG. 97, in the tunnel junction layer 106, a single mesa M is disposed between ion implantation regions IIA as two adjacent regions to make the light-emitting position of the active layer 104 serve as a single light-emitting position.

12. Modification of Present Technology

The present technology is not limited to each of the embodiments and modifications described above, and various modifications can be made.

For example, in the above-described second and third embodiments, the dummy mesa DM and the adjacent region AA are generated by ion implantation into the tunnel junction layer 106 after the growth of the buried layer 112, but the dummy mesa DM and the adjacent region AA may be generated by ion implantation into the tunnel junction layer 106 before the growth of the buried layer 112 (for example, before the formation of the mesa and the adjacent region, after the formation of the mesa and the adjacent region, or the like).

For example, in each of the embodiments and modifications described above, a cladding layer including an InP-based compound semiconductor has been described as an example of each cladding layer, but for example, a cladding layer including a GaAs compound semiconductor, an AlGaAs-based compound semiconductor, or the like may be used.

For example, in each of the embodiments and modifications described above, a buried layer including an InP-based compound semiconductor has been described as an example of the buried layer 112, but a buried layer including a material other than the InP-based compound semiconductor may be used.

For example, a quantum dots active layer (QD active layer) may be used for the active layer 104.

Some of the configurations of the surface emitting lasers of the embodiments and modifications described above may be combined within a range in which they do not contradict each other.

In each of the embodiments and modifications described above, the material, conductivity type, thickness, width, length, shape, size, layout, and the like of each component constituting the surface emitting laser can be appropriately changed within a range functioning as the surface emitting laser.

13. Application Example to Electronic Device

The technology according to the present disclosure (the present technology) can be applied to various products (electronic devices). For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, or a robot.

The surface emitting laser according to the present technology can also be applied as, for example, a light source of a device that forms or displays an image by laser light (for example, a laser printer, a laser copier, a projector, a head-mounted display, a head-up display, or the like).

14. <Example in which Surface Emitting Laser is Applied to Distance Measuring Device>

Hereinafter, application examples of the surface emitting laser according to each of the embodiments and modifications described above will be described.

Figure 98:
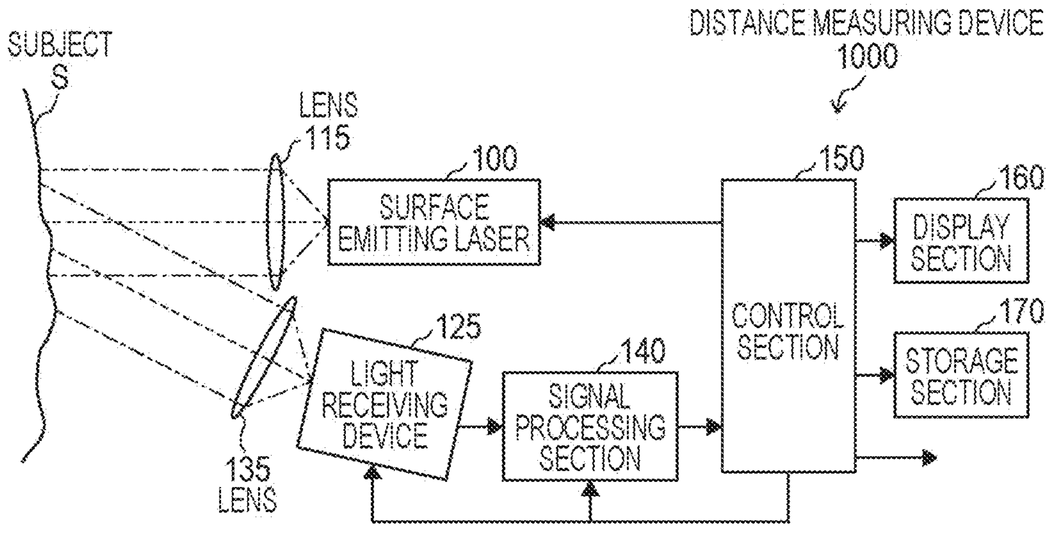
FIG. 98 is a diagram illustrating an application example of the surface emitting laser according to the present technology to a distance measuring device.

FIG. 98 illustrates an example of a schematic configuration of a distance measuring device 1000 including the surface emitting laser 100 as an example of an electronic device according to the present technology. The distance measuring device 1000 measures a distance to a subject S by a time of flight (TOF) method. The distance measuring device 1000 includes the surface emitting laser 100 as a light source. The distance measuring device 1000 includes, for example, the surface emitting laser 100, a light receiving device 125, lenses 115 and 135, a signal processing section 140, a control section 150, a display section 160, and a storage section 170.

The light receiving device 125 detects light reflected by the subject S. The lens 115 is a lens for collimating the light emitted from the surface emitting laser 100, and is a collimating lens. The lens 135 is a lens for condensing light reflected by the subject S and guiding the light to the light receiving device 125, and is a condenser lens.

The signal processing section 140 is a circuit for generating a signal corresponding to a difference between a signal input from the light receiving device 125 and a reference signal input from the control section 150. The control section 150 includes, for example, a time-to-digital converter (TDC). The reference signal may be a signal input from the control section 150, or may be an output signal of a detection unit that directly detects the output of the surface emitting laser 100. The control section 150 is, for example, a processor that controls the surface emitting laser 100, the light receiving device 125, the signal processing section 140, the display section 160, and the storage section 170. The control section 150 is a circuit that measures a distance to the subject S on the basis of a signal generated by the signal processing section 140. The control section 150 generates a video signal for displaying information about the distance to the subject S, and outputs the video signal to the display section 160. The display section 160 displays information about the distance to the subject S, on the basis of the video signal input from the control section 150. The control section 150 stores the information about the distance to the subject S in the storage section 170.

In the present application example, instead of the surface emitting laser 100, any one of the surface emitting lasers 100-1, 200, 300, 400, 500, 600, 700, and 800 described above can be applied to the distance measuring device 1000.

15. <Example in which Distance Measuring Device is Mounted on Mobile Body>

Figure 99:
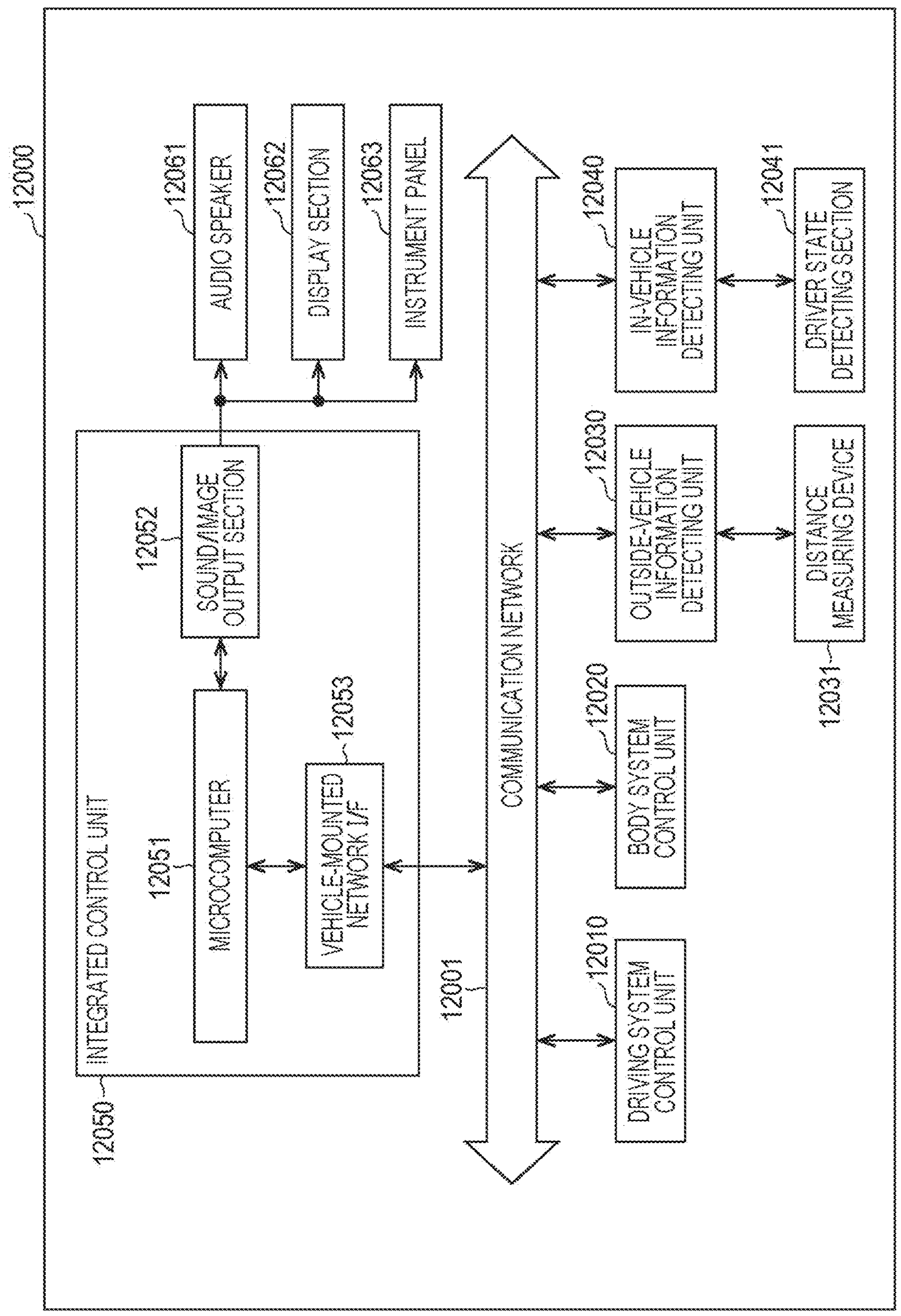
FIG. 99 is a block diagram illustrating an example of schematic configuration of a vehicle control system.

FIG. 99 is a block diagram illustrating a schematic configuration example of a vehicle control system as an example of a mobile body control system to which the technology according to the present disclosure can be applied.

A vehicle control system 12000 includes a plurality of electronic control units connected to each other via a communication network 12001. In the example illustrated in FIG. 99, the vehicle control system 12000 includes a driving system control unit 12010, a body system control unit 12020, an outside-vehicle information detecting unit 12030, an in-vehicle information detecting unit 12040, and an integrated unit 12050. Furthermore, a microcomputer 12051, a sound/image output section 12052, and a vehicle-mounted network interface (I/F) 12053 are illustrated as a functional configuration of the integrated unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, a distance measuring device 12031 is connected to the outside-vehicle information detecting unit 12030. The distance measuring device 12031 includes the above-described distance measuring device 1000. The outside-vehicle information detecting unit 12030 causes the distance measuring device 12031 to measure a distance to an object (the subject S) outside the vehicle, and acquires distance data obtained by the measurement. The outside-vehicle information detecting unit 12030 may perform object detection processing of a person, a vehicle, an obstacle, a sign, or the like on the basis of the acquired distance data.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041 includes, for example, a camera that captures an image of the driver, and the in-vehicle information detecting unit 12040 may calculate the degree of fatigue or the degree of concentration of the driver or may determine whether or not the driver is dozing off on the basis of the detection information input from the driver state detecting section 12041.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle, which is obtained by the outside-vehicle information detecting unit 12030. For example, the microcomputer 12051 can perform cooperative control intended to prevent a glare by controlling the headlamp, such as changing from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 99, an audio speaker 12061, a display section 12062, and an instrument panel 12063 are illustrated as the output device. The display section 12062 may, for example, include at least one of an on-board display or a head-up display.

Figure 100:
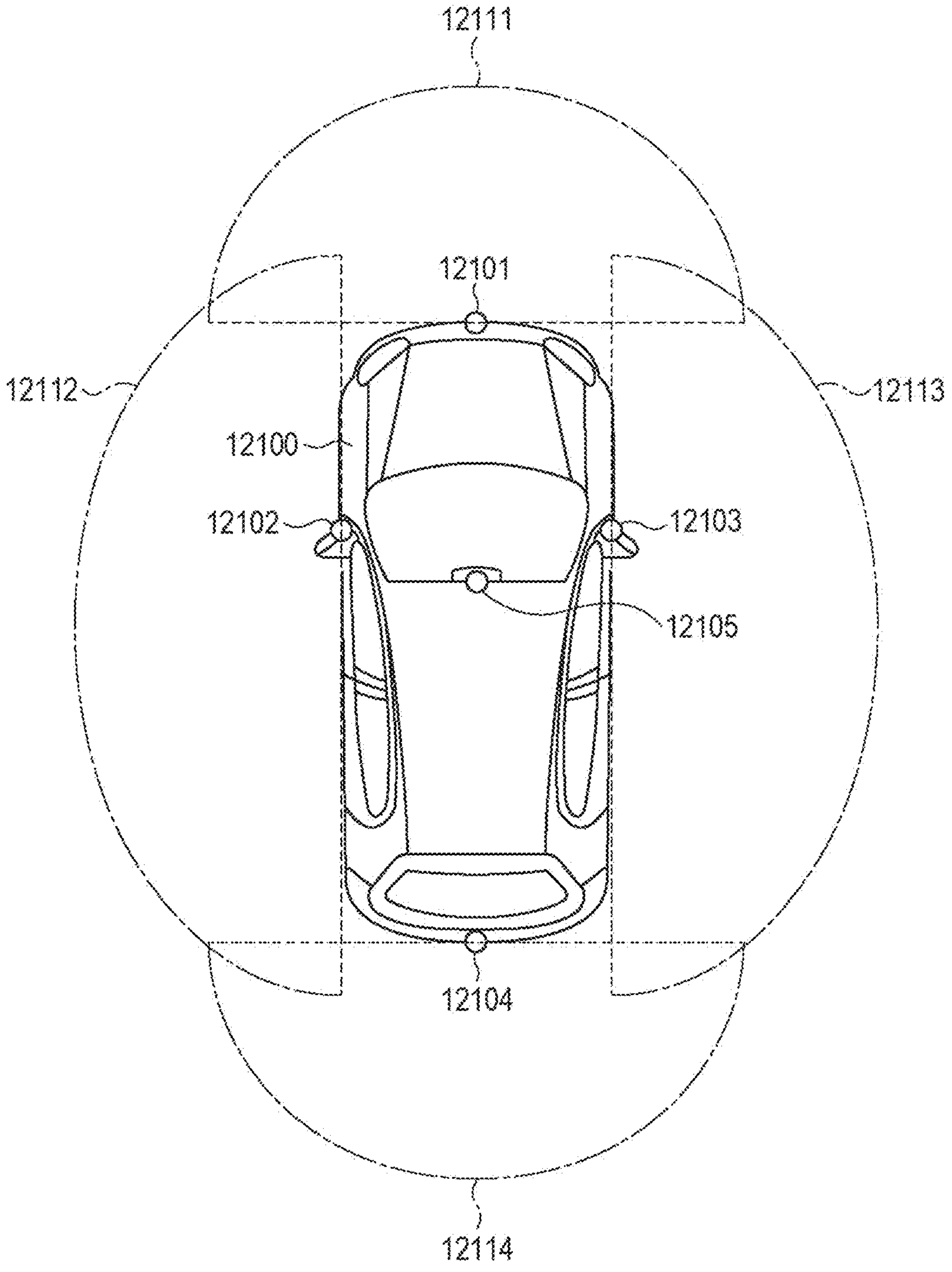
FIG. 100 is an explanatory view illustrating an example of an installation position of the distance measuring device.

FIG. 100 is a view illustrating an example of an installation position of the distance measuring device 12031.

In FIG. 100, a vehicle 12100 includes distance measuring devices 12101, 12102, 12103, 12104, and 12105 as the distance measuring device 12031.

The distance measuring devices 12101, 12102, 12103, 12104, and 12105 are provided at positions such as, for example, a front nose, side mirrors, a rear bumper, a back door, and an upper part of a windshield in a vehicle cabin, of the vehicle 12100. The distance measuring device 12101 provided on the front nose and the distance measuring device 12105 provided on the upper part of the windshield in the vehicle cabin mainly acquire data of the front of the vehicle 12100. The distance measuring devices 12102 and 12103 provided in the side mirrors mainly acquire data of sides of the vehicle 12100. The distance measuring device 12104 provided in the rear bumper or the back door mainly acquires data of the rear of the vehicle 12100. The data of the front side acquired by the distance measuring devices 12101 and 12105 is mainly used for detecting a preceding vehicle, a pedestrian, an obstacle, a traffic light, a traffic sign, or the like.

Note that FIG. 100 illustrates an example of detection ranges of the distance measuring devices 12101 to 12104. A detection range 12111 indicates a detection range of the distance measuring device 12101 provided on the front nose, detection ranges 12112 and 12113 indicate detection ranges of the distance measuring devices 12102 and 12103 provided in the side mirrors, respectively, and a detection range 12114 indicates a detection range of the distance measuring device 12104 provided in the rear bumper or the back door.

For example, the microcomputer 12051 can determine a distance to each three-dimensional object within the detection ranges 12111 to 12114 and a temporal change in the distance (a relative speed with respect to the vehicle 12100) on the basis of the distance data obtained from the distance measuring devices 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set an inter-vehicle distance to be secured from a preceding vehicle in advance, and perform automatic brake control (including follow-up stop control), automatic acceleration control (including follow-up start control), and the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance data obtained from the distance measuring devices 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle, and when the collision risk is equal to or higher than a set value and there is a possibility of collision, the microcomputer 12051 can perform driving assistance for collision avoidance by outputting an alarm to the driver via the audio speaker 12061 or the display section 12062 or performing forced deceleration or avoidance steering via the driving system control unit 12010.

An example of the mobile body control system to which the technology according to the present disclosure can be applied has been described above. The technology according to the present disclosure can be applied to the distance measuring device 12031 among the configurations described above.

Furthermore, the present technology can also have the following configurations.

(1) A surface emitting laser including:

a first structure including a first multilayer film reflector;

a second structure including a second multilayer film reflector; and a resonator disposed between the first and second structures, in which the resonator includes:

an active layer;

a tunnel junction layer disposed between the first structure and the active layer and having a mesa and an adjacent region adjacent to the mesa; and a buried layer that buries a periphery of the mesa and a periphery of the adjacent region, and an interval between the mesa and the adjacent region is less than or equal to 30 μm.

(2) The surface emitting laser according to (1), in which a thickness of the buried layer is less than or equal to 2 μm.

(3) The surface emitting laser according to (1) or (2), in which the interval between the mesa and the adjacent region is less than or equal to 25 μm, and a thickness of the buried layer is less than or equal to 1.5 μm.

(4) The surface emitting laser according to any one of (1) to (3), in which the interval between the mesa and the adjacent region is less than or equal to 20 μm, and a thickness of the buried layer is less than or equal to 1.2 μm.

(5) The surface emitting laser according to any one of (1) to (4), in which the first structure and the buried layer are bonded together.

(6) The surface emitting laser according to (1) to (5), in which the adjacent region is another mesa.

(7) The surface emitting laser according to (6), in which the another mesa is made higher in resistance.

(8) The surface emitting laser according to any one of (1) to (7), in which the adjacent region is made higher in resistance.

(9) The surface emitting laser according to (8), in which a loop groove having a width of 30 μm or less is provided between the mesa and the adjacent region.

(10) The surface emitting laser according to any one of (1) to (9), in which the buried layer includes an InP-based compound semiconductor.

(11) The surface emitting laser according to any one of (1) to (10), further including an electrode disposed on an end surface side of the active layer and in contact with a surface of the buried layer adjacent to the active layer.

(12) The surface emitting laser according to any one of (1) to (10), in which the first structure includes a semi-insulating substrate disposed on a side of the first multilayer film reflector remote from the resonator, the surface emitting laser further including an electrode provided on a surface of the semi-insulating substrate remote from the first multilayer film reflector, the electrode and the buried layer being connected via a conductive via provided in the semi-insulating substrate.

(13) The surface emitting laser according to any one of (1) to (12), in which the first structure includes a conductive substrate disposed on a side of the first multilayer film reflector remote from the resonator, the surface emitting laser further including an electrode layer provided in a region of the conductive substrate other than a region corresponding to the mesa.

(14) The surface emitting laser according to any one of (1) to (13), in which the second structure includes no substrate, and the second multilayer film reflector is a dielectric multilayer film reflector or a semiconductor multilayer film reflector.

(15) The surface emitting laser according to any one of (1) to (13), in which the second structure includes a substrate, and the second multilayer film reflector is a semiconductor multilayer film reflector.

(16) An electronic device including the surface emitting laser according to any one of (1) to (15).

(17) A method for manufacturing a surface emitting laser, including:

a process of generating a multilayer body by layering an active layer and a tunnel junction layer in this order on a first substrate;

a process of forming a mesa and an adjacent region adjacent to the mesa such that an interval between the mesa and the adjacent region is less than or equal to 30 μm by etching the tunnel junction layer of the multilayer body; and a process of generating another multilayer body replacing the multilayer body by layering, on the tunnel junction layer, a buried layer that buries a periphery of the mesa and a periphery of the adjacent region.

(18) The method for manufacturing a surface emitting laser according to (17), further including a process of bonding the buried layer of the another multilayer body and a multilayer body including a first multilayer film reflector together.

(19) The method for manufacturing a surface emitting laser according to (17) or (18), in which the multilayer body including the first multilayer film reflector further includes a second substrate, the method for manufacturing a surface emitting laser further including:

a process of removing the first substrate from the another multilayer body; and a process of forming a second multilayer film reflector on a surface of the another multilayer body from which the first substrate has been removed.

(20) The method for manufacturing a surface emitting laser according to any one of (17) to (19), in which the multilayer body including the first multilayer film reflector further includes a second substrate, the method for manufacturing a surface emitting laser further including:

a process of removing the first substrate from the another multilayer body; and a process of bonding and forming a multilayer body including a second multilayer film reflector to a surface of the another multilayer body from which the first substrate has been removed.

(21) The method for manufacturing a surface emitting laser according to any one of (17) to (19), further including a process of making the adjacent region higher in resistance by implanting ions into the another multilayer body from the buried layer.

REFERENCE SIGNS LIST

100, 100-1, 200, 300, 400, 500, 600, 700, 800 Surface emitting laser
101 Growth substrate (first substrate)
104 Active layer
106 Tunnel junction layer
111 Substrate (second substrate)
107 First multilayer film reflector
108 Second multilayer film reflector
109 Electrode (anode electrode)
112 Buried layer
ST1 First structure
ST2 Second structure
R Resonator
SP, SP1, SP2, SP3 Interval
FT Film thickness (thickness of buried layer)
M Mesa
AA Adjacent region

The invention claimed is:

1. A surface emitting laser comprising:

a first structure including a first multilayer film reflector;

a second structure including a second multilayer film reflector; and a resonator disposed between the first and second structures, wherein the resonator includes:

an active layer;

a tunnel junction layer disposed between the first structure and the active layer and having a mesa and an adjacent region adjacent to the mesa; and a buried layer that buries a periphery of the mesa and a periphery of the adjacent region, an interval between the mesa and the adjacent region is less than or equal to 30 μm, and the adjacent region is another mesa.

2. The surface emitting laser according to claim 1, wherein a thickness of the buried layer is less than or equal to 2 μm.

3. The surface emitting laser according to claim 1, wherein the interval between the mesa and the adjacent region is less than or equal to 25 μm, and a thickness of the buried layer is less than or equal to 1.5 μm.

4. The surface emitting laser according to claim 1, wherein the interval between the mesa and the adjacent region is less than or equal to 20 μm, and a thickness of the buried layer is less than or equal to 1.2 μm.

5. The surface emitting laser according to claim 1, wherein the first structure and the buried layer are bonded together.

6. The surface emitting laser according to claim 1, wherein the another mesa is made higher in resistance.

7. A surface emitting laser comprising:

a first structure including a first multilayer film reflector;

a second structure including a second multilayer film reflector; and a resonator disposed between the first and second structures, wherein the resonator includes:

an active layer;

a tunnel junction layer disposed between the first structure and the active layer and having a mesa and an adjacent region adjacent to the mesa; and a buried layer that buries a periphery of the mesa and a periphery of the adjacent region, an interval between the mesa and the adjacent region is less than or equal to 30 μm, and the adjacent region is made higher in resistance.

8. The surface emitting laser according to claim 7, wherein a loop groove having a width of 30 μm or less is provided between the mesa and the adjacent region.

9. The surface emitting laser according to claim 1, wherein the buried layer includes an InP-based compound semiconductor.

10. The surface emitting laser according to claim 1, further comprising an electrode disposed on an end surface side of the active layer and in contact with a surface of the buried layer adjacent to the active layer.

11. The surface emitting laser according to claim 1, wherein the first structure includes a semi-insulating substrate disposed on a side of the first multilayer film reflector remote from the resonator, the surface emitting laser further comprising an electrode provided on a surface of the semi-insulating substrate remote from the first multilayer film reflector, the electrode and the buried layer being connected via a conductive via provided in the semi-insulating substrate.

12. The surface emitting laser according to claim 1, wherein the first structure includes a conductive substrate disposed on a side of the first multilayer film reflector remote from the resonator, the surface emitting laser further comprising an electrode layer provided in a region of the conductive substrate other than a region corresponding to the mesa.

13. The surface emitting laser according to claim 1, wherein the second structure includes no substrate, and the second multilayer film reflector is a dielectric multilayer film reflector or a semiconductor multilayer film reflector.

14. The surface emitting laser according to claim 1, wherein the second structure includes a substrate, and the second multilayer film reflector is a semiconductor multilayer film reflector.

15. A method for manufacturing the surface emitting laser according to claim 7, comprising:

a process of generating a multilayer body by layering an active layer and a tunnel junction layer in this order on a first substrate;

a process of forming a mesa and an adjacent region adjacent to the mesa such that an interval between the mesa and the adjacent region is less than or equal to 30 μm by etching the tunnel junction layer of the multilayer body;

a process of generating another multilayer body replacing the multilayer body by layering, on the tunnel junction layer, a buried layer that buries a periphery of the mesa and a periphery of the adjacent region; and a process of making the adjacent region higher in resistance by implanting ions into the another multilayer body from the buried layer.

16. The method for manufacturing a surface emitting laser according to claim 15, further comprising a process of bonding the buried layer of the another multilayer body and a multilayer body including a first multilayer film reflector together.

17. The method for manufacturing a surface emitting laser according to claim 16, wherein the multilayer body including the first multilayer film reflector further includes a second substrate, the method for manufacturing a surface emitting laser further comprising:

a process of removing the first substrate from the another multilayer body; and a process of forming a second multilayer film reflector on a surface of the another multilayer body from which the first substrate has been removed.

18. The method for manufacturing a surface emitting laser according to claim 16, wherein the multilayer body including the first multilayer film reflector further includes a second substrate, the method for manufacturing a surface emitting laser further comprising:

a process of removing the first substrate from the another multilayer body; and a process of bonding a multilayer body including a second multilayer film reflector to a surface of the another multilayer body from which the first substrate has been removed.

19. A surface emitting laser comprising:

a first structure including a first multilayer film reflector;

a second structure including a second multilayer film reflector; and a resonator disposed between the first and second structures, wherein the resonator includes:

an active layer;

a tunnel junction layer disposed between the first structure and the active layer and having a mesa and an adjacent region adjacent to the mesa; and a buried layer that buries a periphery of the mesa and a periphery of the adjacent region, an interval between the mesa and the adjacent region is less than or equal to 30 μm, the second structure includes no substrate, and the second multilayer film reflector is a dielectric multilayer film reflector or a semiconductor multilayer film reflector.

* * * * *